US008836007B2

(12) United States Patent
Matsumoto et al.

(10) Patent No.: US 8,836,007 B2
(45) Date of Patent: Sep. 16, 2014

(54) PROGRAMMABLE LOGIC SWITCH

(71) Applicant: Kabushiki Kaisha Toshiba, Tokyo (JP)

(72) Inventors: Mari Matsumoto, Yokohama (JP); Shinichi Yasuda, Tokyo (JP); Masato Oda, Yokohama (JP); Kosuke Tatsumura, Kawasaki (JP); Koichiro Zaitsu, Kawasaki (JP); Shuou Nomura, Yokohama (JP); Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/772,484

(22) Filed: Feb. 21, 2013

(65) Prior Publication Data

US 2013/0248959 A1   Sep. 26, 2013

(30) Foreign Application Priority Data

Mar. 26, 2012 (JP) ................................. 2012-070358

(51) Int. Cl.
*H01L 29/788* (2006.01)
(52) U.S. Cl.
USPC ........... 257/314; 257/315; 257/324; 438/257; 365/185.17
(58) Field of Classification Search
USPC .................. 257/314–326, E27.084, E27.088; 438/257, 258, 261; 326/39, 40, 44; 365/185.17
See application file for complete search history.

(56) References Cited

U.S. PATENT DOCUMENTS

| 5,812,450 | A | 9/1998 | Sansbury et al. |
| 6,002,610 | A | 12/1999 | Cong et al. |
| 8,432,186 | B1* | 4/2013 | Zaitsu et al. ................... 326/38 |
| 8,618,614 | B2* | 12/2013 | Scheuerlein ................. 257/390 |
| 2007/0252201 | A1* | 11/2007 | Kito et al. ..................... 257/331 |

FOREIGN PATENT DOCUMENTS

| JP | 6-61442 | 3/1994 |
| JP | 9-35490 | 2/1997 |
| JP | 2009-224612 | 10/2009 |
| JP | 2010-508768 | 3/2010 |

OTHER PUBLICATIONS

Hariyama, M. et al., "Novel Switch Block Architecture Using Non-Volatile Functional Pass-gate for Multi-Context FPGAs," Proceedings of the IEEE Computer Society Annual Symposium on VLSI New Frontiers in VLSI Design, 5 sheets, (2005).
First Office Action issued by Japanese Patent Office in corresponding Application No. 2012-070358 mailed May 7, 2014, 9 pages.

* cited by examiner

*Primary Examiner* — Matthew W Such
*Assistant Examiner* — Stephen Bradley
(74) *Attorney, Agent, or Firm* — Finnegan, Henderson, Farabow, Garrett & Dunner, LLP

(57) ABSTRACT

According to one embodiment, a programmable logic switch includes first and second word lines above a first path transistor, a first pillar passing through the first and second word lines and connected to the first path transistor, a second pillar passing through the first and second word lines and connected to the first path transistor, a first memory device between the first pillar and the first word line, a second memory device between the first pillar and the second word line, a third memory device between the second pillar and the first word line, and a fourth memory device between the second pillar and the second word line.

16 Claims, 30 Drawing Sheets

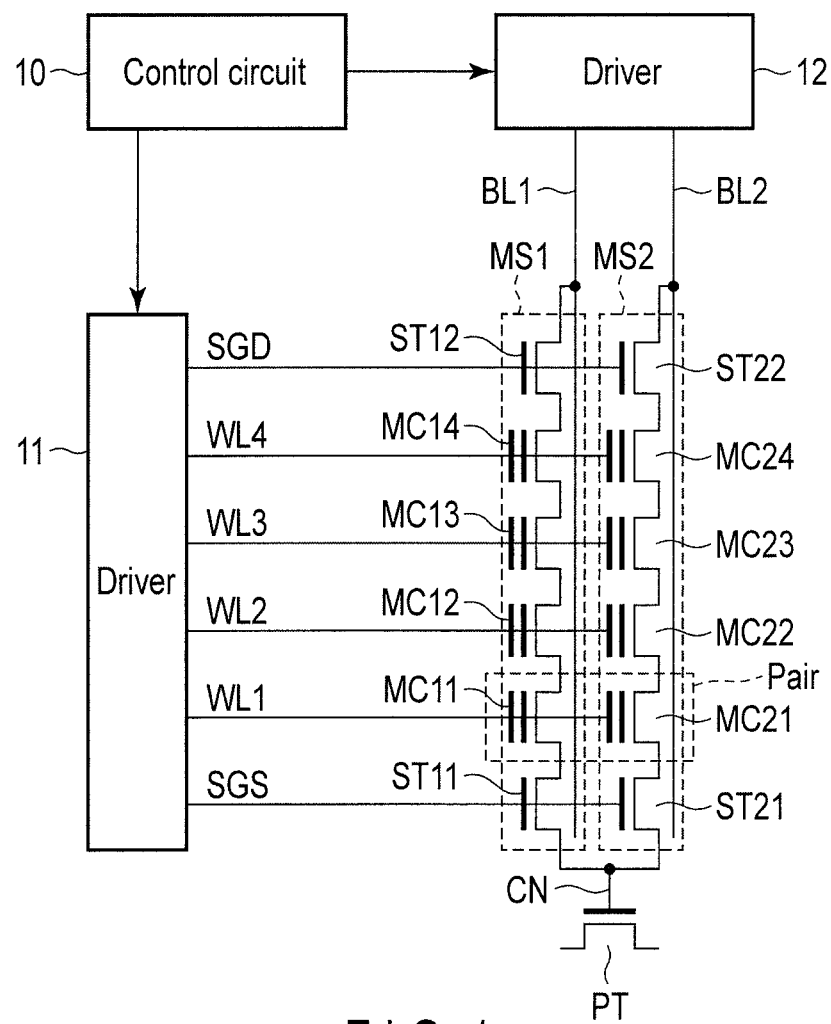
F I G. 1

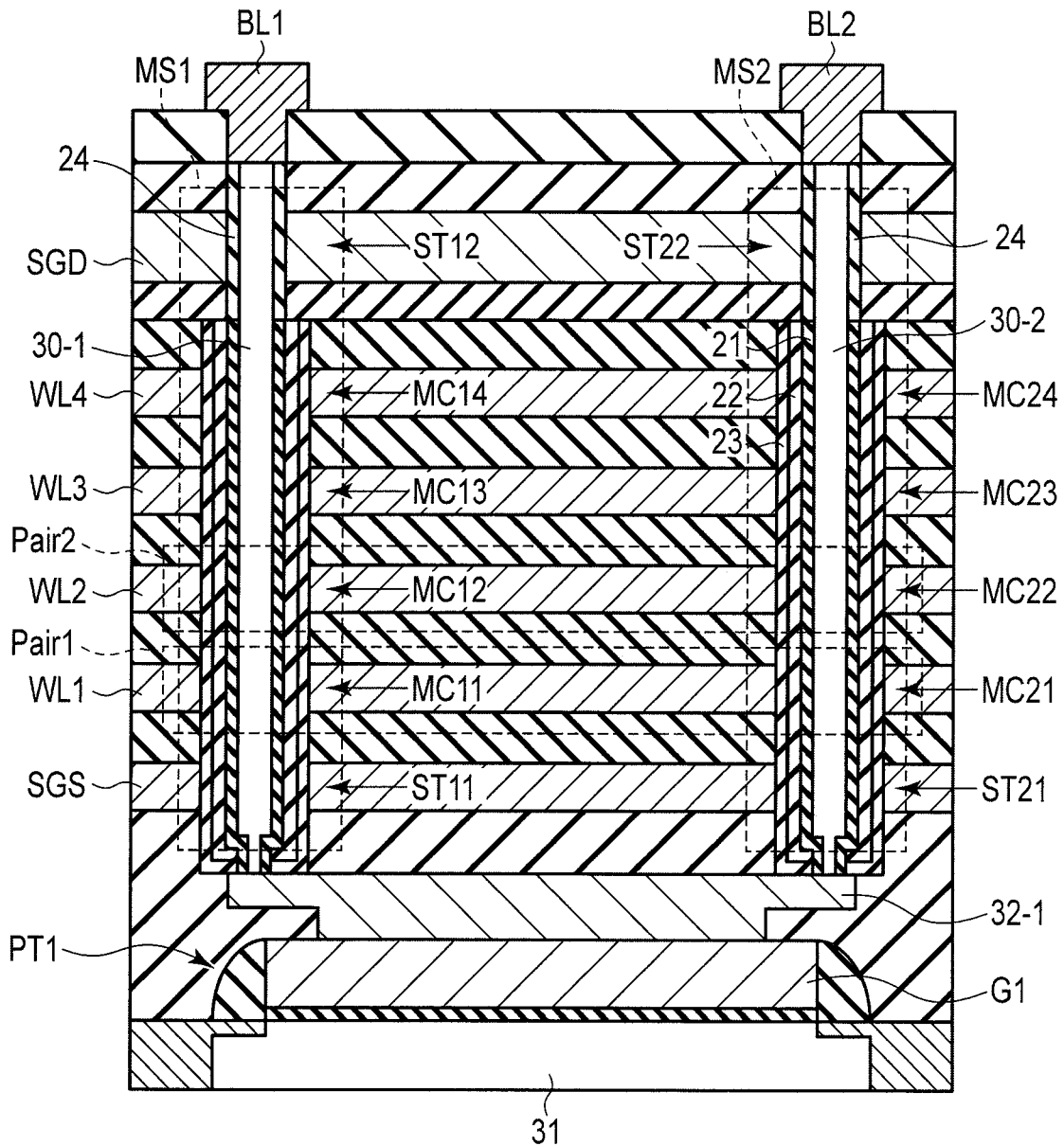
F I G. 3

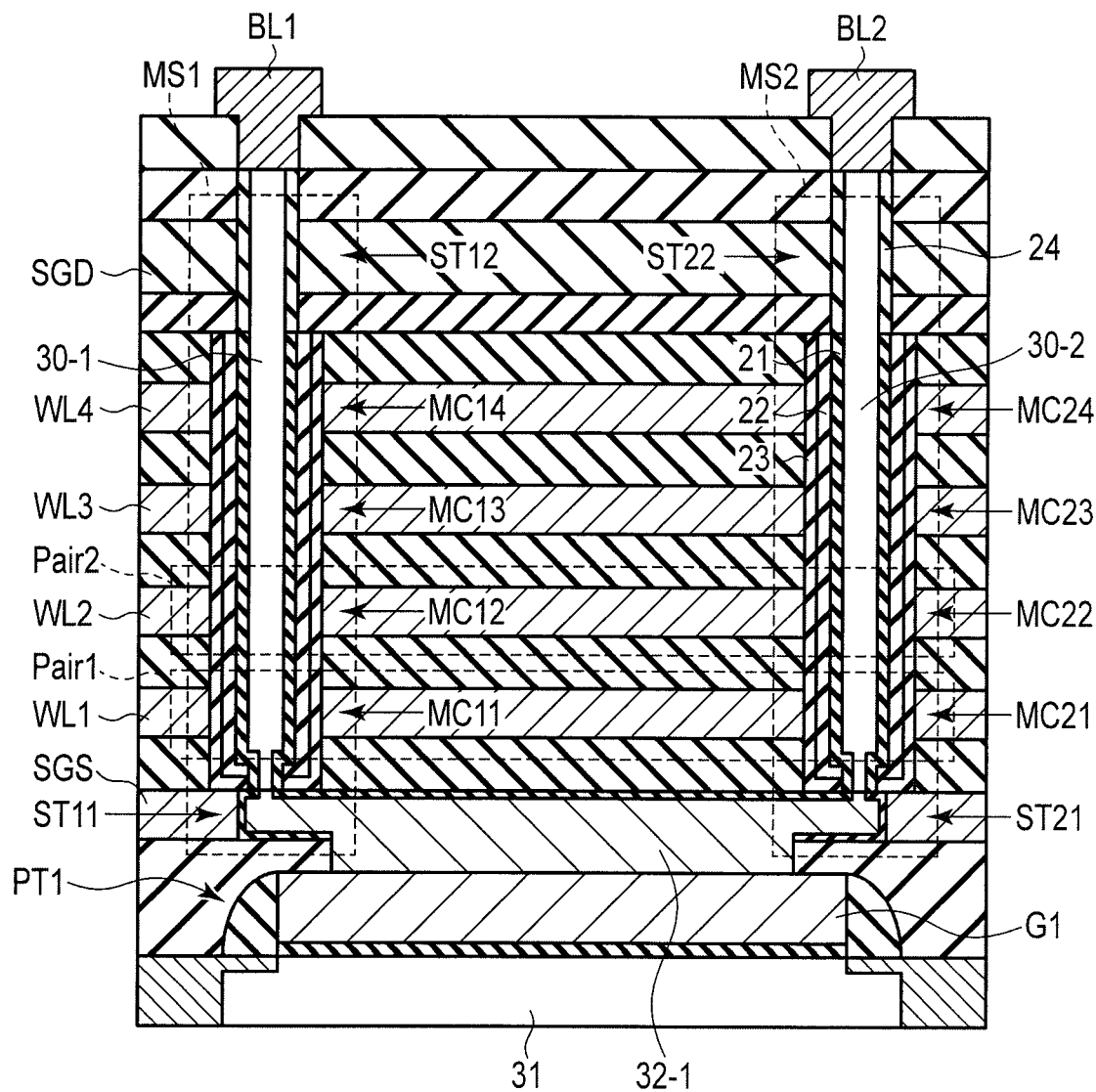
F I G. 9

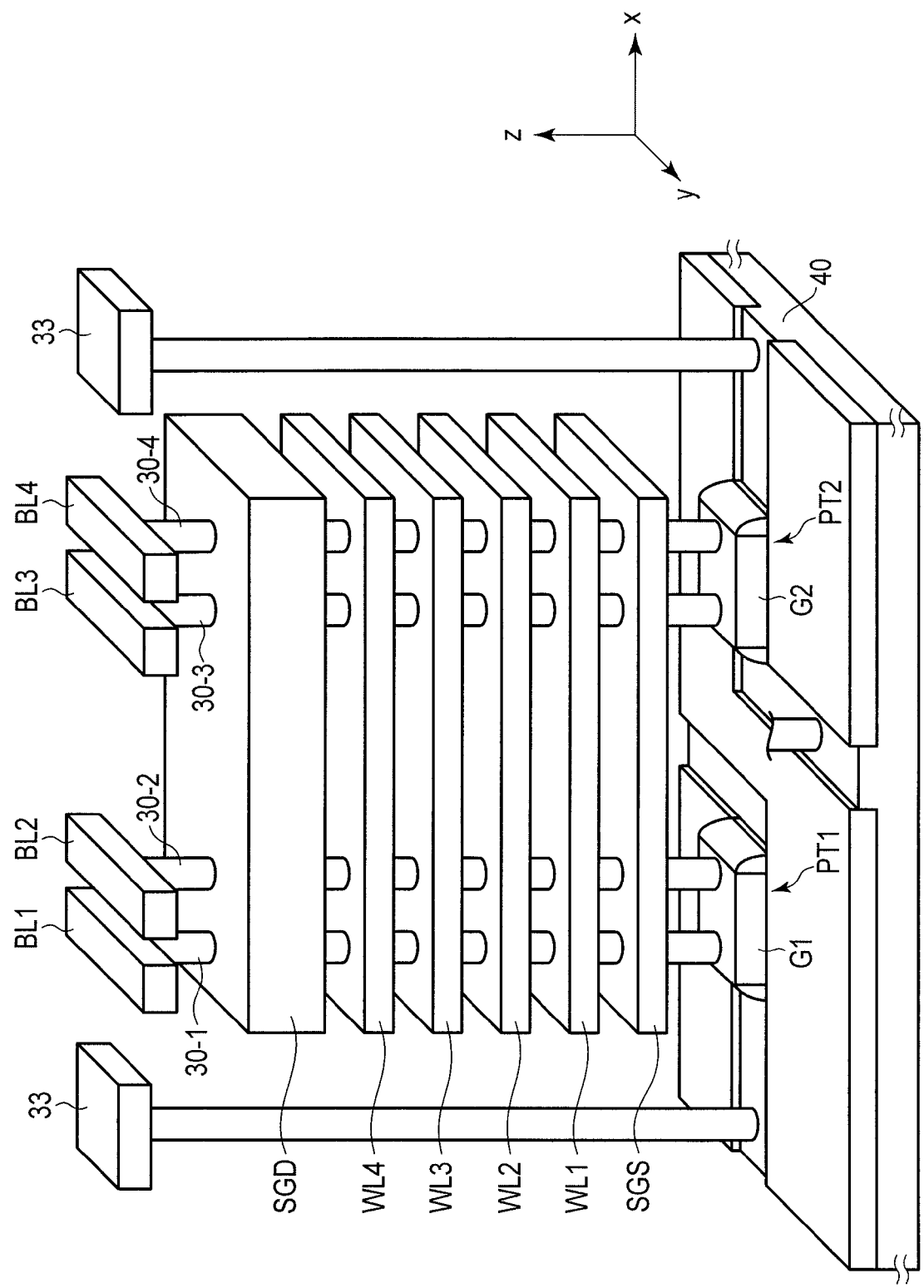
F I G. 16

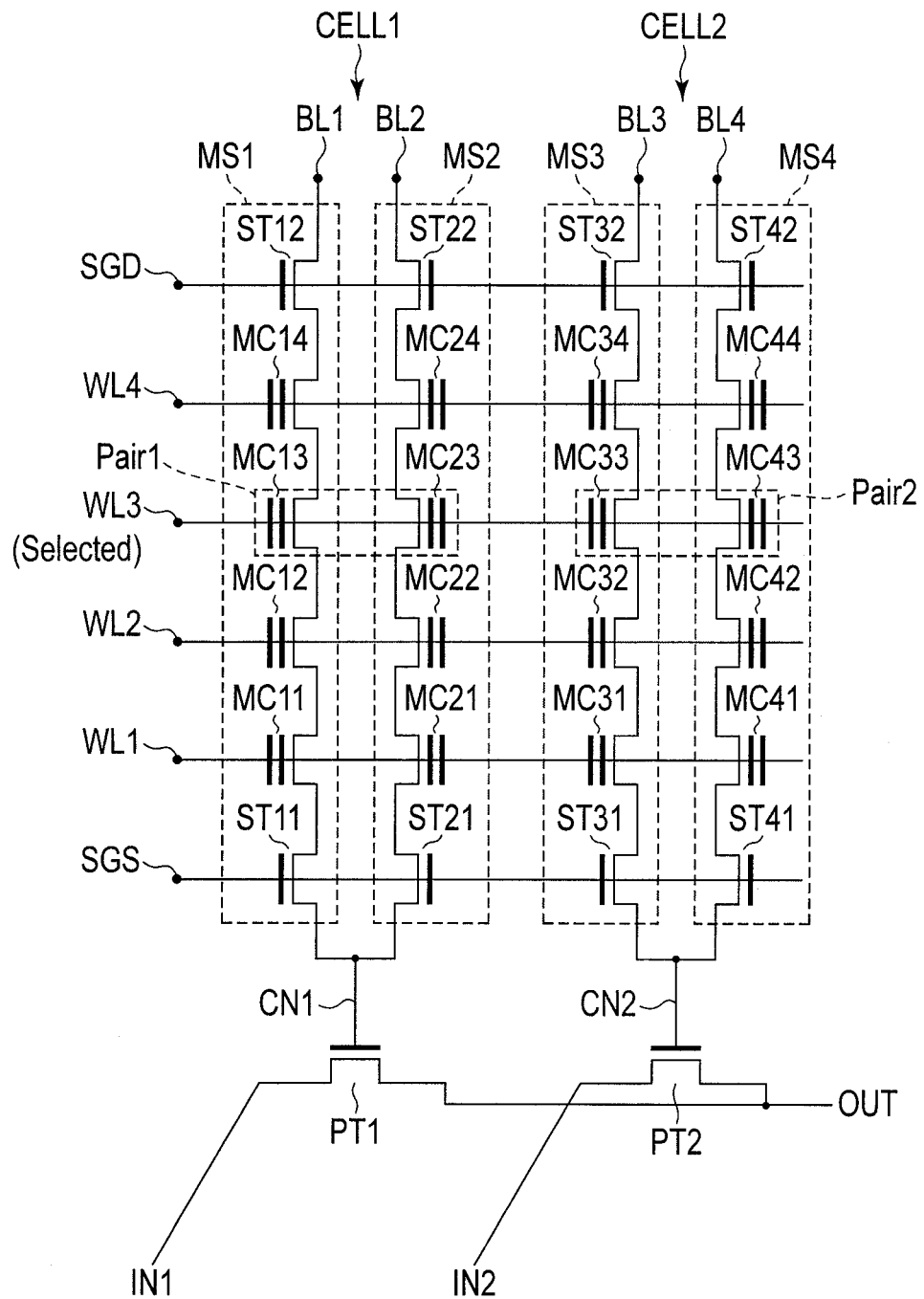
F I G. 18

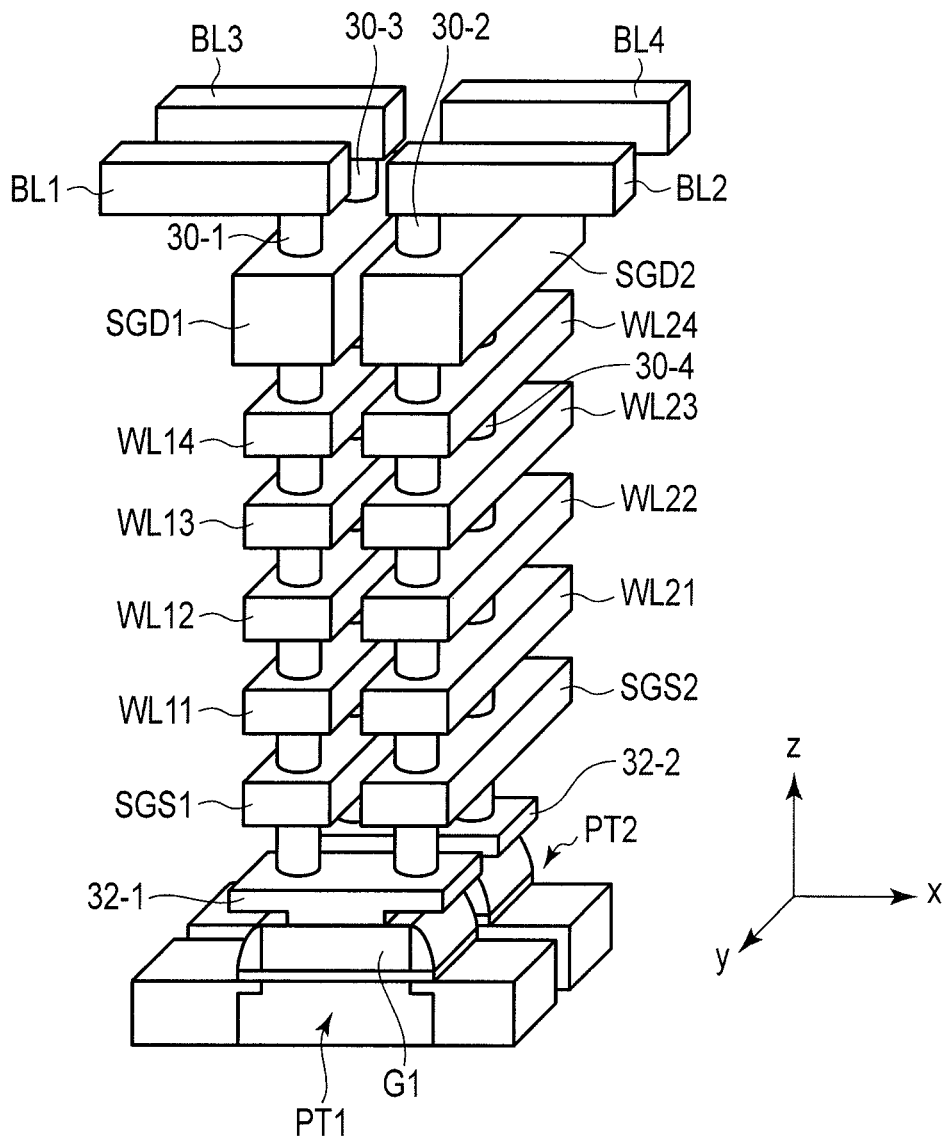
F I G. 19

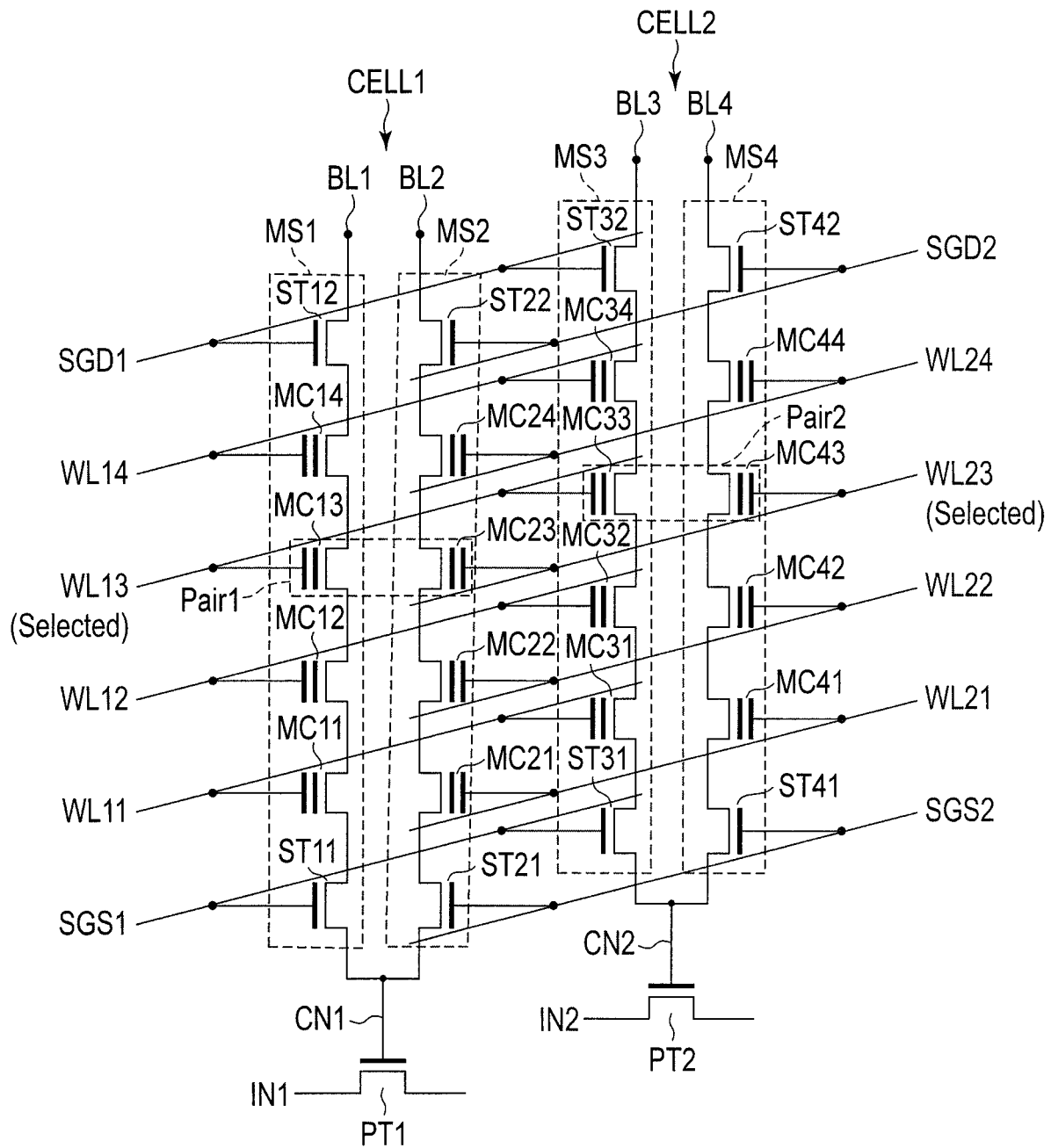
F I G. 20

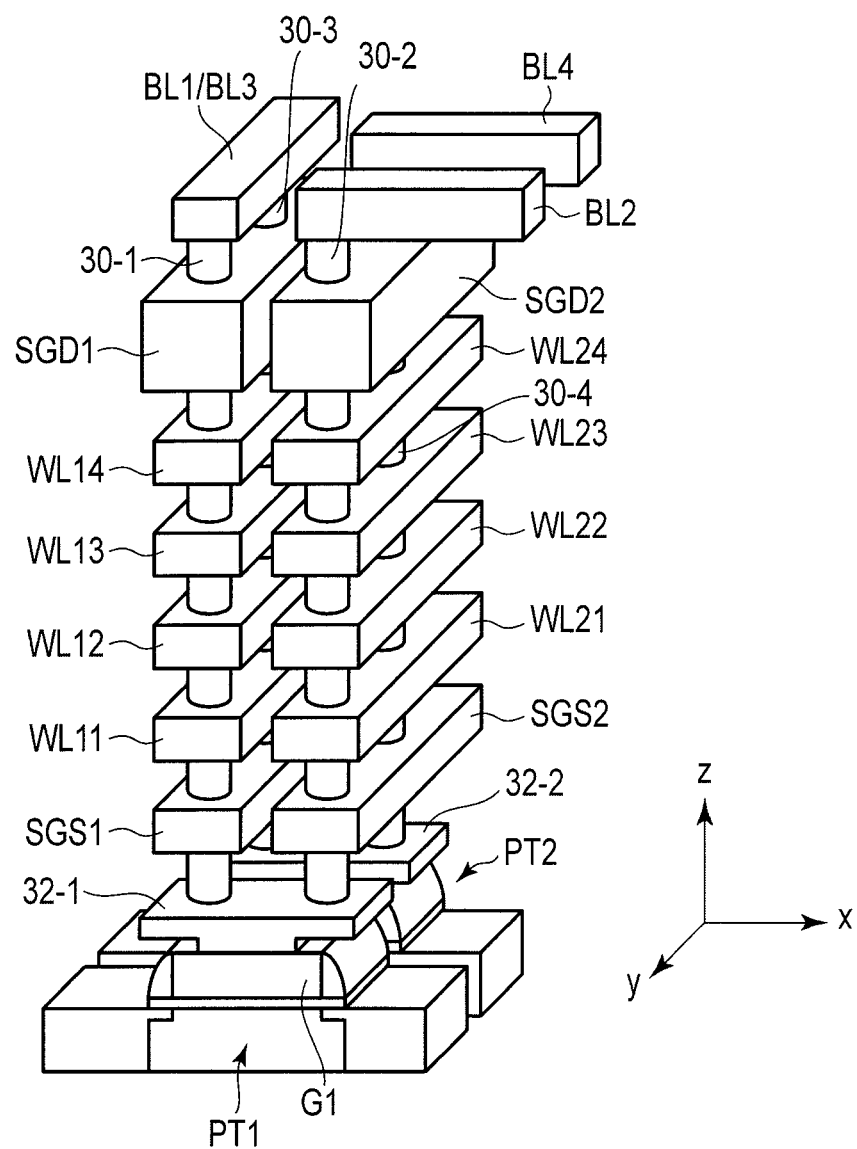
F I G. 21

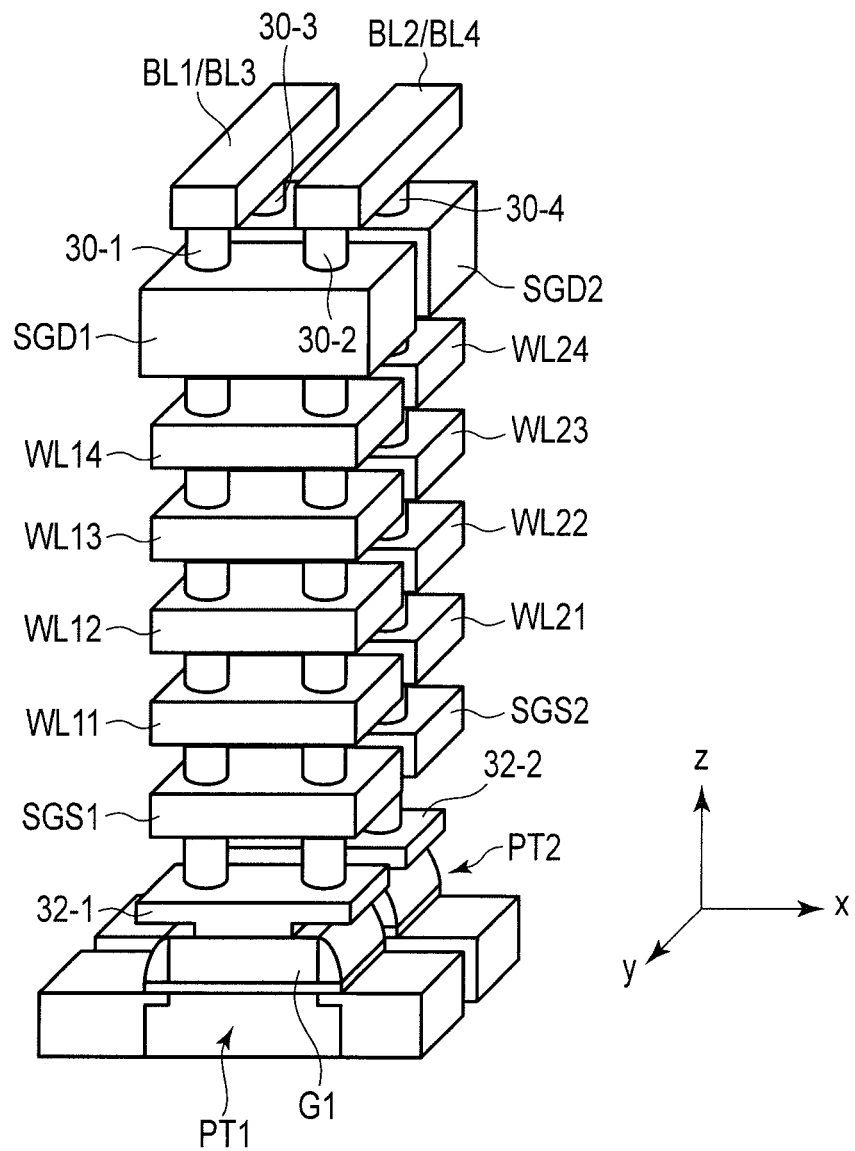
F I G. 23

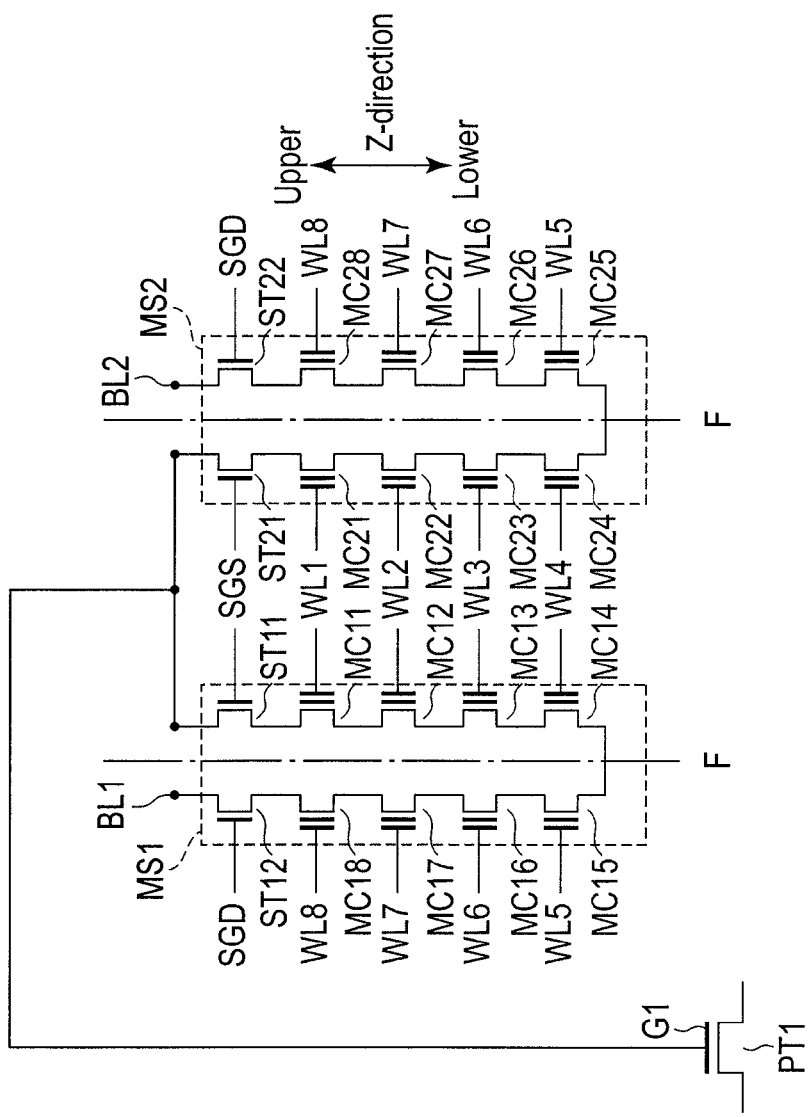
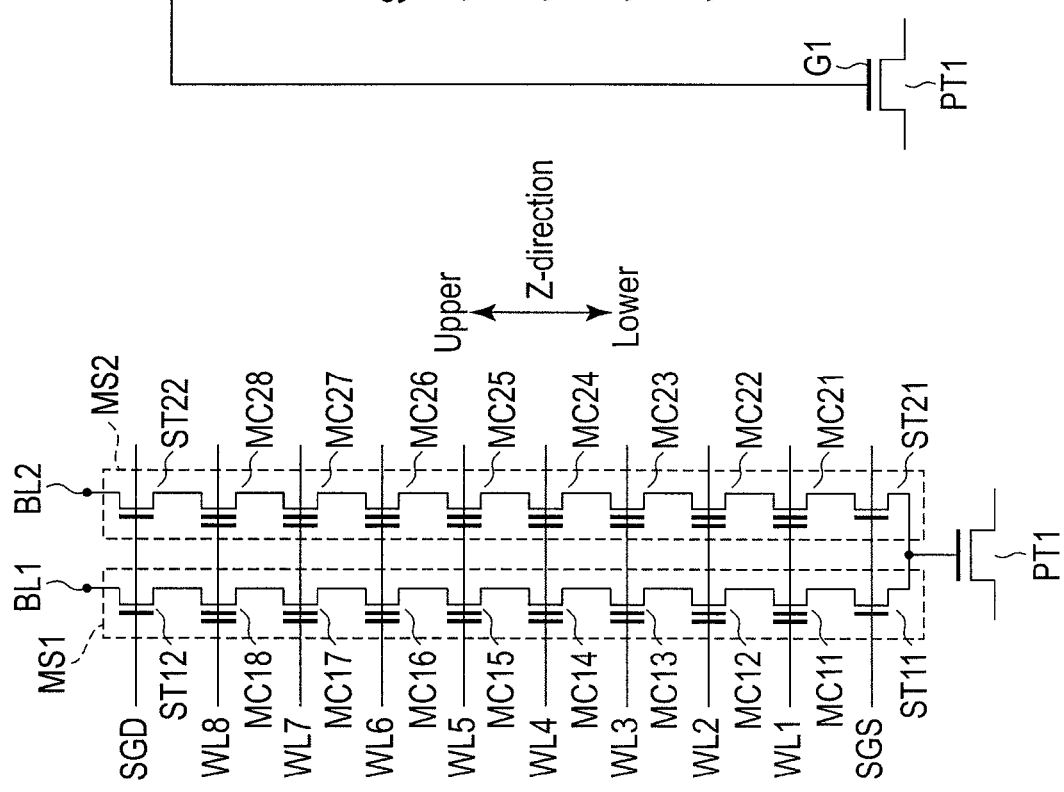
FIG. 26A
FIG. 26B

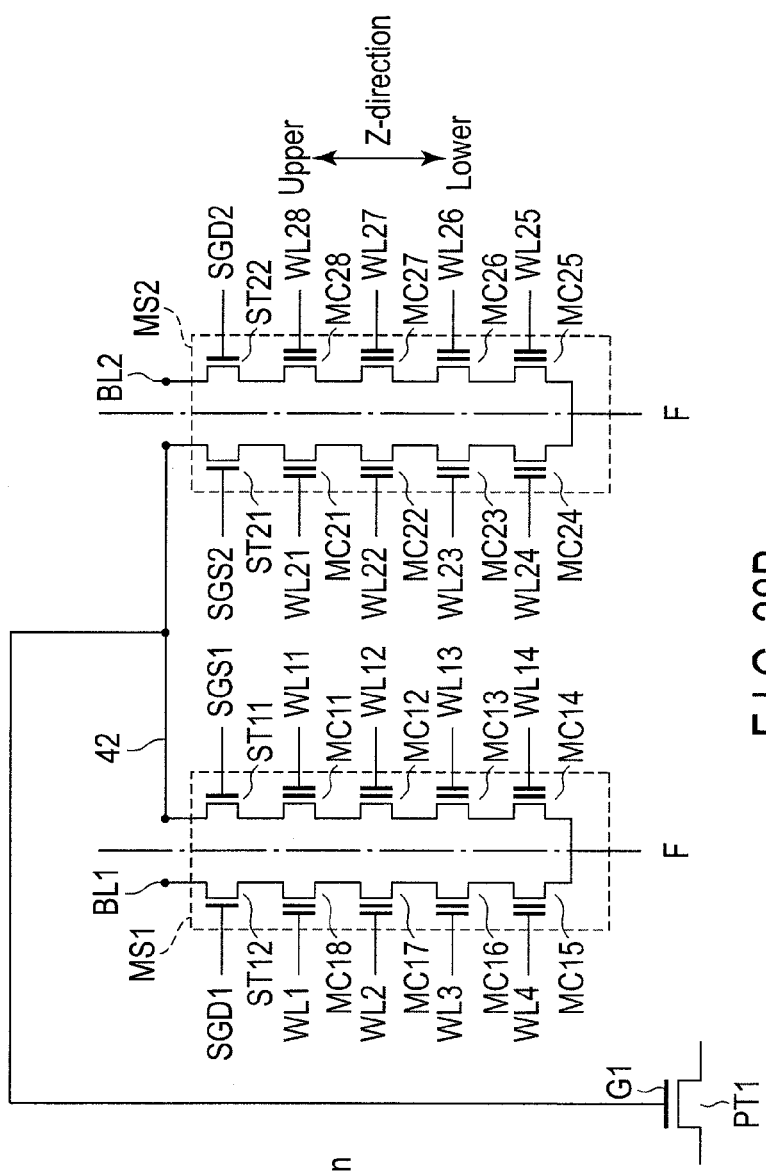
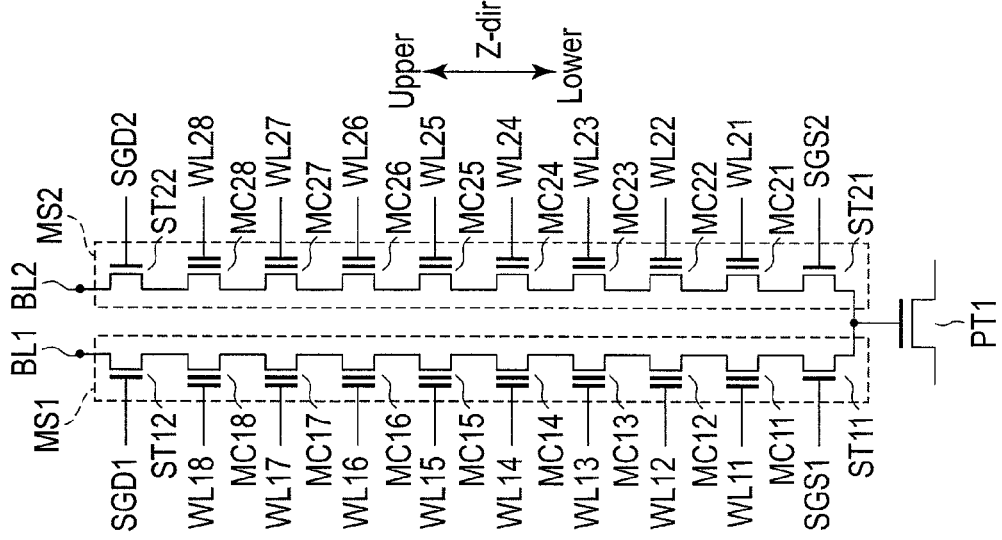
F I G. 28B
F I G. 28A

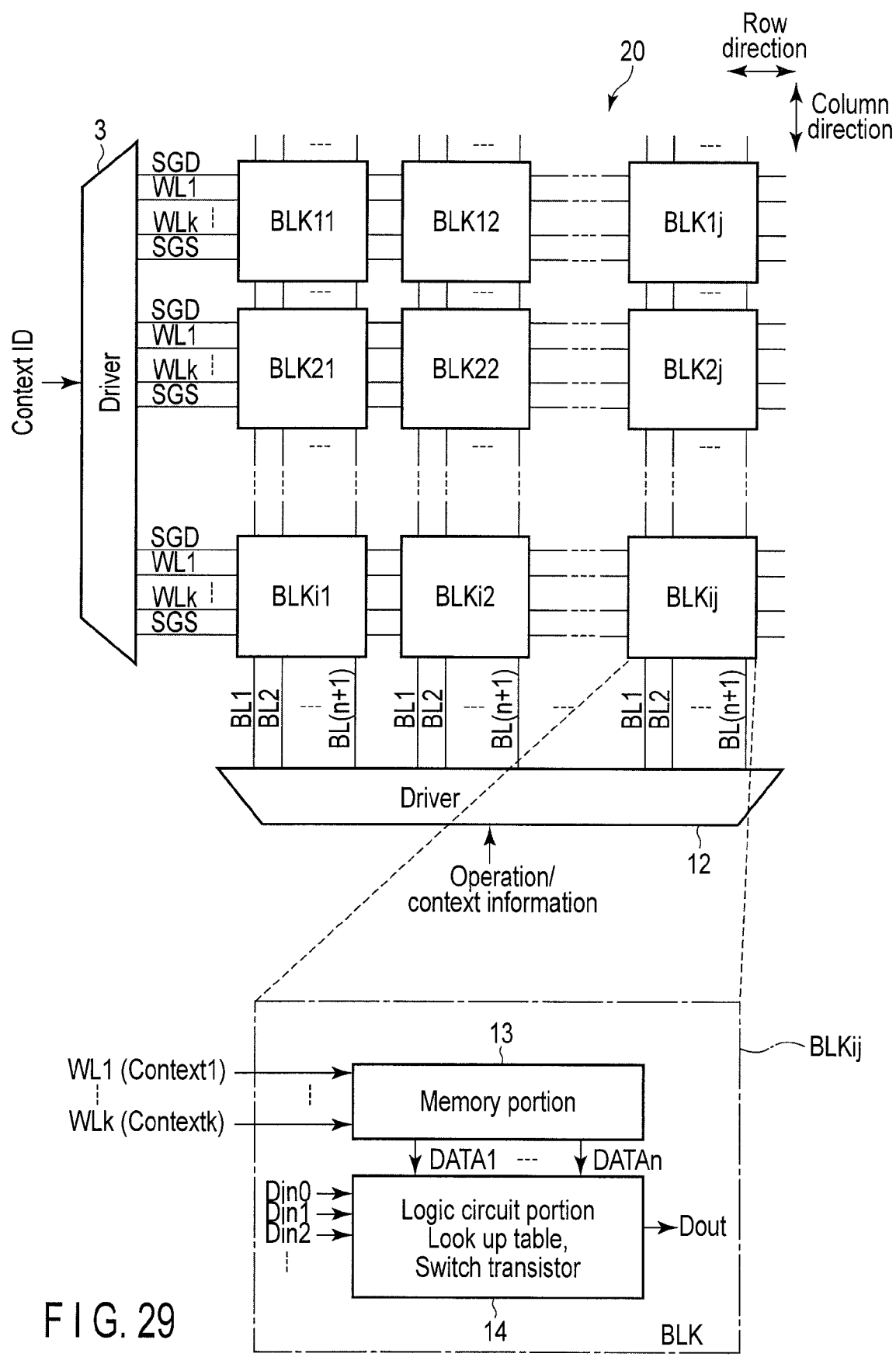
F I G. 29

PROGRAMMABLE LOGIC SWITCH

CROSS-REFERENCE TO RELATED APPLICATIONS

This application is based upon and claims the benefit of priority from Japanese Patent Application No. 2012-070358, filed Mar. 26, 2012, the entire contents of which are incorporated herein by reference.

FIELD

Embodiments described herein relate generally to a programmable logic switch.

BACKGROUND

A programmable logic switch is used in a reconfigurable logic circuit including a field programmable gate array (FPGA) and has a function to switch ON/OFF of a logic switch based on data stored in a configuration memory to realize predetermined logic (circuit configuration).

A volatile memory such as an SRAM (Static Random Access Memory) has generally been used as a configuration memory, but in such a case, data disappears after power-off and it is thereafter necessary to write context into the configuration memory again during power-on.

The context is data to realize one piece of logic.

Moreover, in recent years, with an expansion of system variety, a multi-context reconfigurable logic circuit capable of selectively realizing one of multiple pieces of logic based on multiple pieces of logic is proposed. It is necessary for the multi-context reconfigurable logic circuit to configure a configuration memory from SRAMs to store contexts.

Unfortunately, the SRAM has a large area size and, with an increasing number of contexts, generates a problem of increasing a chip size.

Thus, in recent years, a mode of using a nonvolatile memory device used in a nonvolatile memory such as a flash memory is examined as a configuration memory. The nonvolatile memory device has, when compared with the SRAM, a small area size and is nonvolatile and so is suitable for use in a multi-context reconfigurable logic circuit.

However, the device structure that stores contexts in a nonvolatile memory device to selectively realize one of multiple pieces of logic based on the contexts has not yet been adequately examined.

BRIEF DESCRIPTION OF THE DRAWINGS

FIG. 1 is a circuit diagram showing a basic unit;
FIG. 3 is a sectional view showing the first embodiment of the device structure;
FIG. 9 is a sectional view showing the second embodiment of the device structure;
FIG. 16 is a perspective view showing a modification of the third embodiment;
FIG. 18 is a circuit diagram showing an equivalent circuit of the device structure according to the first to third embodiments;
FIG. 19 is a perspective view showing a fourth embodiment of the device structure;
FIG. 20 is a circuit diagram showing the equivalent circuit of the device structure according to the fourth embodiment;
FIG. 21 is a perspective view showing a fifth embodiment of the device structure;
FIG. 23 is a perspective view showing a sixth embodiment of the device structure;
FIGS. 26A and 26B are circuit diagrams showing the equivalent circuit of the device structure according to the seventh embodiment;
FIGS. 28A and 28B are circuit diagrams showing the equivalent circuit of the device structure according to the eighth embodiment;
FIG. 29 is a circuit diagram showing an FPGA as an application example.

DETAILED DESCRIPTION

Figure 2:
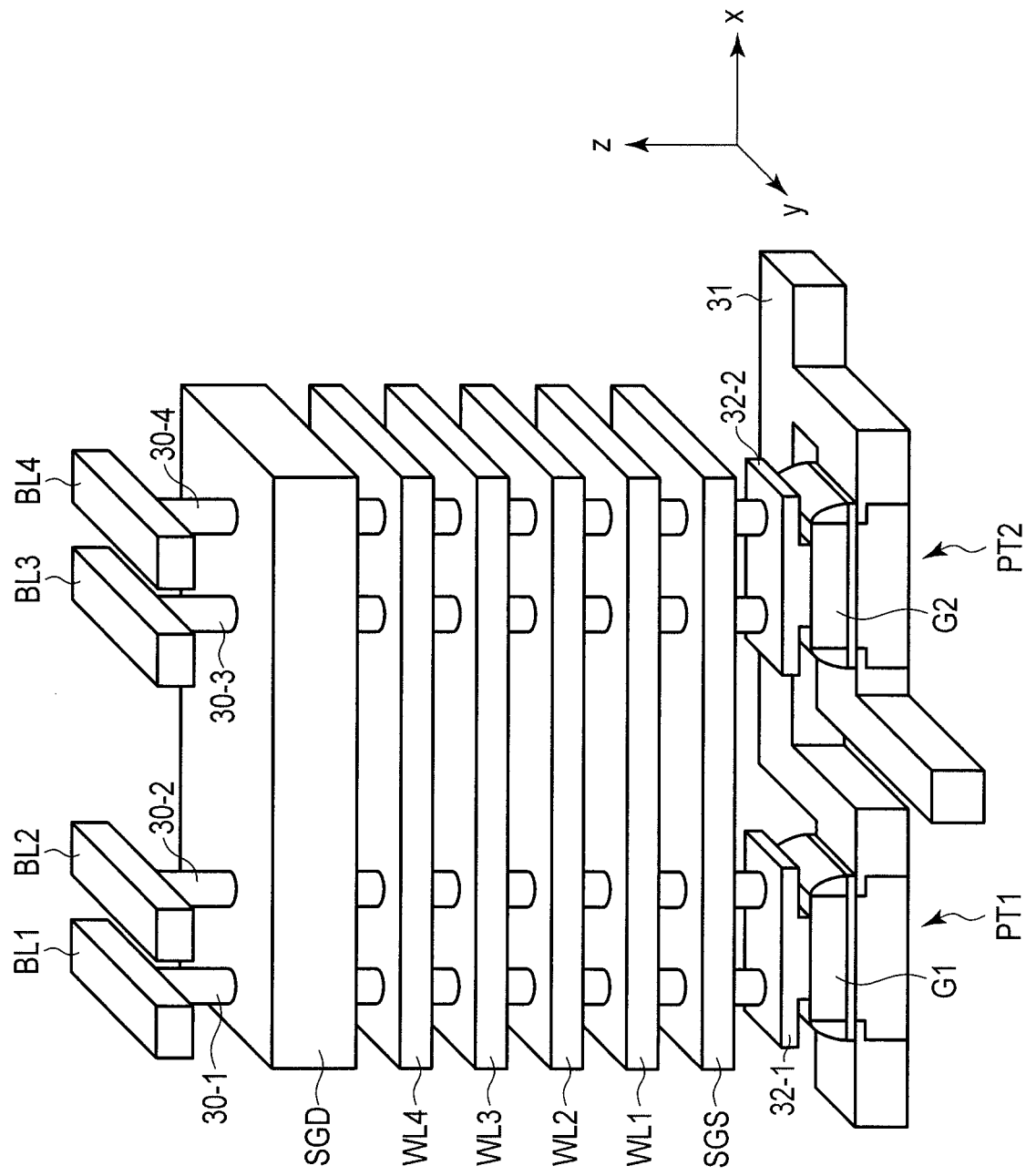
FIG. 2 is a perspective view showing a first embodiment of a device structure.

In general, according to one embodiment, a programmable logic switch comprises: a first path transistor having a first gate electrode; first and second word lines stacked immediately above the first path transistor; a first pillar passing through the first and second word lines and having a bottom end connected to the first gate electrode; a second pillar passing through the first and second word lines and having a bottom end connected to the first gate electrode; a first bit line connected to a top end of the first pillar; a second bit line connected to a top end of the second pillar; a first nonvolatile memory device between the first pillar and the first word line; a second nonvolatile memory device between the first pillar and the second word line; a third nonvolatile memory device between the second pillar and the first word line; and a fourth nonvolatile memory device between the second pillar and the second word line. A first context is stored in the first and third nonvolatile memory devices and a second context is stored in the second and fourth nonvolatile memory devices.

The embodiments will be described below with reference to the drawings.

(Basic Unit)

FIG. 1 shows a configuration memory.

FIG. 1 shows a basic unit (programmable logic switch) to store contexts in a multi-context reconfigurable logic circuit.

First memory string MS1 is, for example, a NAND string containing first, second, third, and fourth nonvolatile memory devices MC11, MC12, MC13, MC14 connected in series between common node CN and first bit line BL1.

One end of MS1 is connected to first bit line BL1 via drain-side select gate transistor ST12. The other end of first, second, third, and fourth nonvolatile memory devices MC11, MC12, MC13, MC14 is connected to common node CN via source-side select gate transistor ST11.

Similarly, second memory string MS2 is, for example, a NAND string containing first, second, third, and fourth nonvolatile memory devices MC21, MC22, MC23, MC24 connected in series between common node CN and second bit line BL2.

One end of MS2 is connected to second bit line BL2 via drain-side select gate transistor ST22. The other end of first, second, third, and fourth nonvolatile memory devices MC21, MC22, MC23, MC24 is connected to common node CN via source-side select gate transistor ST21.

First word line WL1 is connected to control terminals of first nonvolatile memory devices MC11, MC21 inside first and second memory strings MS1, MS2.

Similarly, second word line WL2 is connected to control terminals of second nonvolatile memory devices MC12, MC22 inside first and second memory strings MS1, MS2. Also, third word line WL3 is connected to control terminals of third nonvolatile memory devices MC13, MC23 inside first and second memory strings MS1, MS2.

Further, fourth word line WL4 is connected to control terminals of fourth nonvolatile memory devices MC14, MC24 inside first and second memory strings MS1, MS2.

First nonvolatile memory devices MC11, MC21 configure one memory pair and store, for example, 1 switch-circuit-information (complementary data). Similarly, second nonvolatile memory devices MC12, MC22, third nonvolatile memory devices MC13, MC23, and fourth nonvolatile memory devices MC14, MC24 each configure one memory pair and store, for example, 1 bit (complementary data).

In the present example, one context is configured by one memory pair (1 bit) constituted of two nonvolatile memory devices MC1$i$, MC2$i$ connected to one word line WL$i$ ($i$ is one of 1 to 4). However, it is easy to configure one context from bits by combining basic units in the present example.

The number of contexts in the present example is four (corresponding to the number of memory pairs), but is not limited this. That is, by setting the number of memory pairs (in this example, the number of word lines WL$i$) to 2 or more, the basic unit can be used as the configuration memory of a multi-context reconfigurable logic circuit.

Further in the present example, one word line WL$i$ is connected to control terminals of two nonvolatile memory devices MC1$i$, MC2$i$ configuring one memory pair. Instead, however, one word line (a total of two word lines) may be connected to each of the control terminals of two nonvolatile memory devices MC1$i$, MC2$i$ configuring one memory pair independently.

Nonvolatile memory devices in first and second memory string MS1, MS2 are each, for example, flash memory cells.

The flash memory cell is, for example, an FET (Field Effect Transistor) having a stacked structure of a semiconductor layer (channel), a first insulating layer (tunnel insulating layer), a charge storage layer, a second insulating layer (inter-electrode insulating layer/block insulating layer), and a control gate electrode (word line).

If the charge storage layer is a floating gate electrode in an electrically floating state, the flash memory cell is called a floating gate type and the second insulating layer is called an inter-electrode insulating layer, IPD (Inter-polysilicon dielectric) or the like.

If the charge storage layer is an insulating layer (for example, a silicon nitride layer) having a function of trapping charges, the flash memory cell is called a charge trap type, SONGS (Silicon-Oxide-Nitride-Oxide-Silicon) or the like, and the second insulating layer is called a block insulating layer that blocks a leak current.

Select gate transistors ST11, ST12, ST21, ST22 may have both the same structure and a different structure from that of first, second, third, and fourth nonvolatile memory devices in MS1 and MS2.

In the latter case, select gate transistors ST11, ST12, ST21, ST22 are desirably, for example, FETs having no charge storage layer.

Control terminals of select gate transistors ST12, ST22 on the drain side are connected to, for example, select gate line SGD and control terminals of select gate transistors ST11, ST21 on the source side are connected to, for example, select gate line SGS.

First, second, third, and fourth controls lines WL1, WL2, WL3, WL4 and select gate lines SGD, SGS extend in the X direction (row direction) and first and second bit lines BL1, BL2 extend in the Y direction (column direction) perpendicular to the X direction.

First and second memory strings MS1, MS2 are, arranged three-dimensionally in the Z direction (vertical direction) perpendicular to the X direction and the Y direction.

Common node CN is connected to, for example, the control terminal (for example, a gate terminal of FET) of a path transistor PT. The path transistor PT has a role of selectively interconnecting logic elements to realize predetermined logic (circuit configuration).

Driver 11 drives first, second, third, and fourth word lines WL1, L2, L3, L4 and select gate lines SGD, SGS. Driver 12 drives first and second bit lines BL1, BL2.

Control circuit 10 controls operations of the configuration memory (basic unit) in the present example.

For example, first bit line BL1 is set to a first potential (for example, earth potential Vss) and second bit line BL2 is set to a second potential (for example, power supply potential Vdd) during read operation (during FPGA operation).

When a context (selected context) stored in two nonvolatile memory devices (one memory pair) connected to first word line WL1 is read, first word line WL1 is set to read potential Vread between a threshold voltage of first nonvolatile memory device MC11 in first memory string MS1 and a threshold voltage of first nonvolatile memory device MC21 in second memory string MS2.

As a result, the selected context (one of the first and second potentials) is transferred to common node CN based on complementary data stored in first nonvolatile memory devices MC11, MC21.

When common node CN is set to the second potential (for example, power supply potential Vdd), for example, path transistor PT is turned on and two logic elements connected to both ends of the path transistor are interconnected.

On the other hand, when common node CN is set to the first potential (for example, earth potential Vss), for example, the path transistor is turned off and two logic elements connected to both ends of the path transistor are disconnected.

Incidentally, common node CN may also be connected to an input node of an inverter, an input terminal of a switch transistor (for example, a source/drain of FET) or the like.

(Device Structure)

The device structure to realize the above basic unit will be described. In the following description, the XYZ-orthogonal coordinate system is used for convenience. In the coordinate system, two directions are parallel to the upper surface of a semiconductor substrate and orthogonal to each other. These are set as the X direction and the Y direction. And, a direction orthogonal to these directions, that is, a stacked direction is set as the Z direction.

The structure in which four memory pairs (nonvolatile memory devices), each of which storing one context, are stacked will be described below, but the number of memory pairs stacked on the semiconductor substrate is not limited to four and may be any number equal to two or greater.

If, for example, the number of contexts that can be stored in one basic unit is n (n is a natural number equal to 2 or greater), the number of memory pairs in one basic unit becomes n and the number of memory cells (nonvolatile memory devices) in one basic unit becomes 2n.

First Embodiment

FIGS. 2 and 3 show the first embodiment of the device structure.

Path transistors PT1, PT2 are switches to decide a connecting relationship of logic elements to selectively realize one of multiple pieces of logic.

Path transistors PT1, PT2 are, for example, FETs and are arranged on a semiconductor substrate (for example, a silicon substrate). Path transistors PT1, PT2 have channels to be signal paths and gate electrodes G1, G2 to control ON/OFF thereof. Both ends of a channel are connected to conductive layer 31.

Conductive layer 31 is, for example, a part of a semiconductor layer as an active area of path transistors PT1, PT2.

Seven conductive layers are stacked immediately above path transistors PT1, PT2. These conductive layers may be, for example, a semiconductor (such as conductive polysilicon) or a metal (including alloys such as silicide).

Buffer layers 32-1, 32-2 connected to gate electrodes G1, G2 of path transistors PT1, PT2 become the bottom layer. Select gate line SGS is arranged on buffer layers 32-1, 32-2.

Select gate line SGD forms the top layer. Four remaining conductive layers between two select gate lines SGS, SGD are word lines WL1, WL2, WL3, WL4. It is assumed here that the lowest word line is set as WL1 and the number i (i=1, 2, 3, 4) of word line WLi increases toward upward.

Select gate lines SGS, SGD and word lines WL1, WL2, WL3, WL4 extend, for example, in the X direction.

First and second pillars (for example, silicon pillars) 30-1, 30-2 pass through word lines WL1, WL2, WL3, WL4 and select gate lines SGS, SGD to be connected in common to buffer layer 32-1.

The shape of first and second pillars 30-1, 30-2 is not specifically limited and may be, for example, a cylindrical shape. First and second pillars 30-1, 30-2 may have a structure in which an insulating pillar (for example, SiN) as a core is covered with a semiconductor layer (for example, Si) to be a channel.

First bit line BL1 is connected to the top end of first pillar 30-1 and second bit line BL2 is connected to the top end of second pillar 30-2. First and second bit lines BL1, BL2 include, for example, a metal or alloy (including silicide).

Similarly, third and fourth pillars (for example, silicon pillars) 30-3, 30-4 pass through word lines WL1, WL2, WL3, WL4 and select gate lines SGS, SGD to be connected in common to buffer layer 32-2.

The shape of third and fourth pillars 30-3, 30-4 is also not specifically limited and may be, for example, a cylindrical shape. Third and fourth pillars 30-3, 30-4 may have a structure in which an insulating pillar (for example, SiN) as a core is covered with a semiconductor layer (for example, Si) to be a channel.

Third bit line BL3 is connected to the top end of third pillar 30-3 and fourth bit line BL4 is connected to the top end of fourth pillar 30-4. Third and fourth bit lines BL3, BL4 include, for example, a metal or alloy (including silicide).

First to fourth bit lines BL1 to BL4 extend, for example, in the Y direction.

The basic unit includes first and second memory strings MS1, MS2.

First memory string MS1 includes nonvolatile memory devices MC11, MC12, MC13, MC14 and select gate transistors ST11, ST12 connected in series by first pillar 30-1 as a channel.

Nonvolatile memory devices MC11, MC12, MC13, MC14 are arranged between first pillar 30-1 and word lines WL1, WL2 WL3, WL4 respectively.

Select gate transistor ST11 is arranged between first pillar 30-1 and select gate line SGS. Select gate transistor ST12 is arranged between first pillar 30-1 and select gate line SGD.

Nonvolatile memory devices MC11, MC12, MC13, MC14 include gate insulating layer (tunnel insulating layer) 21, charge storage layer 22, and inter-electrode insulating layer (block insulating layer) 23 on the surface of first pillar 30-1.

Charge storage layer 22 may be an insulating layer as a charge trap layer or a floating gate electrode.

Inter-electrode insulating layer 23 has a stacked structure of, for example, a silicon oxide layer, silicon nitride layer, and silicon oxide layer However, inter-electrode insulating layer 23 is not limited to the above example and may include, for example, a so-called high dielectric material having a larger relative dielectric constant than the silicon oxide layer.

Select gate transistor ST12 has a structure that is different from that of nonvolatile memory devices MC11, MC12, MC13, MC14. That is, select gate transistor ST12 has only gate insulating layer (tunnel insulating layer) 24 between first pillar 30-1 and select gate line SGD.

In contrast, select gate transistor ST11 has the same structure as that of nonvolatile memory devices MC11, MC12, MC13, MC14. That is, select gate transistor ST11 includes gate insulating layer (tunnel insulating layer) 21, charge storage layer 22, and inter-electrode insulating layer (block insulating layer) 23 on the surface of first pillar 30-1.

However, select gate transistor ST11 may not have the same structure as that of nonvolatile memory devices MC11, MC12, MC13, MC14.

For example, select gate transistor ST11 may have, like select gate transistor ST12, only a gate insulating layer (for example, a silicon oxide layer) between first pillar 30-1 and select gate lines SGS, SGD.

Second memory string MS2 includes nonvolatile memory devices MC21, MC22, MC23, MC24 and select gate transistors ST21, ST22 connected in series by second pillar 30-2 as a channel.

Nonvolatile memory devices MC21, MC22, MC23, MC24 are arranged between second pillar 30-2 and word lines WL1, WL2 WL3, WL4 respectively.

Select gate transistor ST21 is arranged between second pillar 30-2 and select gate line SGS. Select gate transistor ST22 is arranged between second pillar 30-2 and select gate line SGD.

Nonvolatile memory devices MC21, MC22, MC23, MC24 include gate insulating layer (tunnel insulating layer) 21, charge storage layer 22, and inter-electrode insulating layer (block insulating layer) 23 on the surface of second pillar 30-2.

Select gate transistor ST22 has only gate insulating layer (tunnel insulating layer) 24 between second pillar 30-2 and select gate line SGD.

Select gate transistor ST21 includes gate insulating layer (tunnel insulating layer) 21, charge storage layer 22, and inter-electrode insulating layer (block insulating layer) 23 on the surface of second pillar 30-2. However, select gate transistor ST21 may have the same structure as that of select gate transistor ST22.

In the structure as described above, for example, the first context is written into the first memory pair (nonvolatile memory devices MC11, MC21) as complementary data. Similarly, the second context is written into the second memory pair (nonvolatile memory devices MC12, MC22) as complementary data.

Thus, if a device structure according to the first embodiment is used, the schematic can faithfully be realized as the device structure (programmable logic switch) and thus, a contribution can be made to realization of a multi-context reconfigurable logic circuit.

First Modification of the First Embodiment

Figure 4:
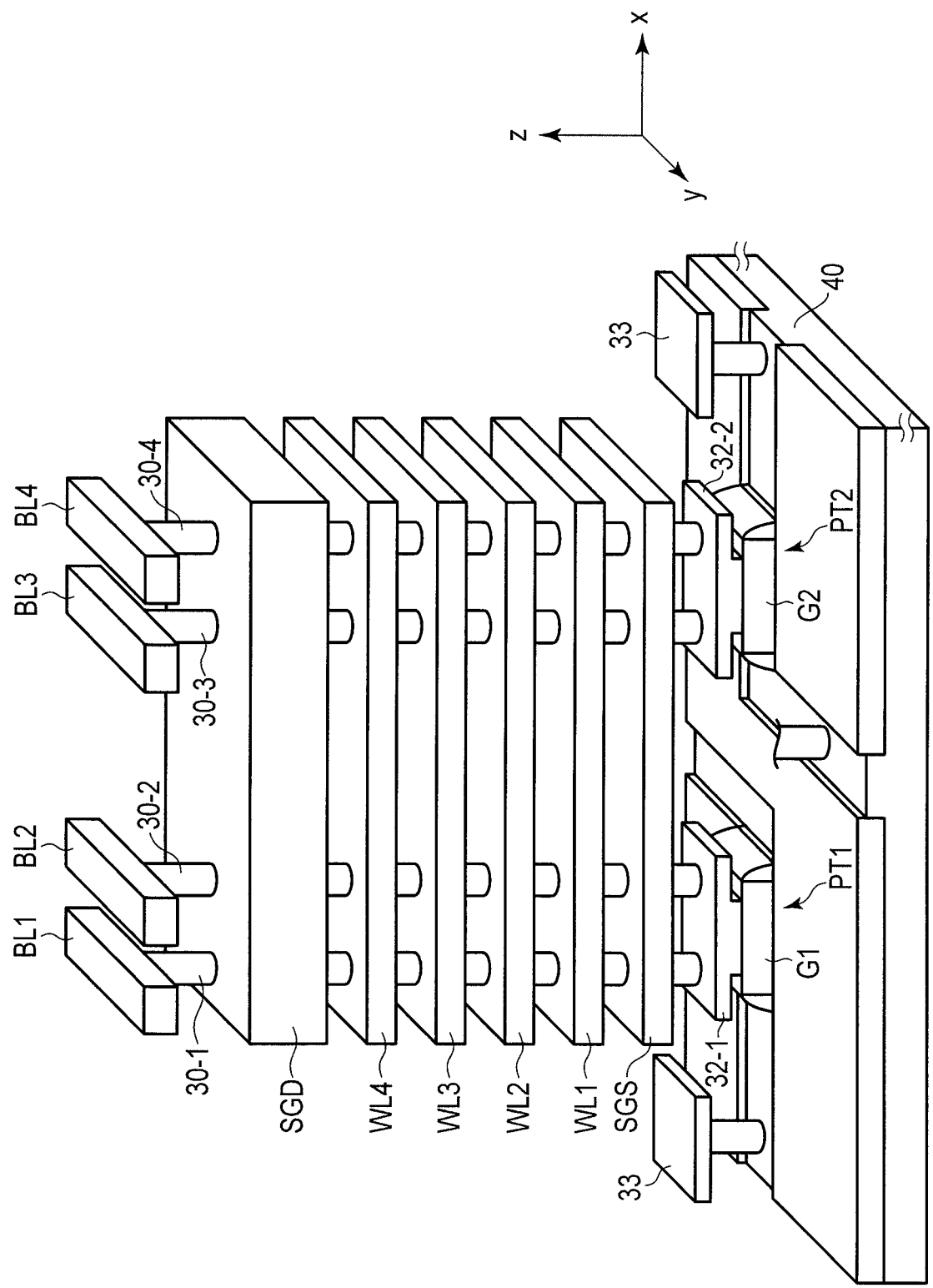
FIG. 4 is a perspective view showing a first modification of the first embodiment.
Figure 5:
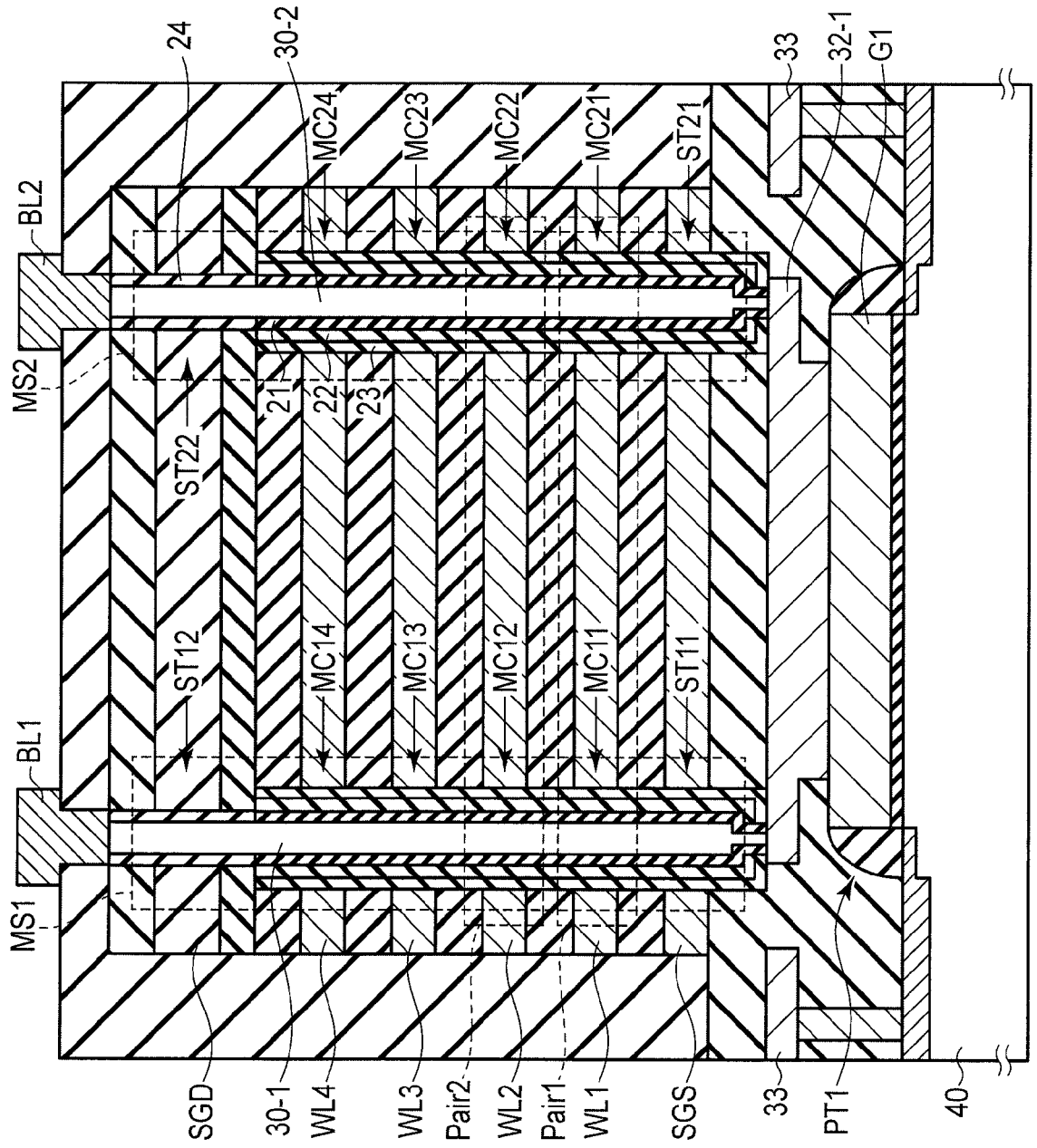
FIG. 5 is a sectional view showing the first modification of the first embodiment.

FIGS. 4 and 5 show the first modification of the first embodiment.

In the description that follows, the same reference numerals are attached to the same elements as those of a device structure according to the first embodiment and thereby, the description thereof is omitted.

The first modification is different from the first embodiment in a connection method of channels of path transistors PT1, PT2 and logic elements to realize predetermined logic. Otherwise, the first modification is the same as the first embodiment.

Wiring layer 33 of path transistors PT1, PT2 is arranged, for example, in the same wiring layer (the same layer in a stacked structure) as that of buffer layers 32-1, 32-2 connected to gate electrodes G1, G2 of path transistors PT1, PT2.

Buffer layers 32-1, 32-2 and wiring layer 33 are both, for example, semiconductor layers (such as conductive polysilicon layers).

Path transistors PT1, PT2 include an impurity region as a source/drain region inside semiconductor substrate 40 and the impurity region is connected to logic elements to realize predetermined logic via wiring layer 33.

Wiring layer 33 is arranged in the same wiring layer as that of buffer layers 32-1, 32-2 in the present example, but may be arranged instead, for example, in the same wiring layer as that of one or more of select gate lines SGS, SGD and word lines WL1, WL2, WL3, WL4.

That is, a region in which select gate lines SGS, SGD and word lines WL1, WL2, WL3, WL4 are not formed may be provided to arrange path transistors PT1 PT2 by using a stacked structure inside the region.

Second Modification of the First Embodiment

Figure 6:
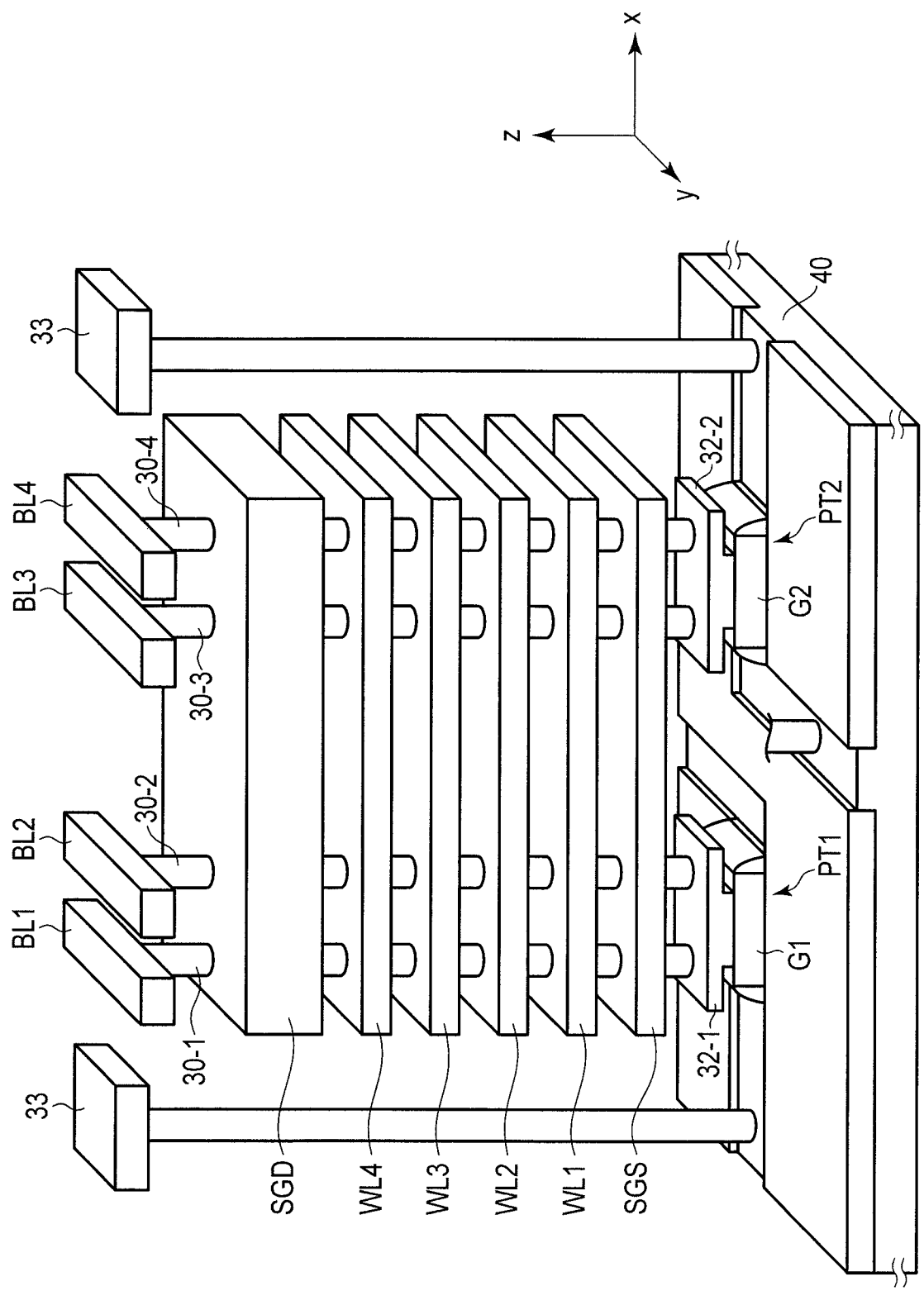
FIG. 6 is a perspective view showing a second modification of the first embodiment.
Figure 7:
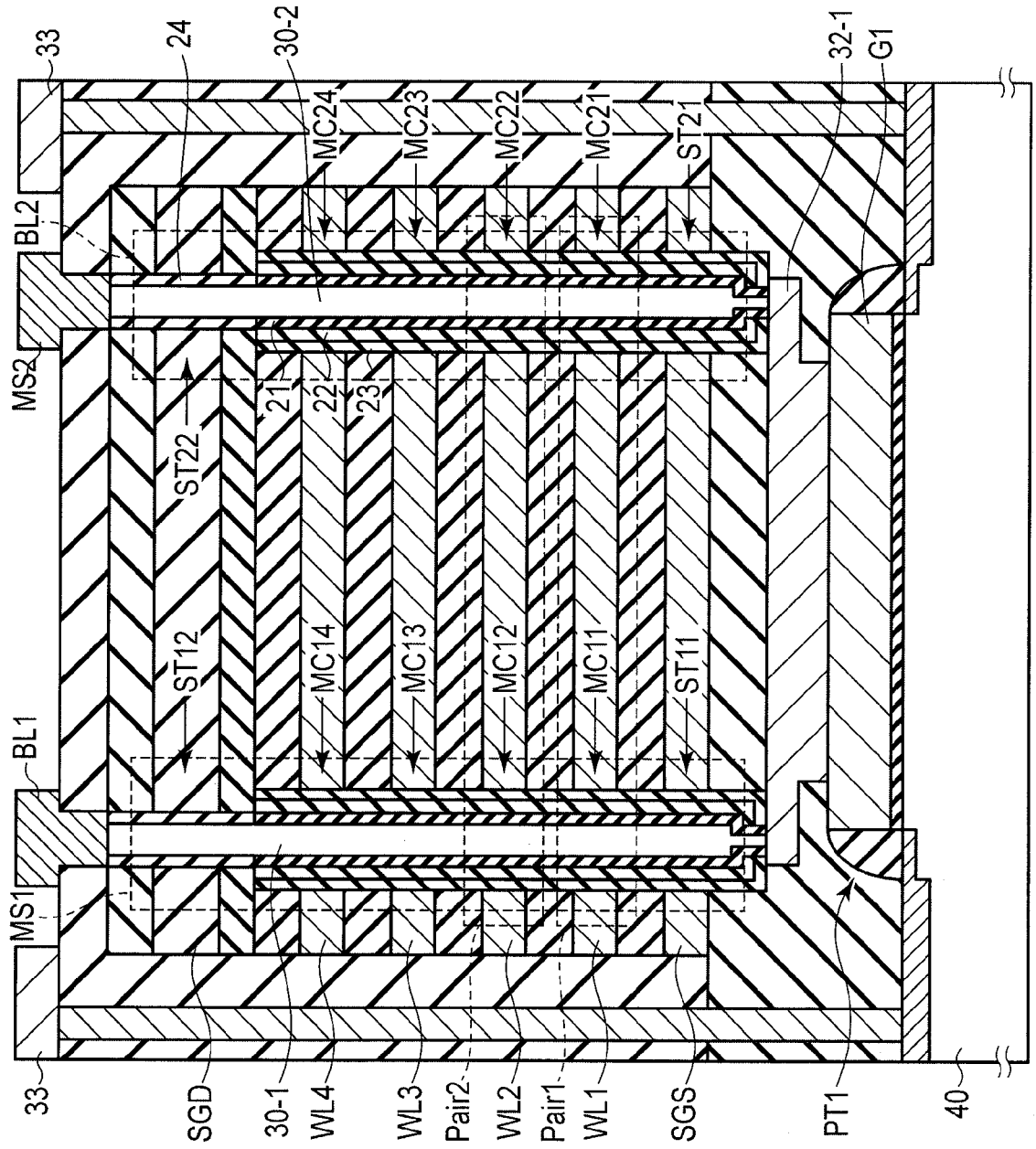
FIG. 7 is a sectional view showing the second modification of the first embodiment.

FIGS. 6 and 7 show the second modification of the first embodiment.

In the description that follows, the same reference numerals are attached to the same elements as those of a device structure according to the first embodiment and thereby, the description thereof is omitted.

The second modification is different from the first embodiment in a connection method of channels of path transistors PT1, PT2 and logic elements to realize predetermined logic. Otherwise, the second modification is the same as the first embodiment.

Wiring layer 33 of path transistors PT1, PT2 is arranged, for example, in the same wiring layer as that of bit lines BL1, BL2, BL3, BL4.

Bit lines BL1, BL2, BL3, BL4 and wiring layer 33 are both, for example, metallic layers or alloy layers (including silicide layers).

Path transistors PT1, PT2 include an impurity region as a source/drain region inside semiconductor substrate 40 and the impurity region is connected to logic elements to realize predetermined logic via wiring layer 33.

In the present example, wiring layer 33 is arranged in the same wiring layer as that of bit lines BL1, BL2, BL3, BL4, but may be arranged instead, for example, in a wiring layer present above bit lines BL1, BL2, BL3, BL4.

Moreover, the above first modification and second modification may be combined.

Second Embodiment

Figure 8:
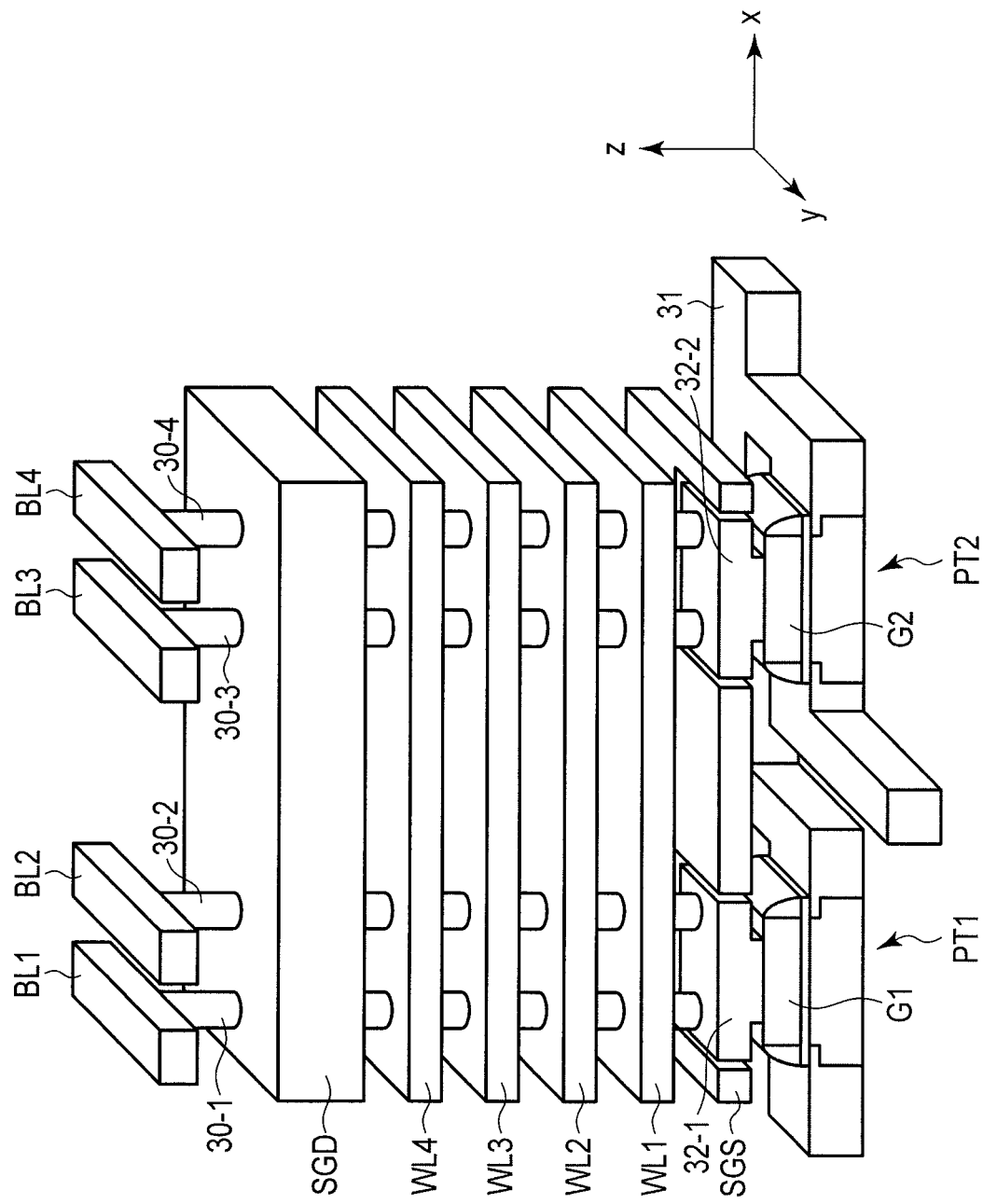
FIG. 8 is a perspective view showing a second embodiment of the device structure.

FIGS. 8 and 9 show the second embodiment of the device structure.

In the description that follows, the same reference numerals are attached to the same elements as those of a device structure according to the first embodiment and thereby, the description thereof is omitted.

The second embodiment is different from the first embodiment in the structure of select gate transistors ST11, ST21. Otherwise, the second embodiment is the same as the first embodiment.

In the present example, a part of select gate line SGS is cut and buffer layers 32-1, 32-2 are arranged in the part. The part includes a portion where bottom ends of first and second pillars 30-1, 30-2 are present and a portion where bottom ends of third and fourth pillars 30-3, 30-4 are present.

That is, the bottom ends of first and second pillars 30-1, 30-2 are connected in common to buffer layer 32-1 surrounded by select gate line SGS. Also, the bottom ends of third and fourth pillars 30-3, 30-4 are connected in common to buffer layer 32-2 surrounded by select gate line SGS.

In such a structure, for example, buffer layer 32-1 has a first end in a portion adjacent to first pillar 30-1 and select gate transistor ST11 uses the first end of buffer layer 32-1 as a channel. That is, select gate transistor ST11 has a structure to control buffer layer 32-1 as a signal path (channel) by the potential of select gate line SGS as a back gate.

Buffer layer 32-2 has a second end in a portion adjacent to second pillar 30-2 and select gate transistor ST21 uses the second end of buffer layer 32-2 as a channel. That is, select gate transistor ST21 has a structure to control buffer layer 32-2 as a signal path (channel) by the potential of select gate line SGS as a back gate.

According to the second embodiment, when compared with the first embodiment, the number of conductive layers stacked on path transistors PT1, PT2 can be reduced by 1. Therefore, the schematic of the programmable logic switch can faithfully be realized as a device structure while manufacturing costs are reduced.

First Modification of the Second Embodiment

Figure 10:
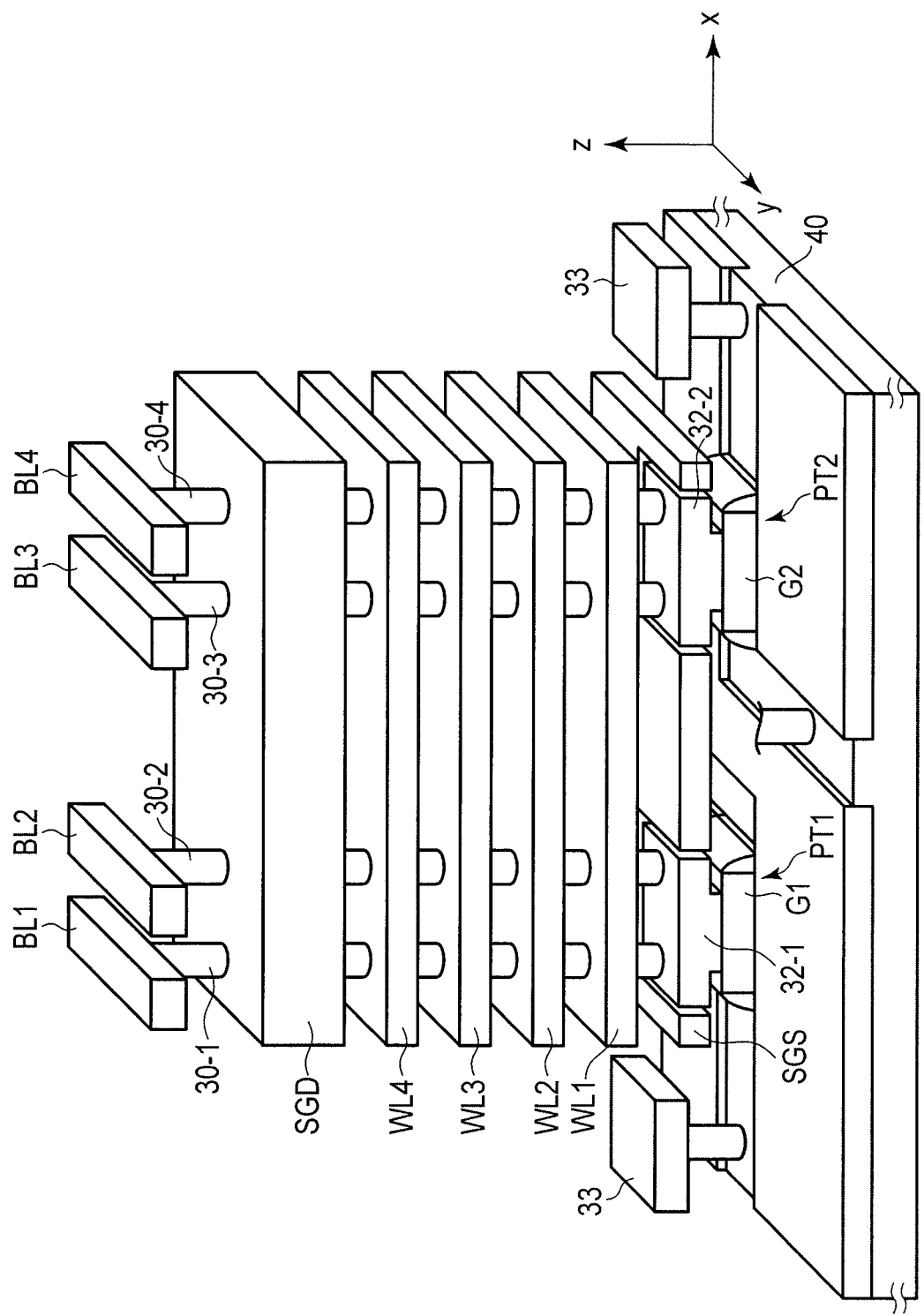
FIG. 10 is a perspective view showing a first modification of the second embodiment.
Figure 11:
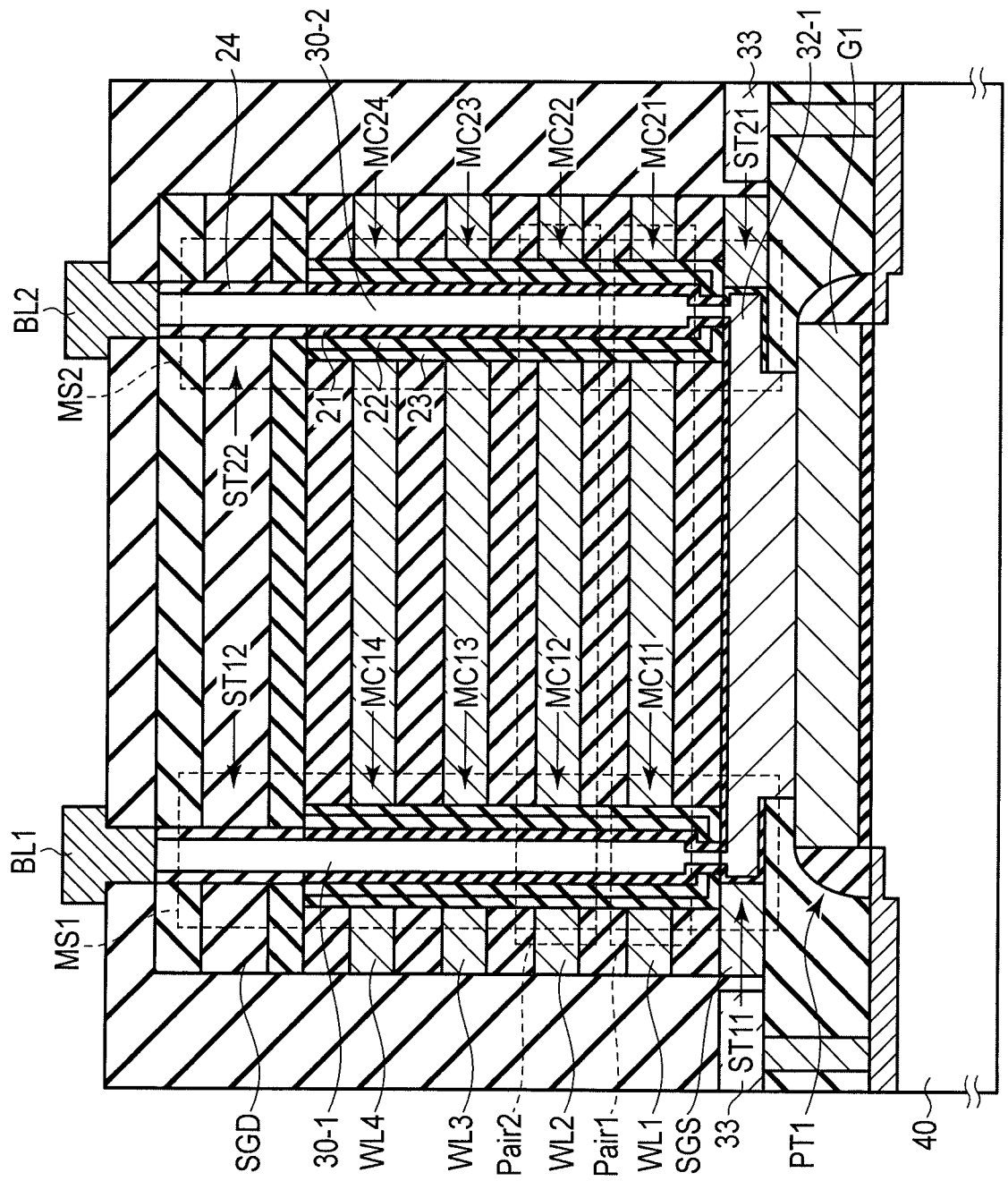
FIG. 11 is a sectional view showing the first modification of the second embodiment.

FIGS. 10 and 11 show the first modification of the second embodiment.

In the description that follows, the same reference numerals are attached to the same elements as those of a device structure according to the second embodiment and thereby, the description thereof is omitted.

The first modification is different from the second embodiment in a connection method of channels of path transistors PT1, PT2 and logic elements to realize predetermined logic. Otherwise, the first modification is the same as the second embodiment.

Wiring layer 33 of path transistors PT1, PT2 is arranged, for example, in the same wiring layer (the same layer in a stacked structure) as that of select gate line SGS. Select gate line SGS and wiring layer 33 are both, for example, semiconductor layers (such as conductive polysilicon layers).

Path transistors PT1, PT2 include an impurity region as a source/drain region inside semiconductor substrate 40 and the impurity region is connected to logic elements to realize predetermined logic via wiring layer 33.

Wiring layer 33 is arranged in the same wiring layer as that of select gate line SGS in the present example, but may be arranged instead, for example, in the same wiring layer as that of one or more of select gate line SGD and word lines WL1, WL2, WL3, WL4.

Second Modification of the Second Embodiment

Figure 12:
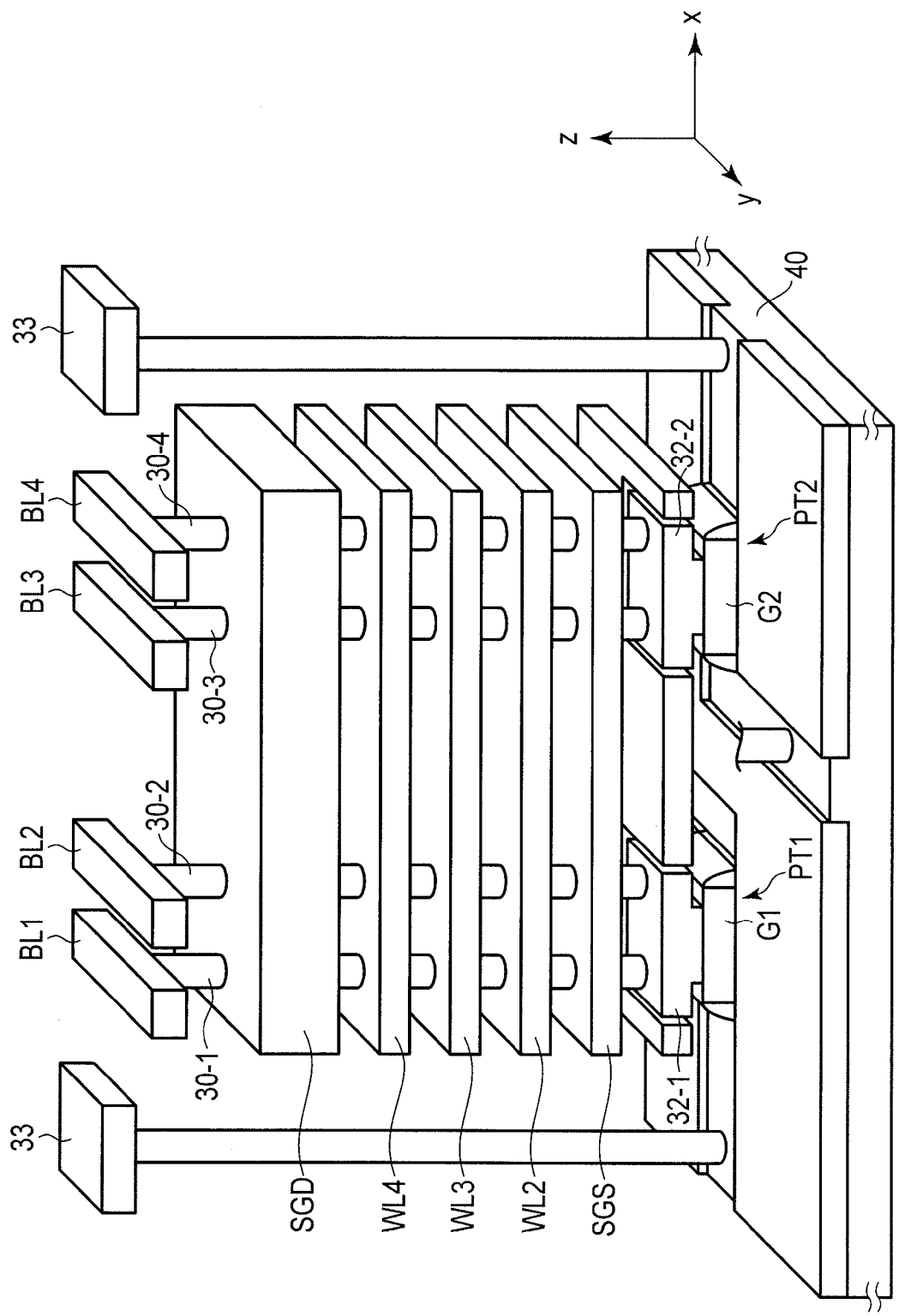
FIG. 12 is a perspective view showing a second modification of the second embodiment.
Figure 13:
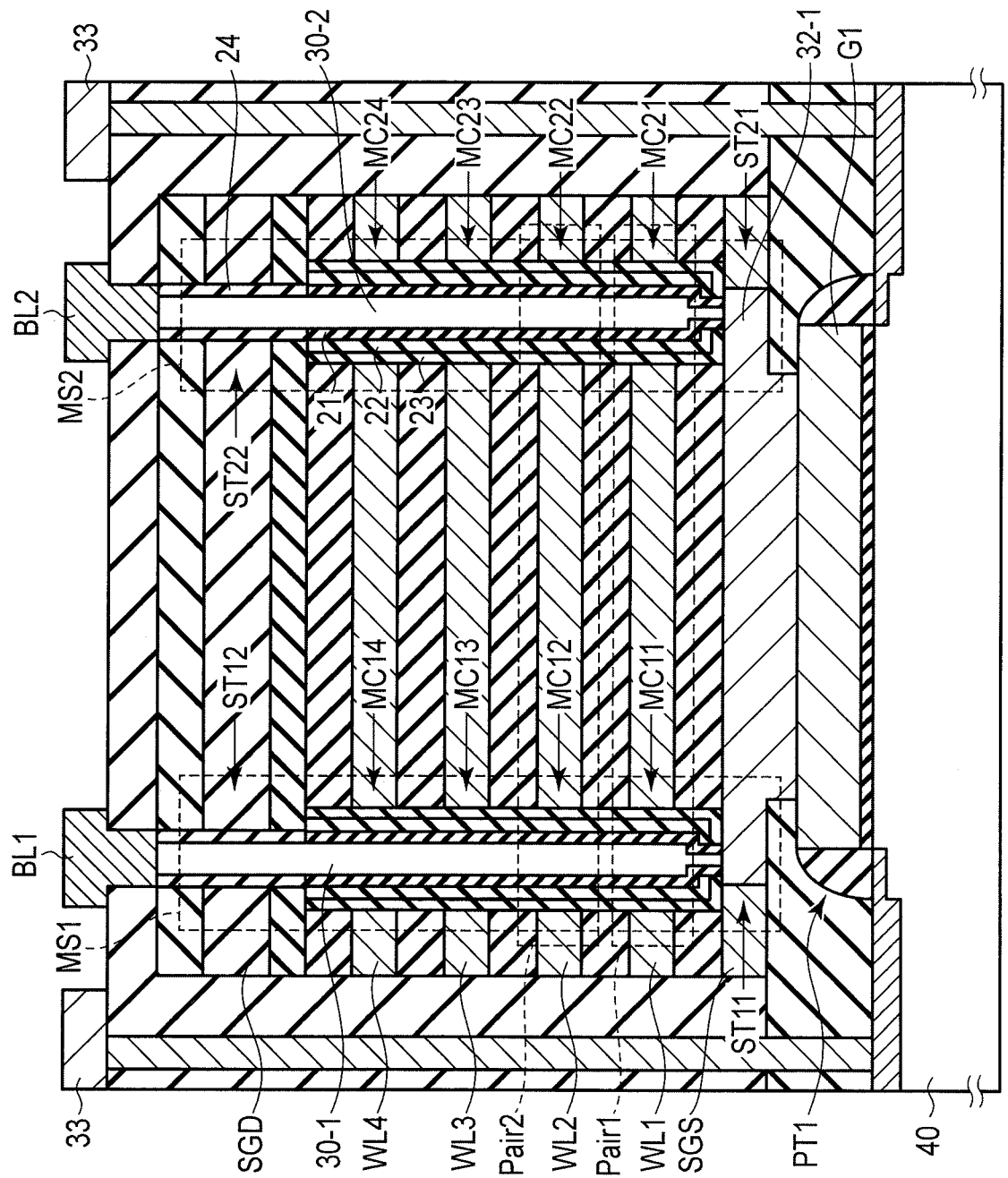
FIG. 13 is a perspective view showing the second modification of the second embodiment.

FIGS. 12 and 13 show the second modification of the second embodiment.

In the description that follows, the same reference numerals are attached to the same elements as those of a device structure according to the second embodiment and thereby, the description thereof is omitted.

The second modification is different from the second embodiment in a connection method of channels of path transistors PT1, PT2 and logic elements to realize predetermined logic. Otherwise, the second modification is the same as the second embodiment.

Wiring layer 33 of path transistors PT1, PT2 is arranged, for example, in the same wiring layer as that of bit lines BL1, BL2, BL3, BL4.

Bit lines BL1, BL2, BL3, BL4 and wiring layer 33 are both, for example, metallic layers or alloy layers (including silicide layers).

Path transistors PT1, PT2 include an impurity region as a source/drain region inside semiconductor substrate 40 and the impurity region is connected to logic elements to realize predetermined logic via wiring layer 33.

In the present example, wiring layer 33 is arranged in the same wiring layer as that of bit lines BL1, BL2, BL3, BL4, but may be arranged instead, for example, in a wiring layer present above bit lines BL1, BL2, BL3, BL4.

Moreover, the above first modification and second modification may be combined.

Third Embodiment

Figure 14:
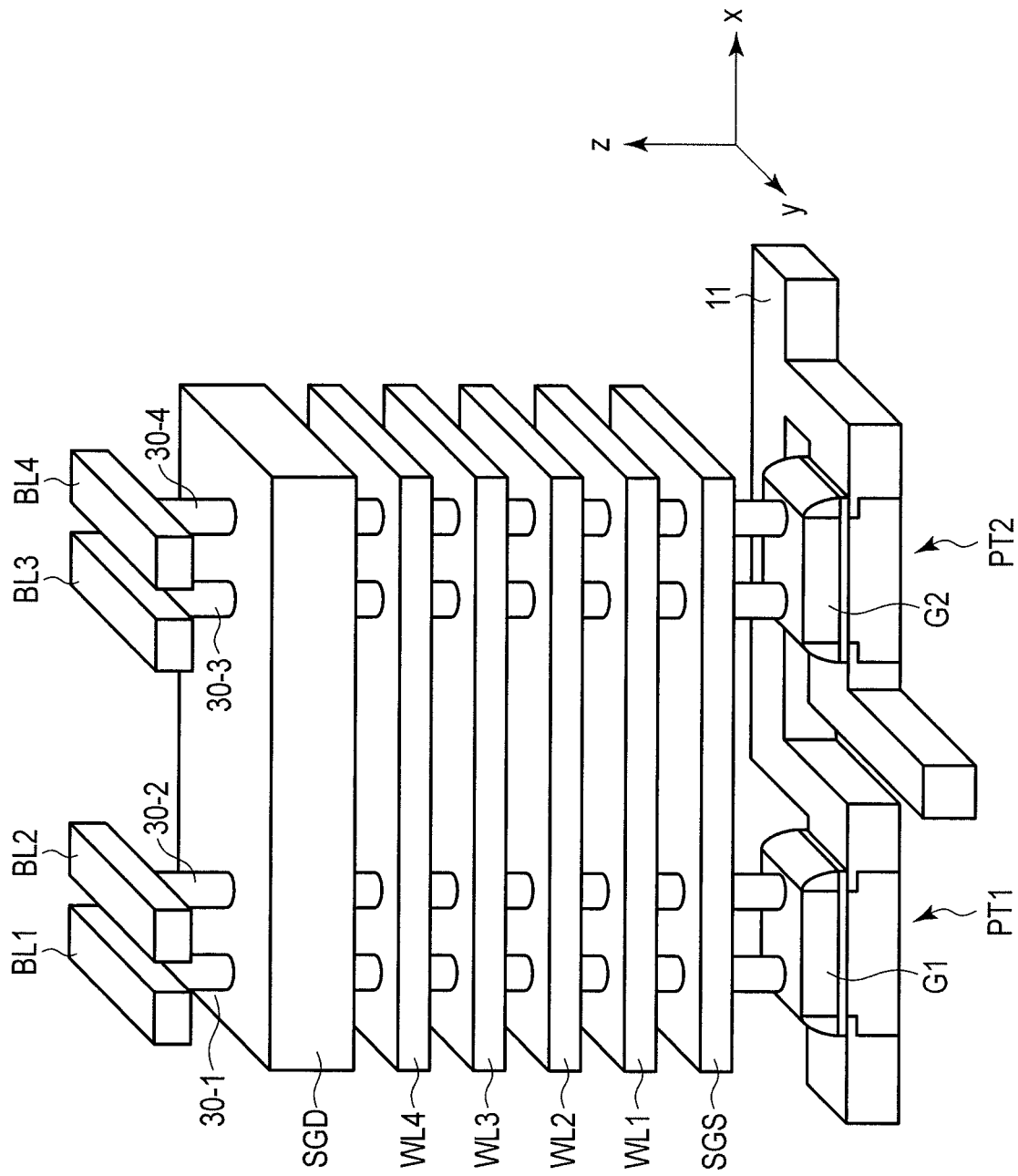
FIG. 14 is a perspective view showing a third embodiment of the device structure.
Figure 15:
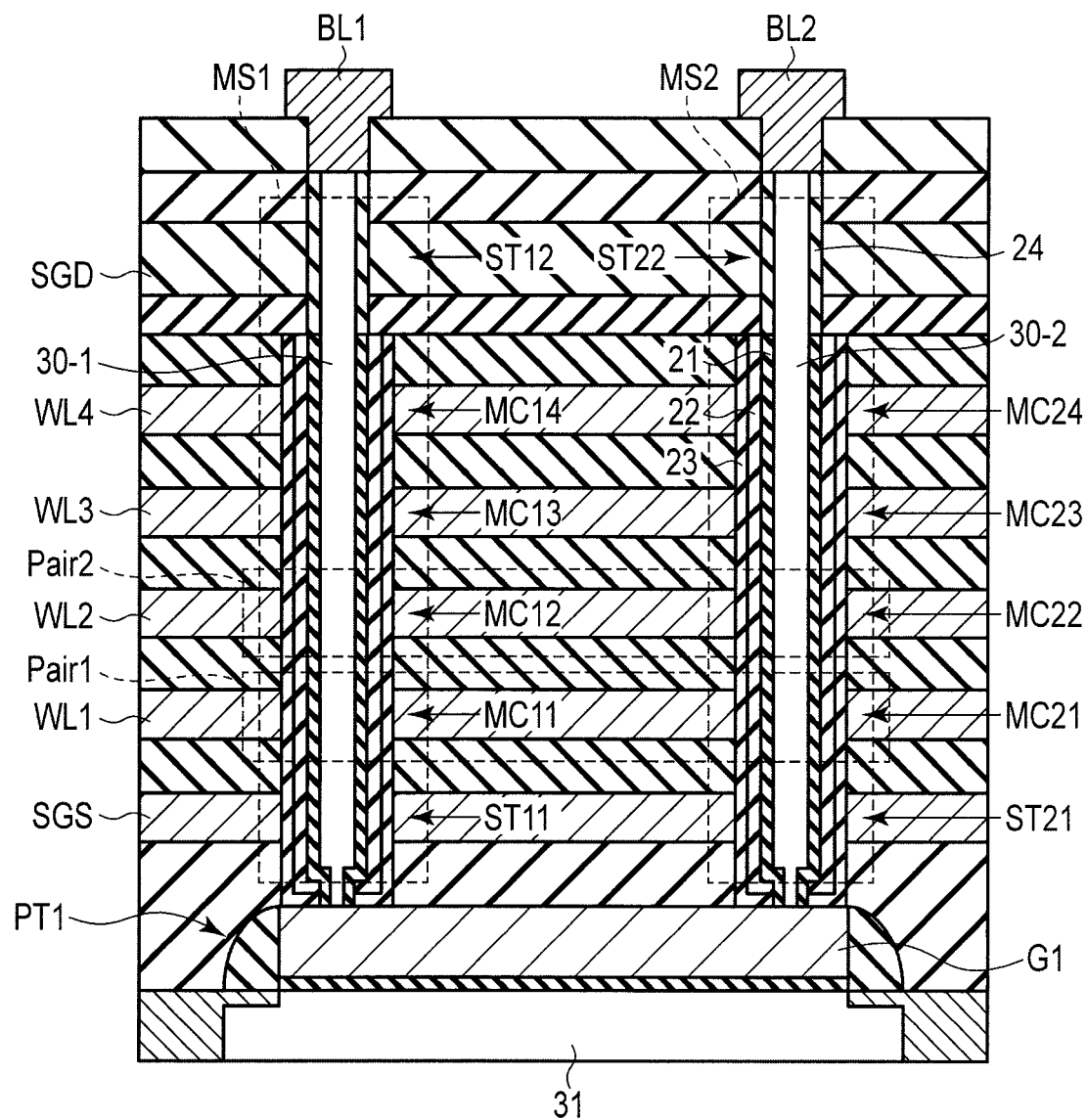
FIG. 15 is a sectional view showing the third embodiment of the device structure.

FIGS. 14 and 15 show the third embodiment of the device structure.

In the description that follows, the same reference numerals are attached to the same elements as those of a device structure according to the first embodiment and thereby, the description thereof is omitted.

The third embodiment is different from the first embodiment in a connection method of first to fourth pillars 30-1 to 30-4 and gate electrodes G1, G2 of path transistors PT1, PT2. Otherwise, the third embodiment is the same as the first embodiment.

In the present example, buffer layers 32-1, 32-2 shown in FIGS. 2 and 3 (first embodiment) are not present. Therefore, bottom ends of first and second pillars 30-1, 30-2 are directly connected to gate electrode G1 of path transistor PT1. Also, bottom ends of third and fourth pillars 30-3, 30-4 are directly connected to gate electrode G2 of path transistor PT2.

According to the third embodiment, when compared with the first embodiment, the number of conductive layers stacked on path transistors PT1, PT2 can be reduced by 1. Therefore, the schematic of the programmable logic switch can faithfully be realized as a device structure while manufacturing costs are reduced.

However, there is no buffer layer and thus, a technology to correctly align first to fourth pillars 30-1 to 30-4 and gate electrodes G1, G2 of path transistors PT1, PT2 is needed.

For example, a fringe is provided on gate electrodes G1, G2 and the fringe is provided in a device isolation region that is not immediately above channels of path transistors PT1, PT2. In this case, first to fourth pillars 30-1 to 30-4 can reliably be brought into contact with gate electrodes G1, G2 of path transistors PT1, PT2 by increasing the size of the fringe.

Modification of the Third Embodiment

Figure 17:
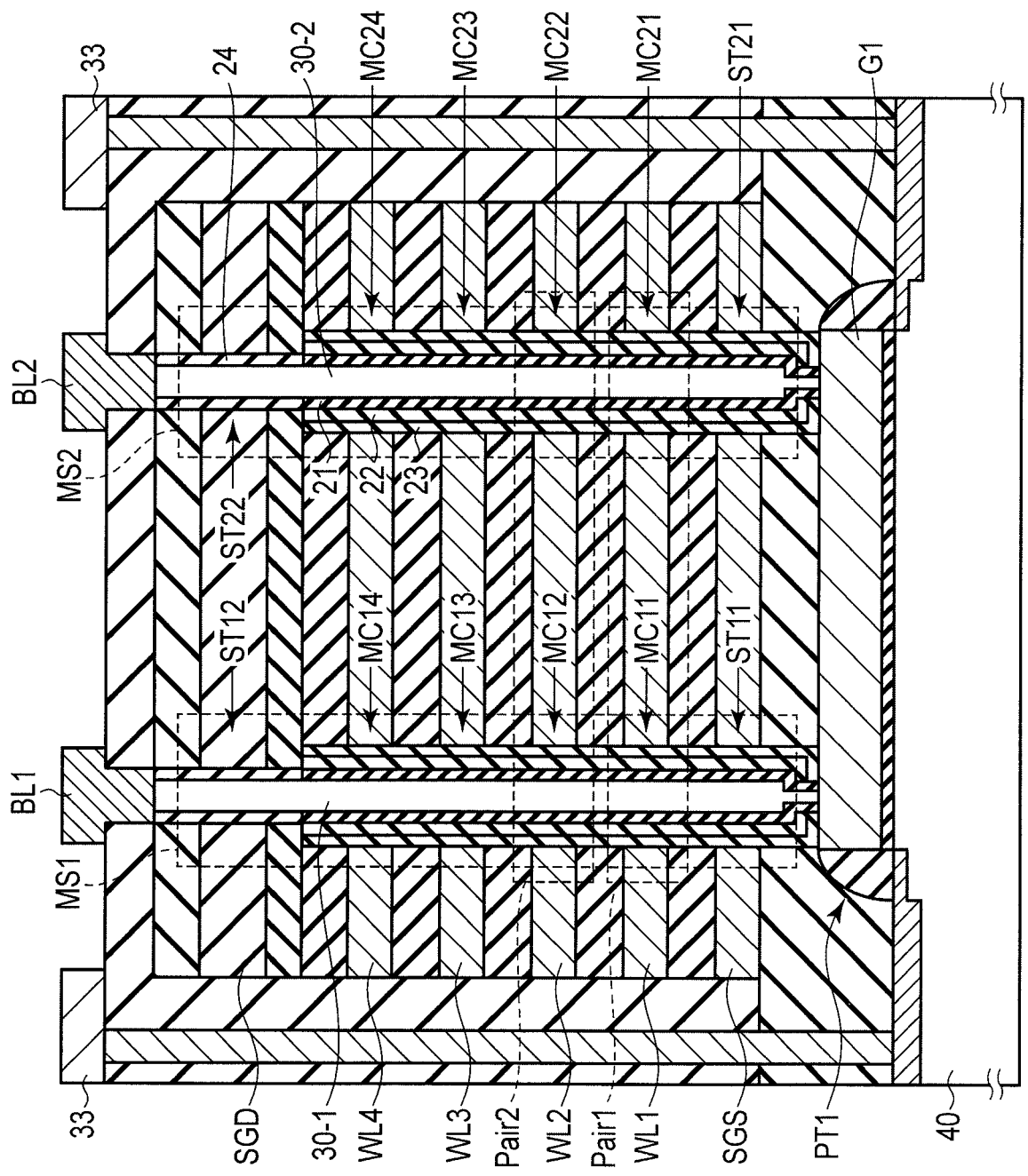
FIG. 17 is a sectional view showing the modification of the third embodiment.

FIGS. 16 and 17 show the modification of the third embodiment.

In the description that follows, the same reference numerals are attached to the same elements as those of a device structure according to the third embodiment and thereby, the description thereof is omitted.

The modification is different from the third embodiment in a connection method of channels of path transistors PT1, PT2 and logic elements to realize predetermined logic. Otherwise, the modification is the same as the third embodiment.

Wiring layer 33 of path transistors PT1, PT2 is arranged, for example, in the same wiring layer as that of bit lines BL1, BL2, BL3, BL4.

Bit lines BL1, BL2, BL3, BL4 and wiring layer 33 are both, for example, metallic layers or alloy layers (including silicide layers).

Path transistors PT1, PT2 include an impurity region as a source/drain region inside semiconductor substrate 40 and the impurity region is connected to logic elements to realize predetermined logic via wiring layer 33.

In the present example, wiring layer 33 is arranged in the same wiring layer as that of bit lines BL1, BL2, BL3, BL4, but may be arranged instead, for example, in the same wiring layer as that of one or more of select gate line SGD and word lines WL1, WL2, WL3, WL4. Wiring layer 33 may also be arranged in a wiring layer present above bit lines BL1, BL2, BL3, BL4.

Basic Operation

The basic operation (read/write/erase) of a basic unit (programmable logic switch) according to the first to third embodiments will be described.

The description that follows is based on the equivalent circuit shown in FIG. 18.

Nonvolatile memory devices (memory cells) MC11 to MC14, MC21 to MC24, MC31 to MC34, MC41 to MC44 and select gate transistors ST11, ST12, ST21, ST22, ST31, ST32, ST41, ST42 inside memory strings MS1 to MS4 are each assumed to be n-channel FETs.

However, this assumption is made for the sake of description and it is easy to change these transistors to p-channel FETs.

Path transistors PT1, PT2 also assume n-channel FETs, but the transistors can be changed to p-channel FETs.

Regarding threshold voltage of nonvolatile memory devices MC11 to MC14, MC21 to MC24, MC31 to MC34, MC41 to MC44, a state in which the threshold voltage is shifted positively is assumed to be a write state ("0" state) and a state in which the threshold voltage is not shifted is assumed to be an erase state ("1" state). Nonvolatile memory devices MC11 to MC14, MC21 to MC24, MC31 to MC34, MC41 to MC44 are assumed to be binary memories.

Nonvolatile memory devices MC11 to MC14, MC21 to MC24, MC31 to MC34, MC41 to MC44 are all assumed to be in the erase state in the initial state. That is, nonvolatile memory devices MC11 to MC14, MC21 to MC24, MC31 to MC34, MC41 to MC44 in the erase state are assumed to be written into, for example, bit by bit (for each memory pair).

In the description of the basic operation below, the nonvolatile memory device to be read/written into/erased is called a selection cell and other nonvolatile memory devices are called non-selection cells.

TABLE 1

| | Write | | Read | Erase |
|---|---|---|---|---|
| | $MC_{j3}\rightarrow$"0" $MC_{(j+1)3}\rightarrow$"1" | $MC_{(j+1)3}\rightarrow$"0" $MC_{j3}\rightarrow$"1" | (FPGA operation) | ALL cells→"1" |
| Odd-numbered data line $BL_j$ | Vss | Vdd (Vinhibit) | Vss/Vbl | Vera |
| Even-numbered data line $BL_{(j+1)}$ | Vdd (Vinhibit) | Vss | Vbl/Vss | Vera |
| SGD | Vsg | Vsg | Vsg | Vsg |
| WL4 | Vpass | Vpass | Vpass | Vss |
| WL3 | Vprg | Vprg | Vread | Vss |
| WL2 | Vpass | Vpass | Vpass | Vss |
| WL1 | Vpass | Vpass | Vpass | Vss |
| SGS | Voff | Voff | Von | Voff |
| $CN_j$ | — | — | Vss/Vbl | — |

1. Write Operation

In the initial state (state in which no context is written) before a write operation, all nonvolatile memory devices in all cell units CELL1, CELL2, ... are in the erase state ("1" state) of a low threshold voltage (low-Vth).

Then, for example, a write operation is performed in units of nonvolatile memory devices connected to one word line from nonvolatile memory devices on the source side (common nodes CN1, CN2 side) toward nonvolatile memory devices on the drain side (bit lines BL1 to BL4 side).

Here, a case when a write operation into selection cells MC13, MC23, MC33, MC43 connected to one selected word line WL3 is performed simultaneously will be described.

It is assumed that regarding a memory pair constituted of selection cells MC13, MC23, data "0" is written into selection cell MC13 (erase state→write state) and data "1" is written into selection cell MC23 (write protection).

It is also assumed that regarding a memory pair constituted of selection cells MC33, MC43, data "1" is written into selection cell MC33 (write protection) and data "0" is written into selection cell MC43 (erase state→write state).

In this case, as shown in Table 1

(1) Bit line BL1 is set to a "0" write potential, for example, earth potential Vss and bit line BL2 is set to write protection potential ("1" write potential) Vinhibit, for example, power supply potential (for example, +8V) Vdd.

(2) Bit line BL3 is set to write protection potential ("1" write potential) Vinhibit, for example, power supply potential Vdd and bit line BL4 is set to a "0" write potential, for example, earth potential Vss.

(3) Select gate line SGD is set to ON potential (for example, +4V) Vsg and select gate line SGS is set to OFF potential (for example, 0V) Voff.

A write voltage Vprg (for example, +18V) is applied to selection word line WL3. The transfer voltage (for example, +10V) Vpass is applied to the non-selection word lines WL1, WL2, WL4.

Transfer potential Vpass and ON potential Vsg are potentials that transfer the "0" write potential and the "1" write potential to channels of selection cells MC13, MC23, MC33, MC43 in memory strings MS1 to MS4 respectively.

Therefore, when write potential Vprg is applied to selection word line WL3, selection cells MC13, MC43 to whose channels the "0" write potential is applied change from the erase state ("1" state) of low threshold voltage (low-Vth) to the write state ("0" state) of high threshold voltage (high-Vth).

In contrast, when write potential Vprg is applied to selection word line WL3, select gate transistors ST22, ST32 in memory strings MS2, MS3 are cut off so that the channel potential is boosted in selection cells MC23, MC33 to whose channels the "1" write potential is applied.

Thus, the erase state ("1" state) of low threshold voltage (low-Vth) is maintained in selection cells MC23, MC33.

In such a write operation, select gate transistors ST11, ST21, ST31, ST41 in all cell units CELL1, CELL2, ... are in an OFF state due to Voff applied to select gate line SGS and thus, "1" write potential (for example, +8V) Vinhibit will not be transferred to gate electrodes of path transistors PT1, PT2.

Accordingly, path transistors PT1, PT2 can be prevented from being damaged by a high bias during write operation.

2. Erase Operation

Here, cell units CELL1, CELL2, ... having word lines WL1 to WL4 in common will be called a block. In this case, an erase operation is performed in blocks (block erasure).

When a configuration memory is configured by blocks, an erase operation can be performed in blocks (block erasure) or an erase operation of all blocks can be performed simultaneously (chip erasure).

(1) All word lines WL1 to WL4 are set to earth potential Vss. Also, select gate line SGD is set to ON potential (for example, +4V) Vsg and select gate line SGS is set to OFF potential (for example, 0V) Voff.

(2) All bit lines BL1, BL2, BL3, BL4 are set to erase potential (for example, +18V) Vera.

ON potential Vsg is, for example, a potential to transfer erase potential Vera to channels of all nonvolatile memory devices.

Thus, a high voltage is applied between channels (erase potential Vera) and word lines WL1 to WL4 (earth potential Vss) in all nonvolatile memory devices. Therefore, regardless of the threshold voltage of each nonvolatile memory device, all nonvolatile memory devices change to the erase state ("1" state) of low threshold voltage (low-Vth).

In such an erase operation, select gate transistors ST11, SdT21, ST31, ST41 in all cell units CELL1, CELL2, ... are in an OFF state due to Voff applied to select gate line SGS.

Therefore, erase potential (for example, +18V) Vera will not be transferred to the gate electrodes of path transistors PT1, PT2.

Accordingly, path transistors PT1, PT2 can be prevented from being damaged by a high bias during erase operation.

Instead of the above erase operation, for example, an erase operation can also be performed by setting all word lines WL1 to WL4 to erase potential (for example, −18V) Vera and all bit lines BL1, BL2, BL3, BL4 to earth potential Vss.

3. Read Operation

A read operation is performed by, for example, transferring a context (bits) from memory pairs connected to one selected word line to path transistors PT1, PT2, . . . . It is assumed here that the selected word line is WL3.

It is also assumed that regarding memory pair Pair1 inside cell unit CELL1, nonvolatile memory device MC13 has the erase state ("1" state) with low threshold voltage (low-Vth) and nonvolatile memory device MC23 has the write state ("0" state) with high threshold voltage (high-Vth).

It is also assumed that regarding memory pair Pair2 inside cell unit CELL2, nonvolatile memory device MC33 has the write state ("0" state) with high threshold voltage (high-Vth) and nonvolatile memory device MC43 has the erase state ("1" state) with low threshold voltage (low-Vth).

(1) Vsg (for example, +4V) is given to the select gate line SGD, SGS into On state. At this point, select gate transistors connected to select gate lines SGD, SGS are turned on.

(2) Non-selection word lines WL1, WL2, WL4 are set to transfer potential Vpass. Transfer potential Vpass is a potential that turns on a nonvolatile memory device regardless of the threshold voltage (low-Vth/high-Vth) of the nonvolatile memory device. Thus, all non-selection nonvolatile memory devices connected to non-selection word lines WL1, WL2, WL4 are turned on.

(3) Selected word line WL3 is set to read potential Vread. Vread has a value larger than the threshold voltage (low-Vth) of the erase state and smaller than the threshold voltage (high-Vth) of the write state.

Therefore, in cell unit CELL1, nonvolatile memory device M13 is turned on and nonvolatile memory device M23 is turned off. Also in cell unit CELL2, nonvolatile memory device M33 is turned off and nonvolatile memory device M43 is turned on.

(4) A first potential (for example, earth potential Vss) is applied to odd-numbered bit lines BL1, BL3 and second potential (for example, power supply potential Vdd) Vbl is applied to even-numbered bit lines BL2, BL4.

As a result, the first potential is transferred to common node CN1 connected to cell unit CELL1 from bit line BL1. Thus, if the first potential is earth potential Vss, common node CN1 is set to earth potential Vss and the path transistor (n-channel FET) is turned off.

Thus, input signal IN1 will not be output as output signal OUT.

On the other hand, the second potential is transferred to common node CN2 connected to cell unit CELL2 from bit line BL4. Thus, if the second potential is power supply potential Vdd, common node CN2 is set to power supply potential Vdd and the path transistor (n-channel FET) is turned on.

Thus, input signal IN2 will be output as output signal OUT.

In this embodiment, the odd-numbered bit lines may change to the even numbered bit line, and the even-numbered bit lines may change to the odd numbered bit line.

Fourth Embodiment

FIGS. 19 and 20 show the fourth embodiment of the device structure.

Path transistors PT1, PT2 are switches to decide a connecting relationship of logic elements to selectively realize one of multiple pieces of logic.

Path transistors PT1, PT2 are, for example, FETs and are arranged on a semiconductor substrate (for example, a silicon substrate). Path transistors PT1, PT2 have channels to be signal paths and gate electrodes G1, G2 to control ON/OFF thereof.

Conductive layers are stacked immediately above path transistors PT1, PT2. These conductive layers may be, for example, a semiconductor (such as conductive polysilicon) or a metal (including alloys such as silicide).

Buffer layers 32-1, 32-2 connected to gate electrodes G1, G2 of path transistors PT1, PT2 become the bottom layer. Select gate lines SGS1, SGS2 are arranged on buffer layers 32-1, 32-2. Select gate lines SGS1, SGS2 are independent of each other.

Select gate lines SGD1, SGD2 form the top layer. Select gate lines SGD1, SGD2 are also independent of each other.

Four remaining conductive layers between two select gate lines SGS1, SGD1 are word lines WL11, WL12, WL13, WL14. It is assumed here that the lowest word line is set as WL11 and the number i (i=1, 2, 3, 4) of word line WL1i increases toward upward.

Similarly, four remaining conductive layers between two select gate lines SGS2, SGD2 are word lines WL21, WL22, WL23, WL24. Word lines WL11, WL12, WL13, WL14 and word lines WL21, WL22, WL23, WL24 are independent of one another.

Select gate lines SGS1, SGS2, SGD1, SGD2 and word lines WL11, WL12, WL13, WL14, WL21, WL22, WL23, WL24 extend, for example, in the Y direction.

First pillar (for example, a silicon pillar) 30-1 passes through word lines WL11, WL12, WL13, WL14 and select gate lines SGS1, SGD1 to be connected to buffer layer 32-1.

Second pillar (for example, a silicon pillar) 30-2 passes through word lines WL21, WL22, WL23, WL24 and select gate lines SGS2, SGD2 to be connected to buffer layer 32-1.

The shape of first and second pillars 30-1, 30-2 is not specifically limited and may be, for example, a cylindrical shape. First and second pillars 30-1, 30-2 may have a structure in which an insulating pillar (for example, SiN) as a core is covered with a semiconductor layer (for example, Si) to be a channel.

First bit line BL1 is connected to the top end of first pillar 30-1 and second bit line BL2 is connected to the top end of second pillar 30-2. First and second bit lines BL1, BL2 include, for example, a metal or alloy (including silicide).

Similarly, third pillar (for example, a silicon pillar) 30-3 passes through word lines WL11, WL12, WL13, WL14 and select gate lines SGS1, SGD1 to be connected to buffer layer 32-2.

Fourth pillar (for example, a silicon pillar) 30-4 passes through word lines WL21, WL22, WL23, WL24 and select gate lines SGS2, SGD2 to be connected to buffer layer 32-2.

The shape of third and fourth pillars 30-3, 30-4 is also not specifically limited and may be, for example, a cylindrical shape. Third and fourth pillars 30-3, 30-4 may have a structure in which an insulating pillar (for example, SiN) as a core is covered with a semiconductor layer (for example, Si) to be a channel.

Third bit line BL3 is connected to the top end of third pillar 30-3 and fourth bit line BL4 is connected to the top end of fourth pillar 30-4. Third and fourth bit lines BL3, BL4 include, for example, a metal or alloy (including silicide).

First to fourth bit lines BL1 to BL4 extend, for example, in the X direction.

The basic unit includes first and second memory strings MS1, MS2.

First memory string MS1 includes nonvolatile memory devices MC11, MC12, MC13, MC14 and select gate transistors ST11, ST12 connected in series by first pillar 30-1 as a channel.

Nonvolatile memory devices MC11, MC12, MC13, MC14 are arranged between first pillar 30-1 and word lines WL11, WL12 WL13, WL14 respectively.

Select gate transistor ST11 is arranged between first pillar 30-1 and select gate line SGS1. Select gate transistor ST12 is arranged between first pillar 30-1 and select gate line SGD1.

The structure of nonvolatile memory devices MC11, MC12, MC13, MC14 is the same as that in the first embodiment described above. For example, as shown in FIG. 3, nonvolatile memory devices MC11, MC12, MC13, MC14 include gate insulating layer (tunnel insulating layer) 21, charge storage layer 22, and inter-electrode insulating layer (block insulating layer) 23 on the surface of first pillar 30-1.

The structure of select gate transistors ST11, ST12 is also the same as that in the first embodiment described above. For example, as shown in FIG. 3, select gate transistor ST12 has a different structure from that of nonvolatile memory device MC11, MC12, MC13, MC14. That is, select gate transistor ST12 has only gate insulating layer (tunnel insulating layer) 24 between first pillar 30-1 and select gate line SGD.

In contrast, select gate transistor ST11 has the same structure as that of nonvolatile memory devices MC11, MC12, MC13, MC14. That is, select gate transistor ST11 includes gate insulating layer (tunnel insulating layer) 21, charge storage layer 22, and inter-electrode insulating layer (block insulating layer) 23 on the surface of first pillar 30-1.

Second memory string MS2 includes nonvolatile memory devices MC21, MC22, MC23, MC24 and select gate transistors ST21, ST22 connected in series by second pillar 30-2 as a channel.

Nonvolatile memory devices MC21, MC22, MC23, MC24 are arranged between second pillar 30-2 and word lines WL21, WL22 WL23, WL24 respectively.

Select gate transistor ST21 is arranged between second pillar 30-2 and select gate line SGS2. Select gate transistor ST22 is arranged between second pillar 30-2 and select gate line SGD2.

The structures of nonvolatile memory devices MC21, MC22, MC23, MC24 and select gate transistors ST21, ST22 are the same as those in the first embodiment (FIG. 3) described above and thus, the description thereof here is omitted.

In the structure as described above, for example, the first context is written into the first memory pair (nonvolatile memory devices MC11, MC21) as complementary data. Similarly, the second context is written into the second memory pair (nonvolatile memory devices MC12, MC22) as complementary data.

Thus, if a device structure according to the fourth embodiment is used, the schematic can faithfully be realized as the device structure (programmable logic switch) and thus, a contribution can be made to realization of a multi-context reconfigurable logic circuit.

Incidentally, the first and second modifications in the first embodiment can also be applied to the fourth embodiment. The above structure in the second and third embodiments regarding the connection method of first to fourth pillars 30-1 to 30-4 and gate electrodes G1, G2 of path transistors PT1, PT2 may be adopted in the fourth embodiment.

Basic Operation

The basic operation (read/write/erase) of a basic unit (programmable logic switch) according to the fourth embodiment is described.

The description that follows is based on the equivalent circuit shown in FIG. 20.

It is assumed in the description of the basic operation that prerequisites for memory cells, select gate transistors, path transistors, write/erase states, and initial state are the same as those in the description of the basic operation in the first embodiment.

In the description of the basic operation below, the nonvolatile memory device to be read/written into/erased is called a selection cell and other nonvolatile memory devices are called non-selection cells.

TABLE 2

| | Write | | Read | Erase | |
|---|---|---|---|---|---|
| | $MC_{j3} \to $ "0" $MC_{(j+1)3} \to $ "1" | $MC_{(j+1)3} \to $ "0" $MC_{j3} \to $ "1" | (FPGA operation) | ALL cells $\to$ "1" | Remarks |
| Odd-numbered data line $BL_j$ | Vss | Vdd (Vinhibit) | Vss/Vbl | Vera | Configuration of potential of every data lines is possible |
| Even-numbered data line $BL_{(j+1)}$ | Vdd (Vinhibit) | Vss | Vbl/Vss | Vera | Configuration of potential of every data lines is possible |
| SGD1, SGD2 | Vsg | Vsg | Vsg | Vsg | — |
| WL24 | Vpass | Vpass | Vpass | Vss | — |
| WL23 | Vprg | Vprg | Vread | Vss | — |
| WL22 | Vpass | Vpass | Vpass | Vss | — |
| WL21 | Vpass | Vpass | Vpass | Vss | — |
| WL14 | Vpass | Vpass | Vpass | Vss | — |
| WL13 | Vprg | Vprg | Vread | Vss | — |
| WL12 | Vpass | Vpass | Vpass | Vss | — |
| WL11 | Vpass | Vpass | Vpass | Vss | — |
| SCS1, SGS2 | Voff | Voff | Vsg | Voff | — |
| $CN_j$ | — | — | Vss/Vbl | — | — |

1. Write Operation

In the initial state (state in which no context is written) before a write operation, all nonvolatile memory devices in all cell units CELL1, CELL2, . . . are in the erase state ("1" state) of a low threshold voltage (low-Vth).

Then, for example, a write operation is performed in units of nonvolatile memory devices connected to one word line from nonvolatile memory devices on the source side (common nodes CN1, CN2 side) toward nonvolatile memory devices on the drain side (bit lines BL1 to BL4 side).

Here, a case when a write operation into selection cells MC13, MC23, MC33, MC43 connected to selected word lines WL13, WL23 is performed simultaneously will be described.

It is assumed that regarding a memory pair constituted of selection cells MC13, MC23, data "0" is written into selection cell MC13 (erase state→write state) and data "1" is written into selection cell MC23 (write protection).

It is also assumed that regarding a memory pair constituted of selection cells MC33, MC43, data "1" is written into selection cell MC33 (write protection) and data "0" is written into selection cell MC43 (erase state→write state).

In this case, as shown in Table 2

(1) Bit line BL1 is set to a "0" write potential, for example, earth potential Vss and bit line BL2 is set to write protection potential ("1" write potential) Vinhibit, for example, power supply potential (for example, +8V) Vdd.

(2) Bit line BL3 is set to write protection potential ("1" write potential) Vinhibit, for example, power supply potential Vdd and bit line BL4 is set to a "0" write potential, for example, earth potential Vss.

(3) Select gate lines SGD1, SGD2 are set to ON potential (for example, +4V) Vsg and select gate lines SGS1, SGS2 are set to OFF potential (for example, 0V) Voff.

A write voltage Vprg (for example, +18V) is applied to selection word line WL3, WL23 connected to selection cells MC13, MC23, MC33, and MC43. The transfer voltage (for example, +10V) Vpass is applied to the non-selection word lines WL11, WL12, WL14, WL21, WL22 and WL24.

Transfer potential Vpass and ON potential Vsg are potentials that transfer the "0" write potential and the "1" write potential to channels of selection cells MC13, MC23, MC33, MC43 in memory strings MS1 to MS4 respectively.

Therefore, when write voltage Vprg is applied to selection word lines WL13, WL23, selection cells MC13, MC43 to whose channels the "0" write voltage is applied change from the erase state ("1" state) of low threshold voltage (low-Vth) to the write state ("0" state) of high threshold voltage (high-Vth).

In contrast, when write voltage Vprg is applied to selection word lines WL13, WL23, select gate transistors ST22, ST32 in memory strings MS2, MS3 are cut off so that the channel potential is boosted in selection cells MC23, MC33 to whose channels the "1" write potential is applied.

Thus, the erase state ("1" state) of low threshold voltage (low-Vth) is maintained in selection cells MC23, MC33.

In such a write operation, select gate transistors ST11, ST21, ST31, ST41 in all cell units CELL1, CELL2, ... are in an OFF state due to Voff applied to select gate lines SGS1, SGS2 and thus, "1" write potential (for example, +8V) Vinhibit will not be transferred to gate electrodes of path transistors PT1, PT2.

Accordingly, path transistors PT1, PT2 can be prevented from being damaged by a high bias during write operation.

2. Erase Operation

In the present example, one block is configured cell unit CELL1 making word lines WL11 to WL14 common and similarly, one block is configured cell unit CELL2 making word lines WL21 to WL24 common.

When a configuration memory is configured by blocks, an erase operation can be performed in blocks (block erasure) or an erase operation of all blocks can be performed simultaneously (chip erasure).

A case when an erase operation of all blocks is performed will be described below.

(1) All word lines WL11 to WL14, WL21 to WL24 are set to earth potential Vss. Select gate lines SGD1, SGD2 are set to ON potential (for example, +4V) Vsg and select gate lines SGS1, SGS2 are set to OFF potential (for example, 0V) Voff.

(2) All bit lines BL1, BL2, BL3, BL4 are set to erase potential (for example, +18V) Vera.

ON potential Vsg is, for example, a potential to transfer erase potential Vera to channels of all nonvolatile memory devices.

Thus, a high voltage is applied between channels (erase potential Vera) and word lines WL11 to WL14, WL21 to WL24 (earth potential Vss) in all nonvolatile memory devices. Therefore, regardless of the threshold voltage of each nonvolatile memory device, all nonvolatile memory devices change to the erase state ("1" state) of low threshold voltage (low-Vth).

In such an erase operation, select gate transistors ST11, ST21, ST31, ST41 in all cell units CELL1, CELL2, ... are in an OFF state due to Voff applied to select gate lines SGS1, SGS2.

Therefore, erase potential (for example, +18V) Vera will not be transferred to the gate electrodes of path transistors PT1, PT2.

Accordingly, path transistors PT1, PT2 can be prevented from being damaged by a high bias during erase operation.

Instead of the above erase operation, for example, an erase operation can also be performed by setting all word lines WL11 to WL14, WL21 to WL24 to erase potential (for example, −18V) Vera and all bit lines BL1, BL2, BL3, BL4 to earth potential Vss.

3. Read Operation

A read operation is performed by, for example, transferring a context (bits) from memory pairs connected to one selected word line to path transistors PT1, PT2, . . . . It is assumed here that the selected word lines are WL13 and WL23.

It is also assumed that regarding memory pair Pair1 inside cell unit CELL1, nonvolatile memory device MC13 has the erase state ("1" state) with low threshold voltage (low-Vth) and nonvolatile memory device MC23 has the write state ("0" state) with high threshold voltage (high-Vth).

It is also assumed that regarding memory pair Pair2 inside cell unit CELL2, nonvolatile memory device MC33 has the write state ("0" state) with high threshold voltage (high-Vth) and nonvolatile memory device MC43 has the erase state ("1" state) with low threshold voltage (low-Vth).

(1) Vsg (for example, +4V) is given to the select gate line SGD1, SGD2, SGS1, SGS2 into On state. At this point, select gate transistors ST11, ST12, ST21, ST22 are turned on.

(2) Non-selection word lines WL11, WL12, WL14, WL21, WL22, WL24 are set to transfer potential Vpass. Transfer potential Vpass is a potential that turns on a nonvolatile memory device regardless of the threshold voltage (low-Vth/high-Vth) of the nonvolatile memory device. Thus, all non-selection nonvolatile memory devices connected to non-selection word lines WL11, WL12, WL14, WL21, WL22, WL24 are turned on.

(3) Selected word lines WL13, WL23 are set to read potential Vread. Vread has a value larger than the threshold voltage (low-Vth) of the erase state and smaller than the threshold voltage (high-Vth) of the write state.

Therefore, in cell unit CELL1, nonvolatile memory device M13 is turned on and nonvolatile memory device M23 is turned off. Also in cell unit CELL2, nonvolatile memory device M33 is turned off and nonvolatile memory device M43 is turned on.

(4) A first potential (for example, earth potential Vss) is applied to odd-numbered bit lines BL1, BL3 and second potential (for example, power supply potential Vdd) Vbl is applied to even-numbered bit lines BL2, BL4.

As a result, the first potential is transferred to common node CN1 connected to cell unit CELL1 from bit line BL1. Thus, if the first potential is earth potential Vss, common node CN1 is set to earth potential Vss and the path transistor (n-channel FET) is turned off.

Thus, input signal IN1 will not be output as output signal OUT.

On the other hand, the second potential is transferred to common node CN2 connected to cell unit CELL2 from bit line BL4. Thus, if the second potential is power supply potential Vdd, common node CN2 is set to power supply potential Vdd and the path transistor (n-channel FET) is turned on.

Thus, input signal IN2 will be output as output signal OUT.

Fifth Embodiment

Figure 22:
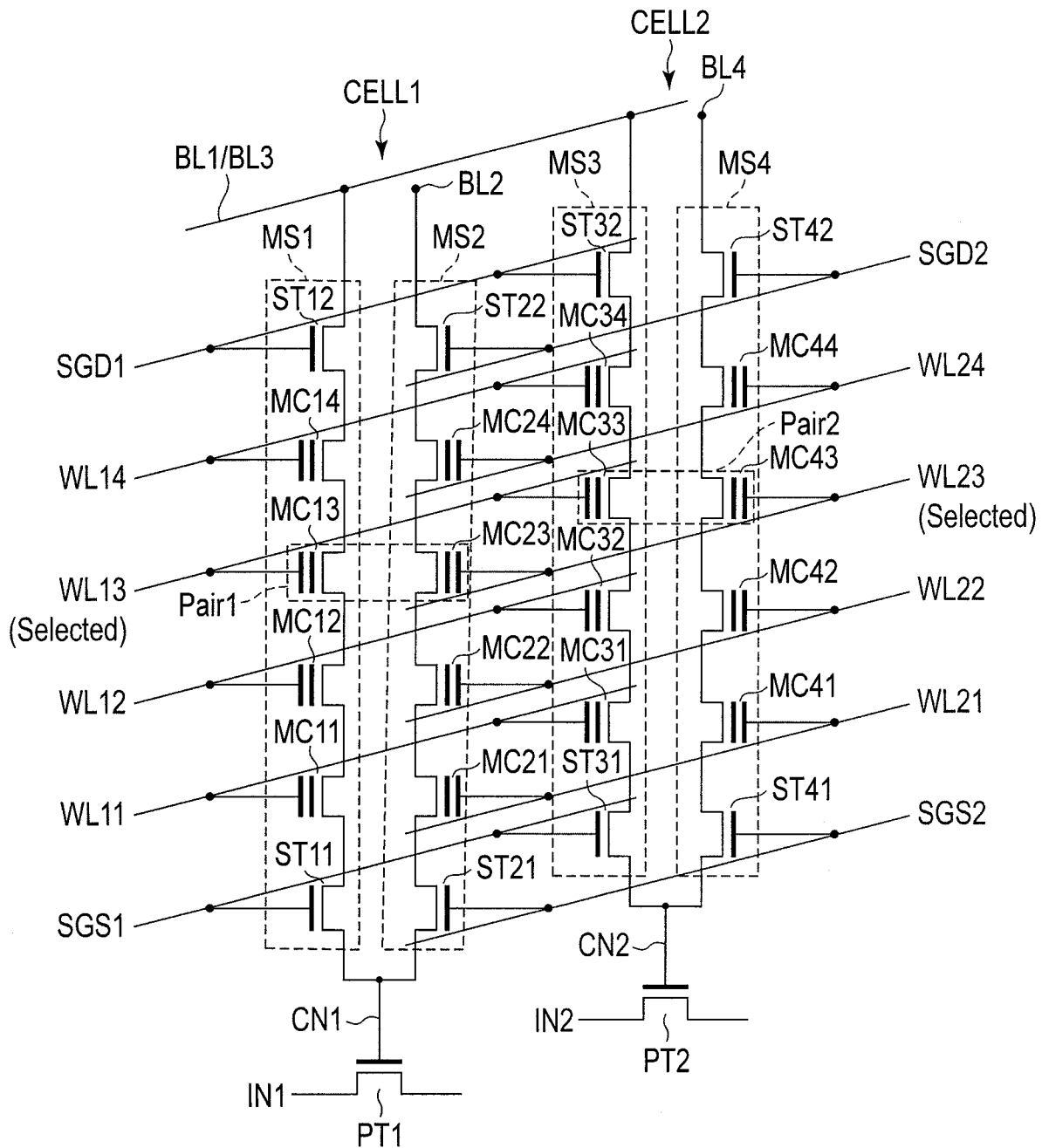
FIG. 22 is a circuit diagram showing the equivalent circuit of the device structure according to the fifth embodiment.

FIGS. 21 and 22 show the fifth embodiment of the device structure.

In the description that follows, the same reference numerals are attached to the same elements as those of a device structure according to the fourth embodiment and thereby, the description thereof is omitted.

The fifth embodiment is different from the fourth embodiment in that common bit lines BL1/BL3 are connected in common to top ends of first and third pillars 30-1, 30-3. Otherwise, the fifth embodiment is the same as the fourth embodiment.

Incidentally, the first and second modifications in the first embodiment can also be applied to the fifth embodiment. The above structure in the second and third embodiments regarding the connection method of first to fourth pillars 30-1 to 30-4 and gate electrodes G1, G2 of path transistors PT1, PT2 may be adopted in the fifth embodiment.

Basic Operation

The basic operation (read/write/erase) of a basic unit (programmable logic switch) according to the fifth embodiment will be described.

The description that follows is based on the equivalent circuit shown in FIG. 22.

It is assumed in the description of the basic operation that prerequisites for memory cells, select gate transistors, path transistors, write/erase states, and initial state are the same as those in the description of the basic operation in the first embodiment.

In the description of the basic operation below, the nonvolatile memory device to be read/written into/erased is called a selection cell and other nonvolatile memory devices are called non-selection cells.

1. Write Operation

In the initial state (state in which no context is written) before a write operation, all nonvolatile memory devices in all cell units CELL1, CELL2, ... are in the erase state ("1" state) of a low threshold voltage (low-Vth).

Then, for example, a write operation is performed in units of nonvolatile memory devices connected to one word line from nonvolatile memory devices on the source side (common nodes CN1, CN2 side) toward nonvolatile memory devices on the drain side (bit lines BL1 to BL4 side).

Here, a case when a write operation into selection cells MC13, MC23, MC33, MC43 connected to selected word lines WL13, WL23 is performed simultaneously will be described.

In the present example, odd-numbered bit lines BL1/BL3 are common.

Thus, a bit of contrivance is needed to cause one memory pair to selectively store a context (bit).

Here, data "0" is written into all memory cells MC11 to MC14, MC31 to MC34 in odd-numbered memory strings MS1, MS3 connected to common bit lines BL1/BL3 (erase state→write state).

Also, data "0" (erase state→write state) or data "1" (write protection) in accordance with context is written into memory cells MC21 to MC24, MC41 to MC44 in even-numbered memory strings MS2, MS4 connected to even-numbered bit lines BL2, BL4.

In the description that follows, it is assumed that regarding a memory pair constituted of selection cells MC13, MC23, data "0" is written into selection cell MC13 (erase state→write state) and data "1" is written into selection cell MC23 (write protection).

It is also assumed that regarding a memory pair constituted of selection cells MC33, MC43, data "0" is written into selection cell MC33 (erase state→write state) and data "0" is written into selection cell MC43 (erase state→write state).

In this case, as shown in Table 3

(1) Common bit lines BL1/BL3 are set to a "0" write potential, for example, earth potential Vss, bit line BL2 is set to write protection potential ("1" write potential) Vinhibit, for example, power supply potential (for example, +8V) Vdd, and bit line BL2 is set to a "0" write potential, for example, earth potential Vss, regardless of write data (context).

TABLE 3

| | Write | | Read | Erase | |
| --- | --- | --- | --- | --- | --- |
| | $MC_{j3}$→"0" $MC_{(j+1)3}$→"1" | $MC_{j3}$→"0" $MC_{(j+1)3}$→"1" | (FPGA operation) | ALL cells→"1" | Remarks |
| Common data line BL1/BL3 | Vss | Vss | Vss | Vera | — |
| Data line BL2, BL4 | Vdd (Vinhibit) | Vss | Vbl | Vera | Configuration of potential of every data lines is possible |
| SGD1, SGD2 | Vsg | Vsg | Vsg | Vsg | — |
| WL24 | Vpass | Vpass | Vpass | Vss | — |
| WL23 | Vprg | Vprg | Vread | Vss | — |
| WL22 | Vpass | Vpass | Vpass | Vss | — |
| WL21 | Vpass | Vpass | Vpass | Vss | — |
| WL14 | Vpass | Vpass | Vpass | Vss | — |
| WL13 | Vprg | Vprg | Vread | Vss | — |
| WL12 | Vpass | Vpass | Vpass | Vss | — |
| WL11 | Vpass | Vpass | Vpass | Vss | — |
| SCS1, SGS2 | Voff | Voff | Vsg | Voff | — |
| $CN_j$ | — | — | Vss (floating)/Vbl | — | — |

(2) Select gate lines SGD1, SGD2 are set to ON potential (for example, +4V) Vsg and select gate lines SGS1, SGS2 are set to OFF potential (for example, 0V) Voff.

Selection word lines WL13, WL23 connected to selection cells MC13, MC23, MC33, MC43 are set to write potential (for example, +18V) Vprg. Other non-selection word lines WL11, WL12, WL14, WL21, WL22, WL24 are set to transfer potential (for example, +10V) Vpass.

Transfer potential Vpass and ON potential Vsg are potentials that transfer the "0" write potential and the "1" write potential to channels of selection cells MC13, MC23, MC33, MC43 in memory strings MS1 to MS4 respectively.

Therefore, when write potential Vprg is applied to selection word lines WL13, WL23, selection cells MC13, MC33, MC43 to whose channels the "0" write potential is applied change from the erase state ("1" state) of low threshold voltage (low-Vth) to the write state ("0" state) of high threshold voltage (high-Vth).

In contrast, when write potential Vprg is applied to selection word lines WL13, WL23, select gate transistors ST22, ST42 in memory strings MS2, MS3 are cut off so that the channel potential is boosted in selection cell MC23 to whose channel the "1" write potential is applied.

Thus, the erase state ("1" state) of low threshold voltage (low-Vth) is maintained in selection cell MC23.

In such a write operation, select gate transistors ST11, ST21, ST31, ST41 in all cell units CELL1, CELL2, . . . are in an OFF state due to Voff applied to select gate lines SGS1, SGS2 and thus, "1" write potential (for example, +8V) Vinhibit will not be transferred to gate electrodes of path transistors PT1, PT2.

Accordingly, path transistors PT1, PT2 can be prevented from being damaged by a high bias during write operation.

2. Erase Operation

In the present example, one block is configured cell unit CELL1 making word lines WL11 to WL14 common and similarly, one block is configured cell unit CELL2 making word lines WL21 to WL24 common.

When a configuration memory is configured by blocks, an erase operation can be performed in blocks (block erasure) or an erase operation of all blocks can be performed simultaneously (chip erasure).

A case when an erase operation of all blocks is performed will be described below.

(1) All word lines WL11 to WL14, WL21 to WL24 are set to earth potential Vss. Select gate lines SGD1, SGD2 are set to ON potential (for example, +4V) Vsg and select gate lines SGS1, SGS2 are set to OFF potential (for example, 0V) Voff.

(2) Common bit lines BL1/BL3 and all bit lines BL2, BL4 are set to erase potential (for example, +18V) Vera.

ON potential Vsg is, for example, a potential to transfer erase potential Vera to channels of all nonvolatile memory devices.

Thus, a high voltage is applied between channels (erase potential Vera) and word lines WL11 to WL14, WL21 to WL24 (earth potential Vss) in all nonvolatile memory devices. Therefore, regardless of the threshold voltage of each nonvolatile memory device, all nonvolatile memory devices change to the erase state ("1" state) of low threshold voltage (low-Vth).

In such an erase operation, select gate transistors ST11, ST21, ST31, ST41 in all cell units CELL1, CELL2, . . . are in an OFF state due to Voff applied to select gate lines SGS1, SGS2.

Therefore, erase potential (for example, +18V) Vera isn't transferred to the gate electrodes of path transistors PT1, PT2.

Accordingly, path transistors PT1, PT2 can be prevented from being damaged by a high bias during erase operation.

Instead of the above erase operation, for example, an erase operation can also be performed by setting all word lines WL11 to WL14, WL21 to WL24 to erase potential (for example, −18V) Vera and common bit lines BL1/BL3 and all bit lines BL2, BL4 to earth potential Vss.

3. Read Operation

A read operation is performed by, for example, transferring a context (bits) from memory pairs connected to one selected word line to path transistors PT1, PT2, . . . . It is assumed here that the selected word lines are WL13 and WL23.

It is also assumed that regarding memory pair Pair1 inside cell unit CELL1, nonvolatile memory device MC13 has the write state ("0" state) with high threshold voltage (high-Vth) and nonvolatile memory device MC23 has the erase state ("1" state) with low threshold voltage (low-Vth).

It is also assumed that regarding memory pair Pair2 inside cell unit CELL2, nonvolatile memory device MC33 has the write state ("0" state) with high threshold voltage (high-Vth) and nonvolatile memory device MC43 also has the erase state ("0" state) with high threshold voltage (high-Vth).

(1) Vsg (for example, +4V) is given to the select gate line SGD1, SGD2, SGS1, SGS2 into on state. At this point, select gate transistors ST11, ST12, ST21, ST22 are turned on.

(2) Non-selection word lines WL11, WL12, WL14, WL21, WL22, WL24 are set to transfer potential Vpass. Transfer potential Vpass is a potential that turns on a nonvolatile memory device regardless of the threshold voltage (low-Vth/high-Vth) of the nonvolatile memory device. Thus, all non-selection nonvolatile memory devices connected to non-selection word lines WL11, WL12, WL14, WL21, WL22, WL24 are turned on.

(3) Selected word lines WL13, WL23 are set to read potential Vread. Vread has a value larger than the threshold voltage (low-Vth) of the erase state and smaller than the threshold voltage (high-Vth) of the write state.

Therefore, in cell unit CELL1, nonvolatile memory device M13 is turned off and nonvolatile memory device M23 is turned on. Also in cell unit CELL2, nonvolatile memory devices M33, M43 are both turned off.

(4) A first potential (for example, earth potential Vss) is applied to common bit lines BL1/BL3, that is, odd-numbered bit lines and second potential (for example, power supply potential Vdd) Vbl is applied to even-numbered bit lines BL2, BL4.

As a result, the second potential is transferred to common node CN1 connected to cell unit CELL1 from bit line BL2. Thus, if the second potential is power supply potential Vdd, common node CN1 is set to power supply potential Vdd and the path transistor (n-channel FET) is turned on.

Thus, input signal IN1 will be output as output signal OUT.

On the other hand, common node CN2 connected to cell unit CELL2 is disconnected from both common bit lines BL1/BL3 and bit line BL4. Thus, if, for example, common node CN2 is set to a floating state after being precharged to earth potential Vss in advance, common node CN2 remains at earth potential (floating state) Vss and path transistor (n-channel FET) is turned off.

Thus, input signal IN2 will not be output as output signal OUT.

Also regarding common node CN1, for example, common node CN1 is precharged to earth potential (floating state) Vss in advance. In this case, when, as described above, power supply potential Vdd as the second potential comes by being transferred, common node CN1 is set to power supply potential Vdd and path transistor (n-channel FET) is turned on.

Sixth Embodiment

Figure 24:
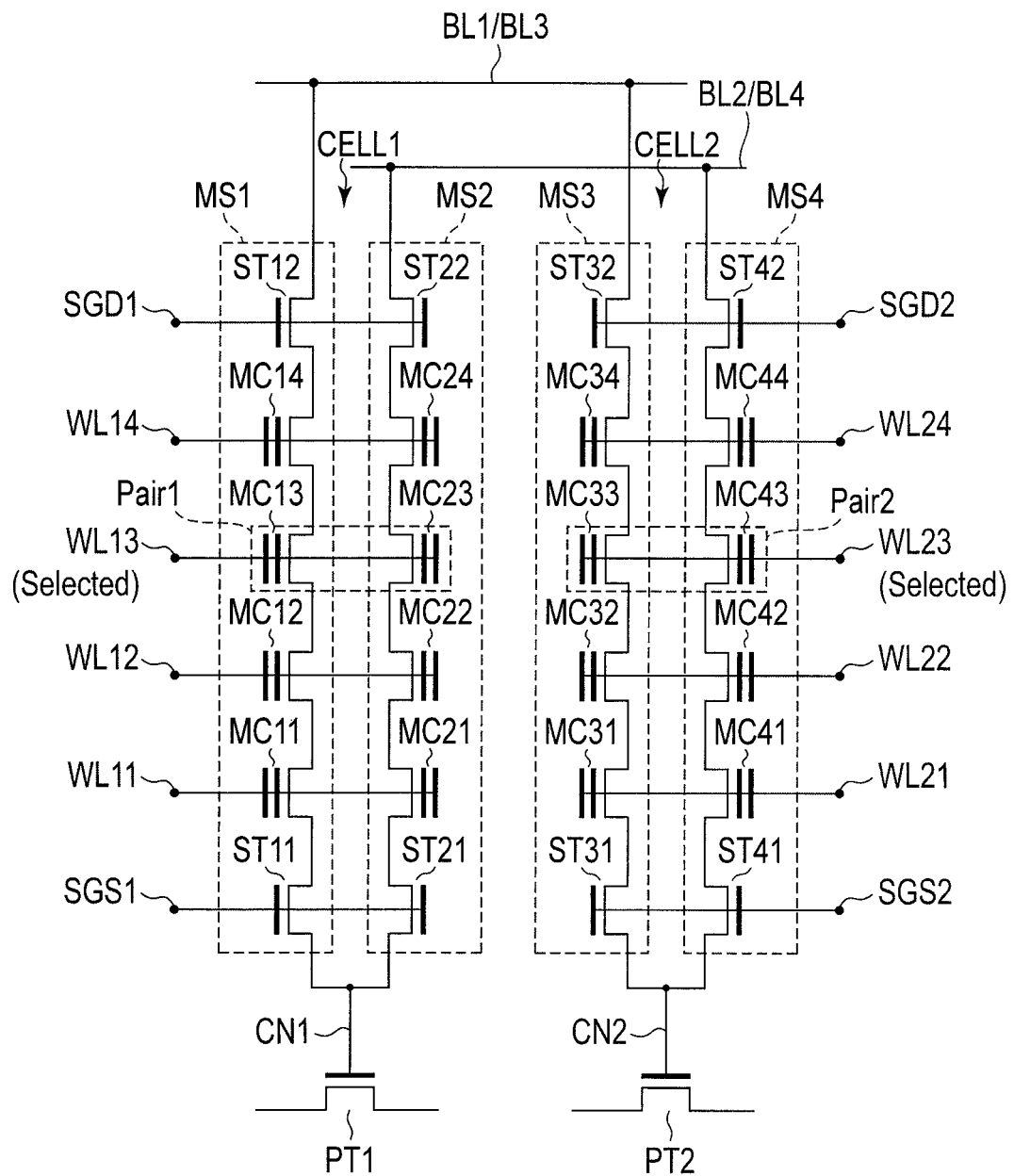
FIG. 24 is a circuit diagram showing the equivalent circuit of the device structure according to the sixth embodiment.

FIGS. 23 and 24 show the sixth embodiment of the device structure.

Path transistors PT1, PT2 are switches to decide a connecting relationship of logic elements to selectively realize one of multiple pieces of logic.

Path transistors PT1, PT2 are, for example, FETs and are arranged on a semiconductor substrate (for example, a silicon substrate). Path transistors PT1, PT2 have channels to be signal paths and gate electrodes G1, G2 to control ON/OFF thereof.

Seven conductive layers are stacked immediately above path transistors PT1, PT2. These conductive layers may be, for example, a semiconductor (such as conductive polysilicon) or a metal (including alloys such as silicide).

Buffer layers 32-1, 32-2 connected to gate electrodes G1, G2 of path transistors PT1, PT2 become the bottom layer. Select gate line SGS1 is arranged on buffer layer 32-1 and select gate line SGS2 is arranged on buffer layer 32-2. Select gate lines SGS1, SGS2 are independent of each other.

Select gate lines SGD1, SGD2 form the top layer. Select gate lines SGD1, SGD2 are also independent of each other.

Four remaining conductive layers between two select gate lines SGS1, SGD1 are word lines WL11, WL12, WL13, WL14. It is assumed here that the lowest word line is set as WL11 and the number i (i=1, 2, 3, 4) of word line WL1$i$ increases toward upward.

Similarly, four remaining conductive layers between two select gate lines SGS2, SGD2 are word lines WL21, WL22, WL23, WL24. Word lines WL11, WL12, WL13, WL14 and word lines WL21, WL22, WL23, WL24 are independent of one another.

Select gate lines SGS1, SGS2, SGD1, SGD2 and word lines WL11, WL12, WL13, WL14, WL21, WL22, WL23, WL24 extend, for example, in the X direction.

First and second pillars (for example, silicon pillars) 30-1, 30-2 pass through word lines WL11, WL12, WL13, WL14 and select gate lines SGS1, SGD1 to be connected in common to buffer layer 32-1.

The shape of first and second pillars 30-1, 30-2 is not specifically limited and may be, for example, a cylindrical shape. First and second pillars 30-1, 30-2 may have a structure in which an insulating pillar (for example, SiN) as a core is covered with a semiconductor layer (for example, Si) to be a channel.

Common bit lines BL1/BL3 are connected to the top end of first pillar 30-1 and common bit lines BL2/BL4 are connected to the top end of second pillar 30-2. Common bit lines BL1/BL3 and common bit lines BL2/BL4 include, for example, a metal or alloy (including silicide).

Similarly, third and fourth pillars (for example, silicon pillars) 30-3, 30-4 pass through word lines WL21, WL22, WL23, WL24 and select gate lines SGS2, SGD2 to be connected in common to buffer layer 32-2.

The shape of third and fourth pillars 30-3, 30-4 is also not specifically limited and may be, for example, a cylindrical shape. Third and fourth pillars 30-3, 30-4 may have a structure in which an insulating pillar (for example, SiN) as a core is covered with a semiconductor layer (for example, Si) to be a channel.

Common bit lines BL1/BL3 are connected to the top end of third pillar 30-3 and common bit lines BL2/BL4 are connected to the top end of fourth pillar 30-4.

Common bit lines BL1/BL3 extend, for example, in the Y direction and common bit lines BL2/BL4 extend, for example, in the Y direction.

The basic unit includes first and second memory strings MS1, MS2.

First memory string MS1 includes nonvolatile memory devices MC11, MC12, MC13, MC14 and select gate transistors ST11, ST12 connected in series by first pillar 30-1 as a channel.

Nonvolatile memory devices MC11, MC12, MC13, MC14 are arranged between first pillar 30-1 and word lines WL11, WL12 WL13, WL14 respectively.

Select gate transistor ST11 is arranged between first pillar 30-1 and select gate line SGS1. Select gate transistor ST12 is arranged between first pillar 30-1 and select gate line SGD1.

The structure of nonvolatile memory devices MC11, MC12, MC13, MC14 is the same as that in the first embodiment described above. For example, as shown in FIG. 3, nonvolatile memory devices MC11, MC12, MC13, MC14 include gate insulating layer (tunnel insulating layer) 21, charge storage layer 22, and inter-electrode insulating layer (block insulating layer) 23 on the surface of first pillar 30-1.

The structure of select gate transistors ST11, ST12 is also the same as that in the first embodiment described above. For example, as shown in FIG. 3, select gate transistor ST12 has a different structure from that of nonvolatile memory devices MC11, MC12, MC13, MC14. That is, select gate transistor ST12 has only gate insulating layer (tunnel insulating layer) 24 between first pillar 30-1 and select gate line SGD.

In contrast, select gate transistor ST11 has the same structure as that of nonvolatile memory devices MC11, MC12, MC13, MC14. That is, select gate transistor ST11 includes gate insulating layer (tunnel insulating layer) 21, charge storage layer 22, and inter-electrode insulating layer (block insulating layer) 23 on the surface of first pillar 30-1.

Second memory string MS2 includes nonvolatile memory devices MC21, MC22, MC23, MC24 and select gate transistors ST21, ST22 connected in series by second pillar 30-2 as a channel.

Nonvolatile memory devices MC21, MC22, MC23, MC24 are arranged between second pillar 30-2 and word lines WL11, WL12 WL13, WL14 respectively.

Select gate transistor ST21 is arranged between second pillar 30-2 and select gate line SGS2. Select gate transistor ST22 is arranged between second pillar 30-2 and select gate line SGD2.

The structures of nonvolatile memory devices MC21, MC22, MC23, MC24 and select gate transistors ST21, ST22 are the same as those in the first embodiment (FIG. 3) described above and thus, the description thereof here is omitted.

In the structure as described above, for example, the first context is written into the first memory pair (nonvolatile memory devices MC11, MC21) as complementary data. Similarly, the second context is written into the second memory pair (nonvolatile memory devices MC12, MC22) as complementary data.

Thus, if a device structure according to the sixth embodiment is used, the schematic can faithfully be realized as the device structure (programmable logic switch) and thus, a contribution can be made to realization of a multi-context reconfigurable logic circuit.

Incidentally, the first and second modifications in the first embodiment can also be applied to the sixth embodiment. The above structure in the second and third embodiments regarding the connection method of first to fourth pillars 30-1 to 30-4 and gate electrodes G1, G2 of path transistors PT1, PT2 may be adopted in the sixth embodiment.

Basic Operation

The basic operation (read/write/erase) of a basic unit (programmable logic switch) according to the sixth embodiment will be described.

The description that follows is based on the equivalent circuit shown in FIG. 24.

It is assumed in the description of the basic operation that prerequisites for memory cells, select gate transistors, path transistors, write/erase states, and initial state are the same as those in the description of the basic operation in the first embodiment.

In the description of the basic operation below, the nonvolatile memory device to be read/written into/erased is called a selection cell and other nonvolatile memory devices are called non-selection cells.

(erase state→write state), common bit lines BL1/BL3 are set to write protection potential ("1" write potential) Vinhibit, for example, power supply potential (for example, +8V) Vdd and common bit lines BL2/BL4 are set to a "0" write potential, for example, earth potential Vss.

(2) Vsg (for example, +4V) is given to the select gate line SGD1 into on state, Voff (for example, 0V) is given to the SGS1, SGS2, SGD2 into off state.

Write voltage (for example, 18V) Vprg is applied to selection word line WL13 connected to selection cells MC13, MC23 inside selected cell unit CELL1. V pass (for example, +10V) is applied to non-selection word line WL11, WL12, WL14.

All word lines WL21 to WL24 inside non-selected cell unit CELL2 are set to a floating state.

TABLE 4

|  |  | Write | | Read | Erase |
|---|---|---|---|---|---|
|  |  | $MC_{j3}$→"0" $MC_{(j+1)3}$→"1" | $MC_{(j+1)3}$→"0" $MC_{j3}$→"1" | (FPGA operation) | ALL cells→"1" |
| Common data line BL1/BL3 |  | Vss | Vdd (Vinhibit) | Vss/Vbl | Vera |
| Common data line BL2/BL4 |  | Vdd (Vinhibit) | Vss | Vbl/Vss | Vera |
| Unselected block | SGD2 | Voff | Voff | Voff | Voff |
|  | WL24 | Floating | Floating | Floating | Floating |
|  | WL23 | Floating | Floating | Floating | Floating |
|  | WL22 | Floating | Floating | Floating | Floating |
|  | WL21 | Floating | Floating | Floating | Floating |
|  | SGS2 | Voff | Voff | Voff | Voff |
| Selected block | SGD1 | Vsg | Vsg | Vsg | Vsg |
|  | WL14 | Vpass | Vpass | Vpass | Vss |
|  | WL13 | Vprg | Vprg | Vread | Vss |
|  | WL12 | Vpass | Vpass | Vpass | Vss |
|  | WL11 | Vpass | Vpass | Vpass | Vss |
|  | SGS1 | Voff | Voff | Vsg | Voff |
| $CN_j$ |  | — | — | Vss/Vbl | — |

1. Write operation

A write operation in the present example can be performed in blocks.

It is assumed here that cell unit CELL1 is a selection block and cell unit CELL2 is a non-selection unit.

In the initial state (state in which no context is written) before a write operation, all nonvolatile memory devices in all cell units CELL1, CELL2, . . . are in the erase state ("1" state) of a low threshold voltage (low-Vth).

Then, for example, a write operation is performed in units of nonvolatile memory devices connected to one word line from nonvolatile memory devices on the source side (common nodes CN1, CN2 side) toward nonvolatile memory devices on the drain side (bit lines BL1 to BL4 side) inside selected cell unit CELL1.

Here, a case when a write operation into memory pair Pair1 constituted of selection cells MC13, MC23 connected to selected word line WL13 inside selected cell unit CELL1 is performed simultaneously will be described.

In this case, as shown in Table 4

(1) When data "0" is written into selection cell MC13 (erase state→write state) and data "1" is written into selection cell MC23 (write protection), common bit lines BL1/BL3 are set to a "0" write potential, for example, earth potential Vss and common bit lines BL2/BL4 are set to write protection potential ("1" write potential) Vinhibit, for example, power supply potential (for example, +8V) Vdd.

When data "1" is written into selection cell MC13 (write protection) and data "0" is written into selection cell MC23

Transfer potential Vpass and ON potential Vsg are potentials that transfer the "0" write potential and the "1" write potential to channels of selection cells MC13, MC23 in memory strings MS1 and MS2 respectively.

Therefore, when write potential Vprg is applied to selection word line WL13, selection cells to whose channels the "0" write potential is applied change from the erase state ("1" state) of low threshold voltage (low-Vth) to the write state ("0" state) of high threshold voltage (high-Vth).

In contrast, when write voltage Vprg is applied to selection word line WL13, select gate transistor ST22 in memory string MS2 is cut off so that the channel potential is boosted in selection cells to whose channels the "1" write voltage is applied.

Thus, when common bit lines BL1/BL3 are set to the "0" write potential and common bit lines BL2/BL4 are set to the "1" write potential, selection cell MC13 changes to the write state ("0" state) of high threshold voltage (high-Vth) and selection cell MC23 remains in the erase state ("1" state) of low threshold voltage (low-Vth).

When common bit lines BL1/BL3 are set to the "1" write potential and common bit lines BL2/BL4 are set to the "0" write potential, selection cell MC13 remains in the erase state ("1" state) of low threshold voltage (low-Vth) and selection cell MC23 changes to the write state ("0" state) of high threshold voltage (high-Vth).

In such a write operation, select gate transistors ST11, ST21 in selected cell unit CELL1 are in an OFF state due to Voff applied to select gate line SGS1 and thus, "1" write potential (for example, +8V) Vinhibit will not be transferred to the gate electrode of path transistor PT1.

Accordingly, path transistor PT1 can be prevented from being damaged by a high bias during write operation.

2. Erase Operation

In the present example, one block is configured cell unit CELL1 making word lines WL11 to WL14 common and similarly, one block is configured cell unit CELL2 making word lines WL21 to WL24 common.

When a configuration memory is configured by blocks, an erase operation can be performed in blocks (block erasure) or an erase operation of all blocks can be performed simultaneously (chip erasure).

A case when an erase operation of cell unit CELL1 as the selection block is performed will be described below.

(1) Word lines WL11 to WL14 inside cell unit CELL1 are set to earth potential Vss. Select gate line SGD1 is set to ON potential (for example, +4V) Vsg and select gate lines SGS1, SGS2, SGD2 are each set to OFF potential (for example, 0V) Voff.

(2) Common bit lines BL1/BL3 and common bit lines BL2/BL4 are set to erase potential (for example, +18V) Vera. Bit line BL4 is set to earth potential Vss or a floating state.

ON potential Vsg is, for example, a potential to transfer erase potential Vera to channels of all nonvolatile memory devices.

Thus, a high voltage is applied between channels (erase potential Vera) and word lines (earth potential Vss) WL11 to WL14 in all nonvolatile memory devices inside cell unit CELL1. Therefore, regardless of the threshold voltage of each nonvolatile memory device, all nonvolatile memory devices change to the erase state ("1" state) of low threshold voltage (low-Vth).

In such an erase operation, select gate transistors ST11, ST21 in cell unit CELL1 are in an OFF state due to Voff applied to select gate line SGS1.

Therefore, erase potential (for example, +18V) Vera will not be transferred to the gate electrode of path transistor PT1.

Accordingly, path transistors PT1, PT2 can be prevented from being damaged by a high bias during erase operation.

Instead of the above erase operation, for example, an erase operation can also be performed by setting word lines WL11 to WL14 in cell unit CELL1 to erase potential (for example, −18V) Vera and common bit lines BL1/BL3 and common bit lines BL2/BL4 to earth potential Vss.

3. Read Operation

A read (FPGA) operation is performed by, for example, transferring a context from memory pairs connected to one selected word line to path transistor PT1. It is assumed here that the selected word line is WL13.

It is also assumed that regarding memory pair Pair1 inside cell unit CELL1, nonvolatile memory device MC13 has the erase state ("1" state) with low threshold voltage (low-Vth) and nonvolatile memory device MC23 has the write state ("0" state) with high threshold voltage (high-Vth).

(1) Vsg (for example, +4V) is given to the select gate line SGD1, SGS1 into on state, and Voff (for example, earth potential Vss) is given to the select gate lines SGD2, SGS2 into off state. At this point, select gate transistors ST11, ST12 are turned on and select gate transistors ST21, ST22 are turned off.

(2) Non-selection word lines WL11, WL12, WL14 are set to transfer potential Vpass. Transfer potential Vpass is a potential that turns on a nonvolatile memory device regardless of the threshold voltage (low-Vth/high-Vth) of the nonvolatile memory device. Thus, all non-selection nonvolatile memory devices connected to non-selection word lines WL11, WL12, WL14 are turned on.

(3) Selected word line WL13 is set to read potential Vread. Vread has a value larger than the threshold voltage (low-Vth) of the erase state and smaller than the threshold voltage (high-Vth) of the write state. All word lines WL21 to WL24 inside non-selected cell unit CELL2 are set to a floating state.

Therefore, in cell unit CELL1, nonvolatile memory device M13 is turned on and nonvolatile memory device M23 is turned off.

(4) A first potential (for example, earth potential Vss) is applied to common bit lines BL1/BL3, that is, odd-numbered bit lines and second potential (for example, power supply potential Vdd) Vbl is applied to common bit lines BL2/BL4.

As a result, the first potential is transferred to common node CN1 connected to cell unit CELL1 from common bit lines BL1/BL3. Thus, if the first potential is earth potential Vss, common node CN1 is set to earth potential Vss and the path transistor (n-channel FET) is turned off.

Thus, input signal IN1 will not be output as output signal OUT.

Incidentally, second potential (for example, power supply potential Vdd) Vbl may be applied to common bit lines BL1/BL3, that is, odd-numbered bit lines and the first potential (for example, earth potential Vss) may be applied to common bit lines BL2/BL4.

In this case, the second potential from common bit lines BL1/BL3 is transferred to common node CN1 connected to cell unit CELL1. Thus, if the second potential is power supply potential Vdd, common node CN1 is set to power supply potential Vdd and the path transistor (n-channel FET) is turned on.

Thus, input signal IN1 will be output as output signal OUT.

Seventh Embodiment

Figure 25:
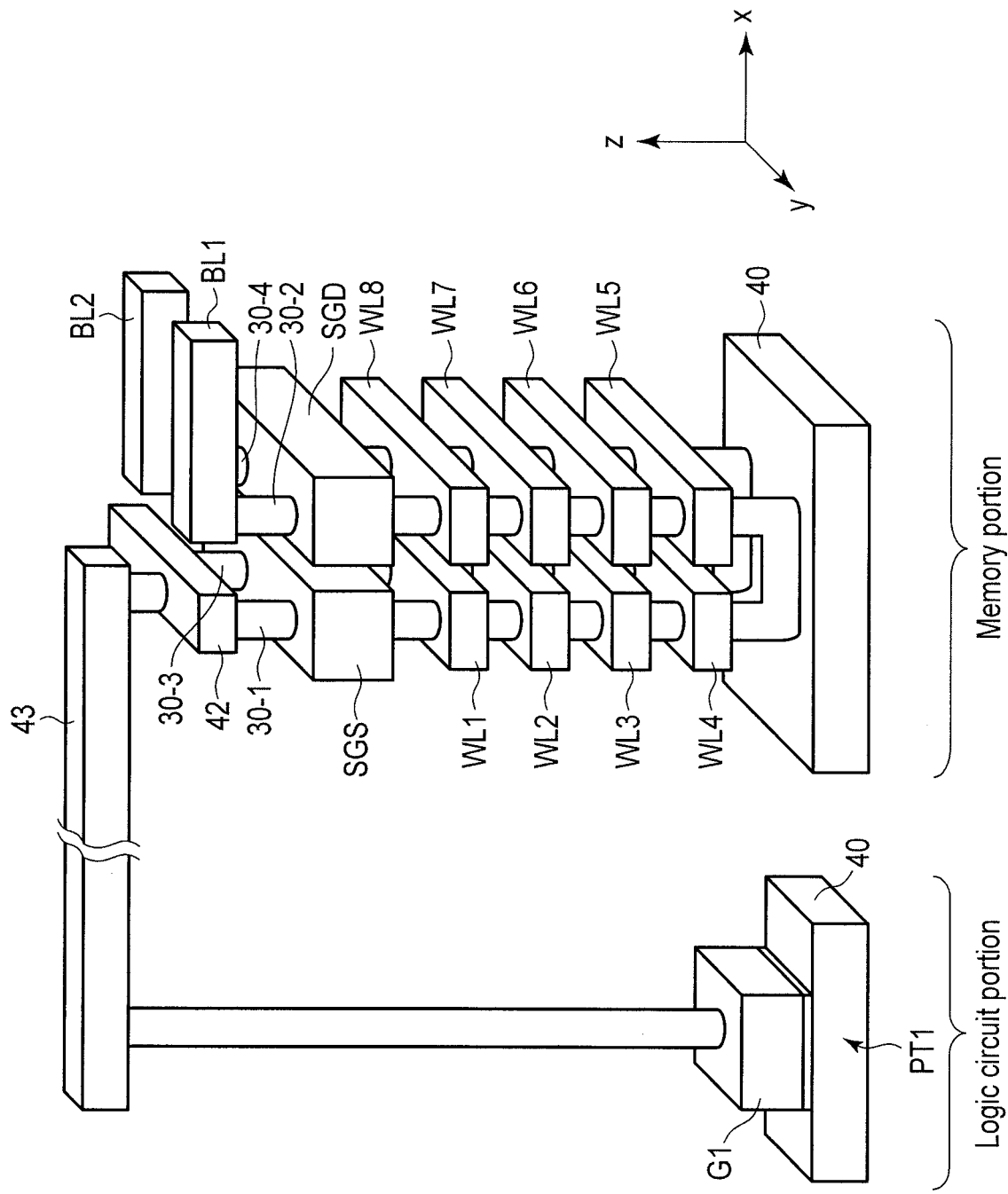
FIG. 25 is a perspective view showing a seventh embodiment of the device structure.

FIGS. 25 and 26 show the seventh embodiment of the device structure.

When compared with the first to sixth embodiments, the present embodiment is vastly different in the connection method of a path transistor and a nonvolatile memory device.

In the first to sixth embodiments described above, path transistor PT1 is arranged immediately below memory strings MS1, MS2. This structure is effective in reducing the two-dimensional layout size of a configuration memory because a logic circuit portion (logic elements) to realize predetermined logic can be arranged immediately below a memory portion (cell unit).

However, the cell unit is present immediately above path transistor PT1 and thus, the wiring method of path transistor PT1 and logic elements is constrained.

Thus, in the present embodiment, a structure is proposed in which path transistor PT1 is arranged in a region different from a region where the cell unit (memory cell array) is arranged and path transistor PT1 and nonvolatile memory devices are connected.

Path transistor PT1 is arranged in a logic circuit portion on semiconductor substrate (for example, a silicon substrate) 40 and decides a connecting relationship of logic elements to selectively realize one of multiple pieces of logic.

Path transistor PT1 is, for example, FET and has a channel to be a signal path and gate electrode G1 to control ON/OFF thereof.

For example, five conductive layers are stacked inside the memory portion on semiconductor substrate 40. These conductive layers may be, for example, a semiconductor (such as conductive polysilicon) or a metal (including alloys such as silicide).

The first (bottom) conductive layer functions as word lines WL4, WL5. Word lines WL4, WL5 are independent of each other. The second conductive layer functions as word lines WL3, WL6. Word lines WL3, WL6 are also independent of each other.

The third conductive layer functions as word lines WL2, WL7. Word lines WL2, WL7 are independent of each other. The fourth conductive layer functions as word lines WL1, WL8. Word lines WL1, WL8 are also independent of each other.

Select gate lines SGD, SGS form the top layer. Select gate lines SGD, SGS are independent of each other.

Select gate lines SGD, SGS and word lines WL1, WL2, WL3, WL4, WL5, WL6, WL7, WL8 extend, for example, in the Y direction.

First pillar (for example, a silicon pillar) 30-1 passes through word lines WL1, WL2, WL3, WL4 and select gate line SGS and the bottom end thereof reaches the surface of semiconductor substrate 40.

Second pillar (for example, a silicon pillar) 30-2 passes through word lines WL5, WL6, WL7, WL8 and select gate line SGD and the bottom end thereof reaches the surface of semiconductor substrate 40.

Bottom ends of first and second pillars 30-1, 30-2 are mutually connected by a conductive layer (for example, a conductive polysilicon layer or the like). The shape of first and second pillars 30-1, 30-2 is not specifically limited and may be, for example, a cylindrical shape. First and second pillars 30-1, 30-2 may have a structure in which an insulating pillar (for example, SiN) as a core is covered with a semiconductor layer (for example, Si) to be a channel.

Similarly, third pillar (for example, a silicon pillar) 30-3 passes through word lines WL1, WL2, WL3, WL4 and select gate line SGS and the bottom end thereof reaches the surface of semiconductor substrate 40.

Fourth pillar (for example, a silicon pillar) 30-4 passes through word lines WL5, WL6, WL7, WL8 and select gate line SGD and the bottom end thereof reaches the surface of semiconductor substrate 40.

Bottom ends of third and fourth pillars 30-3, 30-4 are mutually connected by a conductive layer (for example, a conductive polysilicon layer or the like). The shape of third and fourth pillars 30-3, 30-4 is also not specifically limited and may be, for example, a cylindrical shape. Third and fourth pillars 30-3, 30-4 may have a structure in which an insulating pillar (for example, SiN) as a core is covered with a semiconductor layer (for example, Si) to be a channel.

Common line (conductive layer) 42 is connected in common to the top ends of first and third pillars 30-1, 30-3. First bit line BL1 is connected to the top end of second pillar 30-2 and second bit line BL2 is connected to the top end of fourth pillar 30-4. Common line 42 and first and second bit lines BL1, BL2 include, for example, a metal or alloy (including silicide).

First and second bit lines BL1, BL2 extend, for example, in the X direction. Common line 42 is connected to gate electrode G1 of path transistor PT1 inside the logic circuit portion via a conductive layer (for example, a metallic layer) 43 present above the common line.

The basic unit includes first and second memory strings MS1, MS2.

First memory string MS1 includes nonvolatile memory devices MC11, MC12, MC13, MC14 and select gate transistor ST11 connected in series by first pillar 30-1 as a channel and nonvolatile memory devices MC15, MC16, MC17, MC18 and select gate transistor ST12 connected in series by second pillar 30-2 as a channel.

Second memory string MS2 includes nonvolatile memory devices MC21, MC22, MC23, MC24 and select gate transistor ST21 connected in series by third pillar 30-3 as a channel and nonvolatile memory devices MC25, MC26, MC27, MC28 and select gate transistor ST22 connected in series by fourth pillar 30-4 as a channel.

The first to sixth embodiments described above and the present embodiment (seventh embodiment) will be compared.

In the first to sixth embodiments described above, as shown in FIG. 26A, nonvolatile memory devices MC11 to MC18, MC21 to MC28 inside memory strings MS1, MS2 are stacked in series in the Z direction immediately above path transistor PT1.

The seventh embodiment has, by contrast, as shown in FIG. 26B, a structure in which cell units (memory strings MS1, MS2) in FIG. 26A are folded along line F. If such a structure is adopted, select gate transistors ST11, ST12, ST21, ST22 can be arranged on nonvolatile memory devices, which makes memory strings MS1, MS2 more symmetrical and improves features thereof.

Moreover, common line 42 and gate electrode G1 of path transistor PT1 can easily be connected, which makes the design of a configuration memory easier.

In the structure as described above, for example, the first context is written into the first memory pair (nonvolatile memory devices MC11, MC21) as complementary data. Similarly, the second context is written into the second memory pair (nonvolatile memory devices MC12, MC22) as complementary data.

Also, for example, the third context is written into the third memory pair (nonvolatile memory devices MC13, MC23) as complementary data. Similarly, the fourth context is written into the fourth memory pair (nonvolatile memory devices MC14, MC24) as complementary data.

Thus, if a device structure according to the seventh embodiment is used, the schematic can faithfully be realized as the device structure (programmable logic switch) and thus, a contribution can be made to realization of a multi-context reconfigurable logic circuit.

Basic Operation

The basic operation (read/write/erase) of a basic unit (programmable logic switch) according to the seventh embodiment can be performed by the same operation as the basic operation (see Table 1) of a basic unit according to the first embodiment described above and thus, the description thereof is omitted.

Eighth Embodiment

Figure 27:
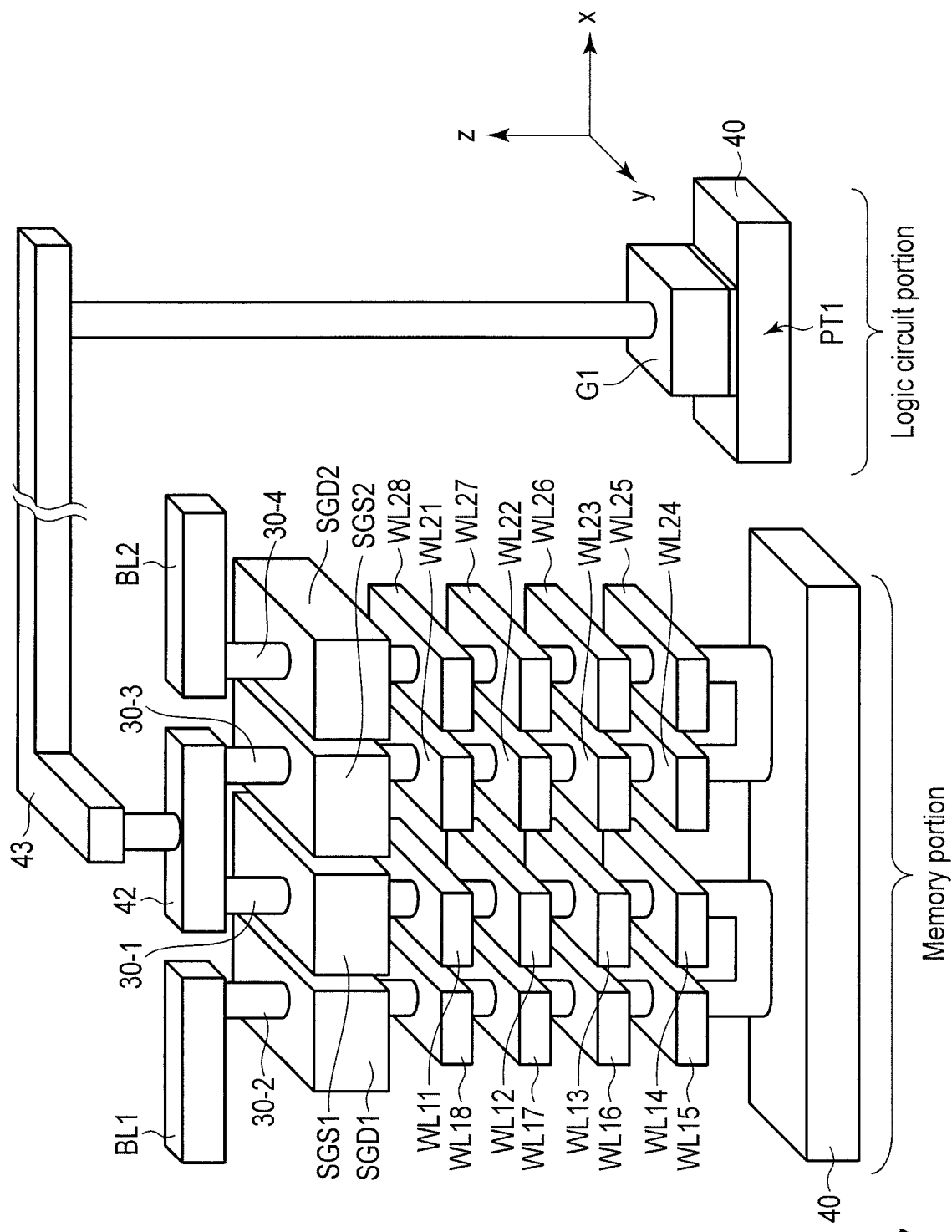
FIG. 27 is a perspective view showing an eighth embodiment of the device structure.

FIGS. 27 and 28 show the eighth embodiment of the device structure.

Like the seventh embodiment described above, the present embodiment is characterized by the connection method of a path transistor and a nonvolatile memory device.

That is, in the present embodiment, a structure is proposed in which path transistor PT1 is arranged in a region different from a region where the cell unit (memory cell array) is arranged and path transistor PT1 and nonvolatile memory devices are connected.

Path transistor PT1 is arranged in a logic circuit portion on semiconductor substrate (for example, a silicon substrate) 40 and decides a connecting relationship of logic elements to selectively realize one of multiple pieces of logic.

Path transistor PT1 is, for example, FET and has a channel to be a signal path and gate electrode G1 to control ON/OFF thereof.

For example, five conductive layers are stacked inside the memory portion on semiconductor substrate 40. These conductive layers may be, for example, a semiconductor (such as conductive polysilicon) or a metal (including alloys such as silicide).

The first (bottom) conductive layer functions as word lines WL14, WL15, WL24, WL25. Word lines WL14, WL15, WL24, WL25 are independent of one another. The second conductive layer functions as word lines WL13, WL16, WL23, WL26. Word lines WL13, WL16, WL23, WL26 are also independent of one another.

The third conductive layer functions as word lines WL12, WL17, WL22, WL27. Word lines WL12, WL17, WL22, WL27 are independent of one another. The fourth conductive layer functions as word lines WL11, WL18, WL21, WL28. Word lines WL11, WL18, WL21, WL28 are also independent of one another.

Select gate lines SGD1, SGS1, SGD2, SGS2 form the top layer. Select gate lines SGD1, SGS1, SGD2, SGS2 are independent of one another.

Select gate lines SGD1, SGS1, SGD2, SGS2 and word lines WL11 to WL18, WL21 to WL28 extend, for example, in the Y direction.

First pillar (for example, a silicon pillar) 30-1 passes through word lines WL11, WL12, WL13, WL14 and select gate line SGS1 and the bottom end thereof reaches the surface of semiconductor substrate 40.

Second pillar (for example, a silicon pillar) 30-2 passes through word lines WL15, WL16, WL17, WL18 and select gate line SGD1 and the bottom end thereof reaches the surface of semiconductor substrate 40.

Bottom ends of first and second pillars 30-1, 30-2 are mutually connected by a conductive layer (for example, a conductive polysilicon layer or the like). The shape of first and second pillars 30-1, 30-2 is not specifically limited and may be, for example, a cylindrical shape. First and second pillars 30-1, 30-2 may have a structure in which an insulating pillar (for example, SiN) as a core is covered with a semiconductor layer (for example, Si) to be a channel.

Similarly, third pillar (for example, a silicon pillar) 30-3 passes through word lines WL21, WL22, WL23, WL24 and select gate line SGS2 and the bottom end thereof reaches the surface of semiconductor substrate 40.

Fourth pillar (for example, a silicon pillar) 30-4 passes through word lines WL25, WL26, WL27, WL28 and select gate line SGD2 and the bottom end thereof reaches the surface of semiconductor substrate 40.

Bottom ends of third and fourth pillars 30-3, 30-4 are mutually connected by a conductive layer (for example, a conductive polysilicon layer or the like). The shape of third and fourth pillars 30-3, 30-4 is also not specifically limited and may be, for example, a cylindrical shape. Third and fourth pillars 30-3, 30-4 may have a structure in which an insulating pillar (for example, SiN) as a core is covered with a semiconductor layer (for example, Si) to be a channel.

Common line (conductive layer) 42 is connected in common to the top ends of first and third pillars 30-1, 30-3. First bit line BL1 is connected to the top end of second pillar 30-2 and second bit line BL2 is connected to the top end of fourth pillar 30-4. Common line 42 and first and second bit lines BL1, BL2 include, for example, a metal or alloy (including silicide).

First and second bit lines BL1, BL2 extend, for example, in the X direction. Common line 42 is connected to gate electrode G1 of path transistor PT1 inside the logic circuit portion via a conductive layer (for example, a metallic layer) 43 present above the common line.

The basic unit includes first and second memory strings MS1, MS2.

First memory string MS1 includes nonvolatile memory devices MC11, MC12, MC13, MC14 and select gate transistor ST11 connected in series by first pillar 30-1 as a channel and nonvolatile memory devices MC15, MC16, MC17, MC18 and select gate transistor ST12 connected in series by second pillar 30-2 as a channel.

Second memory string MS2 includes nonvolatile memory devices MC21, MC22, MC23, MC24 and select gate transistor ST21 connected in series by third pillar 30-3 as a channel and nonvolatile memory devices MC25, MC26, MC27, MC28 and select gate transistor ST22 connected in series by fourth pillar 30-4 as a channel.

The first to sixth embodiments described above and the present embodiment (eighth embodiment) will be compared.

In the first to sixth embodiments described above, as shown in FIG. 28A, nonvolatile memory devices MC11 to MC18, MC21 to MC28 inside memory strings MS1, MS2 are stacked in series in the Z direction immediately above path transistor PT1.

The eighth embodiment has, by contrast, as shown in FIG. 28B, a structure in which cell units (memory strings MS1, MS2) in FIG. 28A are folded along line F. If such a structure is adopted, select gate transistors ST11, ST12, ST21, ST22 can be arranged on nonvolatile memory devices, which makes memory strings MS1, MS2 more symmetrical and improves features thereof.

Moreover, common line 42 and gate electrode G1 of path transistor PT1 can easily be connected, which makes the design of a configuration memory easier.

In the structure as described above, for example, the first context is written into the first memory pair (nonvolatile memory devices MC11, MC21) as complementary data. Similarly, the second context is written into the second memory pair (nonvolatile memory devices MC12, MC22) as complementary data.

Also, for example, the third context is written into the third memory pair (nonvolatile memory devices MC13, MC23) as complementary data. Similarly, the fourth context is written into the fourth memory pair (nonvolatile memory devices MC14, MC24) as complementary data.

Thus, if a device structure according to the eighth embodiment is used, the schematic can faithfully be realized as the device structure (programmable logic switch) and thus, a contribution can be made to realization of a multi-context reconfigurable logic circuit.

Basic Operation

The basic operation (read/write/erase) of a basic unit (programmable logic switch) according to the eighth embodiment can be performed by the same operation as the basic operation (see Table 2) of a basic unit according to the fourth embodiment described above and thus, the description thereof is omitted.

(Others)

In the first to eighth embodiments described above, nonvolatile memory devices formed on the side face of first to fourth pillars are assumed to be flash memories, but are not limited to such an example. For example, the nonvolatile memory device may be a resistance change element such as a Re (resistive) RAM and M (magnetic) RAM.

APPLICATION EXAMPLE

A case when a programmable logic switch according to any of the above embodiments is applied to an FPGA will be described.

While the FPGA is embedded in various devices and the purpose of using the FPGA is varied, the area thereof is increased by various kinds of content being mounted thereon. Normally, all circuits mounted on the FPGA rarely operate simultaneously, but it is necessary to implement all circuits to realize all content, causing waste of areas and power consumption.

Thus, if a programmable logic switch according to any of the above embodiments is applied to an FPGA, a non-active region of the FPGA can be minimized and contexts can be switched at high speed while using less power in a smaller area size by providing memory pairs (one memory pair corresponds to one context) and selectively switching one of word lines (memory pairs).

Figure 30:
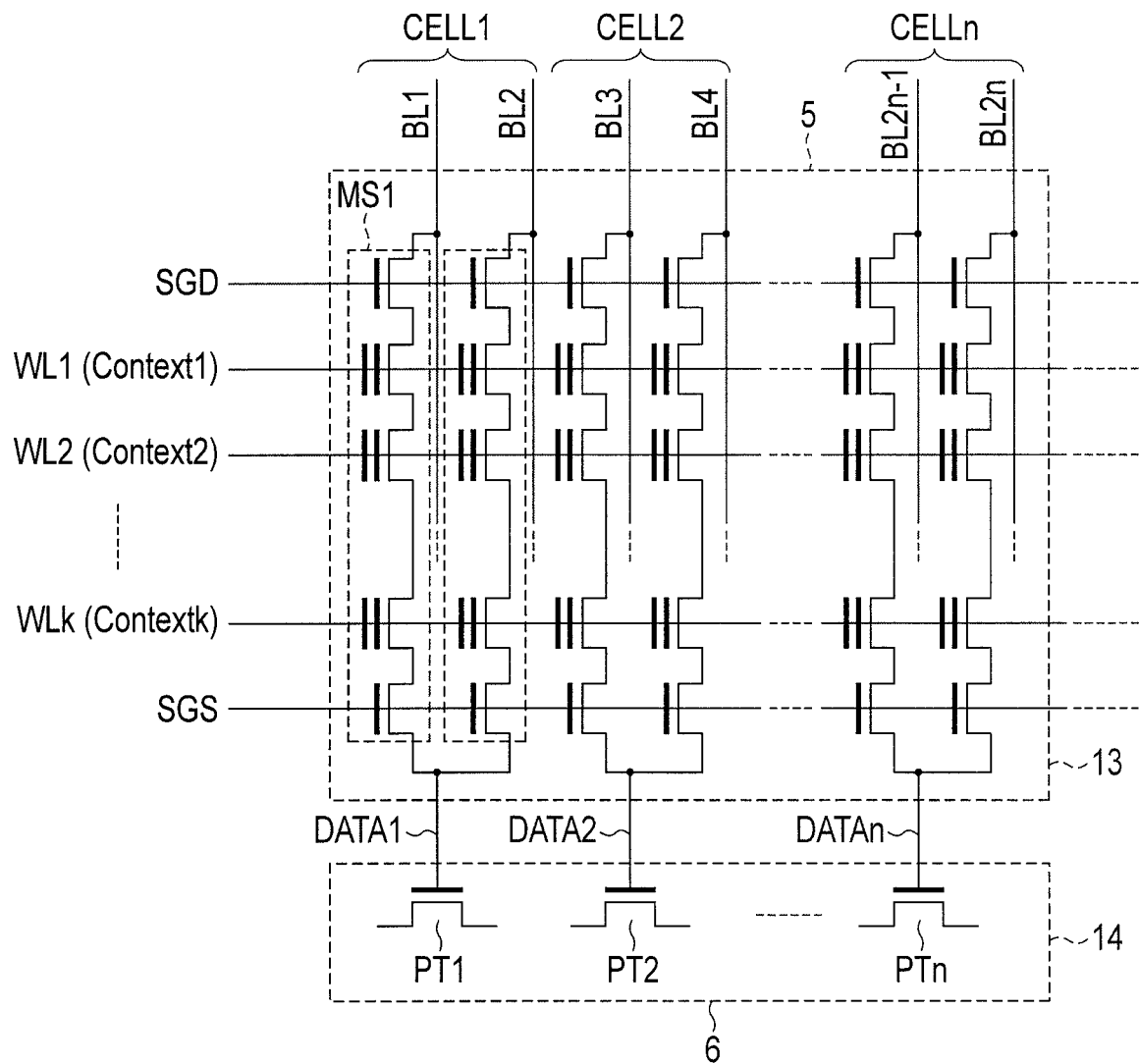
FIG. 30 is a circuit diagram showing a memory portion and a logic circuit portion in FIG. 29.

FIGS. 29 and 30 show the FPGA as an application example.

In the FPGA in the present example, the same reference numerals are attached to the same elements in a basic unit of each of the above embodiments to clarify correspondences between the present example and each of the above embodiments.

An FPGA 20 in the present example includes blocks BLK11, ..., BLKij (i and j are each natural numbers equal to 2 or greater) arranged in an array shape and drivers 11, 12 to drive blocks BLK11, ..., BLKij.

Driver 11, for example, selects one of word lines WL1, ..., WLk (k is a natural number equal to 2 or greater) inside blocks BLK11, BLK12, BLK1j aligned in a row direction based on a context ID and context is written into or read from the memory pair connected to the selected word line.

Driver 12, for example, decides potentials of bit lines BL1, ..., BL2n when writing/reading/erasing based on operation/context information.

Each of blocks BLK11, ..., BLKij includes memory portion 13 and logic circuit portion 14.

Memory portion 13 includes memory strings (memory pairs) according to each of the above embodiments. Logic circuit portion 14 includes, for example, a lookup table, path transistors and so on and realizes predetermined logic (circuit configuration) based on output data DATA1, ..., DATAn output from memory portion 13.

If, for example, word line WL1 is selected during reading (during FPGA operation), context (Context1) is read from memory portion 13 as output data DATA1, ..., DATAn. Logic circuit portion 14 performs processing to convert input data Din0, Din1, Din2, ... into output data Dout by predetermined logic based on context (Context1) from memory portion 13.

In the example of FIG. 30, output data DATA1, ..., DATAn is connected to control terminals of path transistors PT1, PT2, ..., PTn (for example, gate terminals of FETs). Path transistors PT1, PT2, ..., PTn have a role to selectively interconnecting logic elements to realize predetermined logic (circuit configuration).

Incidentally, output data DATA1, ..., DATAn may be input into an input node of an inverter or an input terminal of a switch transistor (for example, a source/drain of FET).

CONCLUSION

According to an embodiment, the device structure when nonvolatile memory devices are used as a configuration memory can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A programmable logic switch comprising:
a first path transistor having a first gate electrode;
first and second word lines stacked immediately above the first path transistor;
a first pillar passing through the first and second word lines and having a bottom end connected to the first gate electrode;
a second pillar passing through the first and second word lines and having a bottom end connected to the first gate electrode;
a first bit line connected to a top end of the first pillar;
a second bit line connected to a top end of the second pillar;
a first nonvolatile memory device between the first pillar and the first word line;
a second nonvolatile memory device between the first pillar and the second word line;
a third nonvolatile memory device between the second pillar and the first word line; and
a fourth nonvolatile memory device between the second pillar and the second word line,
wherein a first context is stored in the first and third nonvolatile memory devices and a second context is stored in the second and fourth nonvolatile memory devices.

2. The switch of claim 1, further comprising:
a first semiconductor layer between the first gate electrode and the bottom ends of the first and second pillars,
wherein the first and second pillars are connected to the first gate electrode via the first semiconductor layer.

3. The switch of claim 2, further comprising:
a first select gate transistor between the first nonvolatile memory device and the first gate electrode; and
a second select gate transistor between the third nonvolatile memory device and the first gate electrode,
wherein the first semiconductor layer has a first end in a portion adjacent to the first pillar and a second end in a portion adjacent to the second pillar,
the first select gate transistor uses the first end of the first semiconductor layer as a channel, and
the second select gate transistor uses the second end of the first semiconductor layer as a channel.

4. The switch of claim 2, further comprising:
a first select gate transistor between the first nonvolatile memory device and the first gate electrode; and
a second select gate transistor between the third nonvolatile memory device and the first gate electrode,
wherein the first select gate transistor uses the first pillar as the channel and
the second select gate transistor uses the second pillar as the channel.

5. The switch of claim 1, further comprising:
a first select gate transistor between the first nonvolatile memory device and the first gate electrode; and
a second select gate transistor between the third nonvolatile memory device and the first gate electrode,
wherein the first select gate transistor uses the first pillar as the channel,
the second select gate transistor uses the second pillar as the channel, and
the first and second pillars are directly connected to the first gate electrode.

6. The switch of claim 1,
wherein the first path transistor includes an impurity region as a source/drain region in a semiconductor substrate, and
the impurity region is connected to logic elements to realize predetermined logic via a conductive layer above the first gate electrode.

7. The switch of claim 1,
wherein one of first and second potentials is transferred to the first gate electrode of the path transistors as the first context by setting the first bit line to the first potential, setting the second bit line to the second potential, and setting the first word line to a read potential between a threshold voltage of the first nonvolatile memory device and a threshold voltage of the third nonvolatile memory device.

8. The switch of claim 1, further comprising:
a second path transistor having a second gate electrode;
third and fourth word lines stacked immediately above the second path transistor;
a third pillar passing through the third and fourth word lines and having a bottom end connected to the second gate electrode;
a fourth pillar passing through the third and fourth word lines and having a bottom end connected to the second gate electrode;
a third bit line connected to a top end of the fourth pillar;
a fifth nonvolatile memory device between the third pillar and the first word line;
a sixth nonvolatile memory device between the third pillar and the second word line;
a seventh nonvolatile memory device between the fourth pillar and the third word line; and
an eighth nonvolatile memory device between the fourth pillar and the fourth word line,
wherein the first bit line is connected also to a top end of the third pillar,
a third context is stored in the fifth and seventh nonvolatile memory devices, and
a fourth context is stored in the sixth and eighth nonvolatile memory devices.

9. A programmable logic switch comprising:
a first path transistor having a first gate electrode;
first and second word lines stacked immediately above the first path transistor;
third and fourth word lines stacked immediately above the first path transistor and aligned with the first and second word lines;
a first pillar passing through the first and second word lines and having a bottom end connected to the first gate electrode;
a second pillar passing through the third and fourth word lines and having a bottom end connected to the first gate electrode;
a first bit line connected to a top end of the first pillar;
a second bit line connected to a top end of the second pillar;
a first nonvolatile memory device between the first pillar and the first word line;
a second nonvolatile memory device between the first pillar and the second word line;
a third nonvolatile memory device between the second pillar and the first word line; and
a fourth nonvolatile memory device between the second pillar and the second word line,
wherein a first context is stored in the first and third nonvolatile memory devices and
a second context is stored in the second and fourth nonvolatile memory devices.

10. The switch of claim 9, further comprising:
a first semiconductor between the first gate electrode and the bottom ends of the first and second pillars,
wherein the first and second pillars are connected to the first gate electrode via the first semiconductor layer.

11. The switch of claim 10, further comprising:
a first select gate transistor between the first nonvolatile memory device and the first gate electrode; and
a second select gate transistor between the third nonvolatile memory device and the first gate electrode,
wherein the first semiconductor layer has a first end in a portion adjacent to the first pillar and a second end in a portion adjacent to the second pillar,
the first select gate transistor uses the first end of the first semiconductor layer as a channel, and
the second select gate transistor uses the second end of the first semiconductor layer as a channel.

12. The switch of claim 10, further comprising:
a first select gate transistor between the first nonvolatile memory device and the first gate electrode; and
a second select gate transistor between the third nonvolatile memory device and the first gate electrode,
wherein the first select gate transistor uses the first pillar as the channel and
the second select gate transistor uses the second pillar as the channel.

13. The switch of claim 9, further comprising:
a first select gate transistor between the first nonvolatile memory device and the first gate electrode; and
a second select gate transistor between the third nonvolatile memory device and the first gate electrode,
wherein the first select gate transistor uses the first pillar as the channel,
the second select gate transistor uses the second pillar as the channel, and
the first and second pillars are directly connected to the first gate electrode.

14. The switch of claim 9,
wherein the first path transistor includes an impurity region as a source/drain region in a semiconductor substrate, and
the impurity region is connected to logic elements to realize predetermined logic via a conductive layer above the first gate electrode.

15. The switch of claim 9,
wherein one of first and second potentials is transferred to the first gate electrode of the path transistors as the first context by setting the first bit line to the first potential, setting the second bit line to the second potential, and setting the first and third word lines to a read potential between a threshold voltage of the first nonvolatile memory device and a threshold voltage of the third nonvolatile memory device.

16. The switch of claim 9, further comprising:
a second path transistor having a second gate electrode;
a third pillar passing through the first and second word lines and having a bottom end connected to the second gate electrode;
a fourth pillar passing through the third and fourth word lines and having a bottom end connected to the second gate electrode;
a third bit line connected to a top end of the fourth pillar;
a fifth nonvolatile memory device between the third pillar and the first word line;

a sixth nonvolatile memory device between the third pillar and the second word line;
a seventh nonvolatile memory device between the fourth pillar and the third word line; and
an eighth nonvolatile memory device between the fourth pillar and the fourth word line,
wherein the first bit line is connected also to a top end of the third pillar,
a third context is stored in the fifth and seventh nonvolatile memory devices, and
a fourth context is stored in the sixth and eighth nonvolatile memory devices.

* * * * *